(12) United States Patent
Nakamura et al.

(10) Patent No.: US 12,200,998 B2
(45) Date of Patent: Jan. 14, 2025

(54) DISPLAY PANEL, DISPLAY DEVICE, DISPLAY MODULE, AND ELECTRONIC DEVICE

(71) Applicant: Semiconductor Energy Laboratory Co., Ltd., Kanagawa-ken (JP)

(72) Inventors: Daiki Nakamura, Kanagawa (JP); Shingo Eguchi, Kanagawa (JP); Tomoya Aoyama, Kanagawa (JP); Nozomu Sugisawa, Kanagawa (JP); Junya Maruyama, Kanagawa (JP); Kazuhiko Fujita, Kanagawa (JP); Masataka Sato, Tochigi (JP); Susumu Kawashima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 18/139,004

(22) Filed: Apr. 25, 2023

(65) Prior Publication Data

US 2023/0269987 A1    Aug. 24, 2023

Related U.S. Application Data

(63) Continuation of application No. 16/766,886, filed as application No. PCT/IB2018/059087 on Nov. 19, 2018, now Pat. No. 11,672,152.

(30) Foreign Application Priority Data

Nov. 30, 2017  (JP) .................................. 2017-230849
May 18, 2018  (JP) .................................. 2018-095869

(51) Int. Cl.
*H10K 59/35* (2023.01)
*G06F 1/16* (2006.01)
(Continued)

(52) U.S. Cl.
CPC ......... *H10K 59/353* (2023.02); *G06F 1/1624* (2013.01); *G06F 1/1652* (2013.01);
(Continued)

(58) Field of Classification Search
CPC ........ H10K 50/14; H10K 50/15; H10K 50/16; H10K 50/17; H10K 50/171; H10K 50/18;
(Continued)

(56) References Cited

U.S. PATENT DOCUMENTS 6,946,791 B2   9/2005  Choi et al.
7,221,095 B2   5/2007  Yamazaki et al.
(Continued)

FOREIGN PATENT DOCUMENTS

CN   107111997 A   8/2017
EP   2 219 174 A1   8/2010
(Continued)

OTHER PUBLICATIONS

International Search Report (Application No. PCT/IB2018/059087) Dated Feb. 26, 2019.
(Continued)

*Primary Examiner* — Ida M Soward
(74) *Attorney, Agent, or Firm* — Husch Blackwell LLP

(57) ABSTRACT

Display unevenness in a display panel is suppressed. A display panel with a high aperture ratio of a pixel is provided. The display panel includes a first pixel electrode, a second pixel electrode, a third pixel electrode, a first light-emitting layer, a second light-emitting layer, a third light-emitting layer, a first common layer, a second common layer, a common electrode, and an auxiliary wiring. The first common layer is positioned over the first pixel electrode and the second pixel electrode. The first common layer has a portion overlapping with the first light-emitting layer and a portion overlapping with the second light-emitting layer.

(Continued)

The second common layer is positioned over the third pixel electrode. The second common layer has a portion overlapping with the third light-emitting layer. The common electrode has a portion overlapping with the first pixel electrode with the first common layer and the first light-emitting layer provided therebetween, a portion overlapping with the second pixel electrode with the first common layer and the second light-emitting layer provided therebetween, a portion overlapping with the third pixel electrode with the second common layer and the third light-emitting layer provided therebetween, and a portion in contact with a top surface of the auxiliary wiring.

10 Claims, 37 Drawing Sheets

(51) Int. Cl.
*H10K 59/131* (2023.01)
*H10K 77/10* (2023.01)
*H10K 50/14* (2023.01)
*H10K 50/15* (2023.01)
*H10K 50/16* (2023.01)
*H10K 50/17* (2023.01)
*H10K 50/18* (2023.01)
*H10K 50/814* (2023.01)
*H10K 50/818* (2023.01)
*H10K 50/844* (2023.01)
*H10K 50/856* (2023.01)

(52) U.S. Cl.
CPC ......... *G06F 1/1681* (2013.01); *H10K 59/131* (2023.02); *H10K 59/352* (2023.02); *H10K 77/111* (2023.02); *H10K 50/14* (2023.02); *H10K 50/15* (2023.02); *H10K 50/16* (2023.02); *H10K 50/17* (2023.02); *H10K 50/171* (2023.02); *H10K 50/18* (2023.02); *H10K 50/814* (2023.02); *H10K 50/818* (2023.02); *H10K 50/844* (2023.02); *H10K 50/856* (2023.02)

(58) Field of Classification Search
CPC .. H10K 50/814; H10K 50/818; H10K 50/844; H10K 50/856; H10K 59/353; H10K 59/131; H10K 59/352; H10K 59/1315; H10K 59/18; H10K 59/35; H10K 59/351; H10K 77/111; G06F 1/1624; G06F 1/1652; G06F 1/1681; G06F 1/1643; G09F 9/30; H05B 33/26; H05B 33/28
See application file for complete search history.

(56) References Cited

U.S. PATENT DOCUMENTS

| | | | |
|---|---|---|---|
| 7,642,109 B2 * | 1/2010 | Winters | H10K 50/824 |
| | | | 438/795 |
| 7,710,019 B2 | 5/2010 | Jung et al. | |
| 8,379,004 B2 | 2/2013 | Han et al. | |
| 9,041,026 B2 | 5/2015 | Yamazaki | |
| 9,111,892 B2 * | 8/2015 | Nendai | H10K 71/00 |
| 9,209,355 B2 | 12/2015 | Senda et al. | |
| 9,478,770 B2 * | 10/2016 | Kim | H10K 50/822 |
| 9,559,327 B2 * | 1/2017 | Yoneda | H10K 50/16 |
| 9,614,022 B2 | 4/2017 | Miyake et al. | |
| 9,754,540 B2 | 9/2017 | Takesue et al. | |
| 9,768,201 B2 | 9/2017 | Nakamura et al. | |
| 9,854,629 B2 | 12/2017 | Ikeda et al. | |
| 9,858,028 B2 | 1/2018 | Ikeda et al. | |
| 9,859,520 B2 | 1/2018 | Kim | |
| 9,940,086 B2 | 4/2018 | Yoshizumi et al. | |
| 10,027,896 B2 | 7/2018 | Ikeda | |
| 10,359,810 B2 | 7/2019 | Miyake et al. | |
| 10,388,905 B2 | 8/2019 | Choi et al. | |
| 10,642,314 B2 | 5/2020 | Miyake et al. | |
| 11,069,747 B2 | 7/2021 | Miyake et al. | |
| 11,647,663 B2 | 5/2023 | Miyake et al. | |
| 2003/0183830 A1 | 10/2003 | Yamazaki et al. | |
| 2004/0135496 A1 | 7/2004 | Park et al. | |
| 2004/0160170 A1 * | 8/2004 | Sato | H10K 50/828 |
| | | | 313/504 |
| 2005/0001546 A1 | 1/2005 | Yamaguchi | |
| 2005/0073247 A1 | 4/2005 | Yamazaki et al. | |
| 2005/0280039 A1 | 12/2005 | Choi et al. | |
| 2006/0082284 A1 | 4/2006 | Shibusawa | |
| 2007/0102737 A1 | 5/2007 | Kashiwabara et al. | |
| 2007/0108899 A1 | 5/2007 | Jung et al. | |
| 2008/0030833 A1 * | 2/2008 | Park | G02F 1/133514 |
| | | | 438/30 |
| 2009/0322215 A1 | 12/2009 | Sung et al. | |
| 2011/0037071 A1 | 2/2011 | Ozawa | |
| 2012/0176025 A1 | 7/2012 | Lee et al. | |
| 2013/0207084 A1 | 8/2013 | Im et al. | |
| 2013/0207085 A1 | 8/2013 | Im et al. | |
| 2014/0022622 A1 | 1/2014 | Park et al. | |
| 2014/0061595 A1 | 3/2014 | Kim et al. | |
| 2014/0070185 A1 * | 3/2014 | Im | H10K 59/35 |
| | | | 438/46 |
| 2014/0346484 A1 | 11/2014 | Nendai et al. | |
| 2015/0023031 A1 | 1/2015 | Endo | |
| 2015/0228704 A1 | 8/2015 | Miyake et al. | |
| 2015/0243713 A1 * | 8/2015 | Fujimura | H10K 59/131 |
| | | | 257/40 |
| 2016/0037608 A1 | 2/2016 | Ikeda et al. | |
| 2016/0103649 A1 | 4/2016 | Yoshitani et al. | |
| 2016/0132281 A1 | 5/2016 | Yamazaki et al. | |
| 2017/0092230 A1 | 3/2017 | Kuwabara | |
| 2017/0154947 A1 | 6/2017 | Nakamura | |
| 2017/0186365 A1 | 6/2017 | Yoneda | |
| 2018/0039471 A1 | 2/2018 | Yanagisawa et al. | |
| 2018/0151539 A1 | 5/2018 | Nakamura et al. | |
| 2020/0043997 A1 | 2/2020 | Sonoda et al. | |
| 2023/0255089 A1 | 8/2023 | Miyake et al. | |

FOREIGN PATENT DOCUMENTS

| | | |
|---|---|---|
| EP | 3 026 724 A1 | 6/2016 |
| EP | 3343663 A | 7/2018 |
| JP | 2003-288983 A | 10/2003 |
| JP | 2010-044916 A | 2/2010 |
| JP | 2011-040277 A | 2/2011 |
| JP | 2012-178336 A | 9/2012 |
| JP | 2014-197522 A | 10/2014 |
| JP | 2015-038609 A | 2/2015 |
| JP | 2016-095502 A | 5/2016 |
| JP | 2018-109758 A | 7/2018 |
| JP | 2019-207410 A | 12/2019 |
| KR | 2006-0053228 A | 5/2006 |
| KR | 2012-0080856 A | 7/2012 |
| KR | 2015-0010640 A | 1/2015 |
| KR | 2016-0062646 A | 6/2016 |
| KR | 2017-0082548 A | 7/2017 |
| TW | 200421906 | 10/2004 |
| TW | 201629926 | 8/2016 |
| WO | WO-2012/090798 | 7/2012 |
| WO | WO-2015/121770 | 8/2015 |
| WO | WO 2015/121770 A1 | 8/2015 |
| WO | WO 2016/075589 A1 | 5/2016 |

OTHER PUBLICATIONS

Written Opinion (Application No. PCT/IB2018/059087) Dated Feb. 26, 2019.
Taiwanese Office Action (Application No. 107140705) Dated Jan. 4, 2023.

(56) References Cited

OTHER PUBLICATIONS

Taiwanese Office Action (Application No. 113112298) Dated Nov. 4, 2024.

* cited by examiner

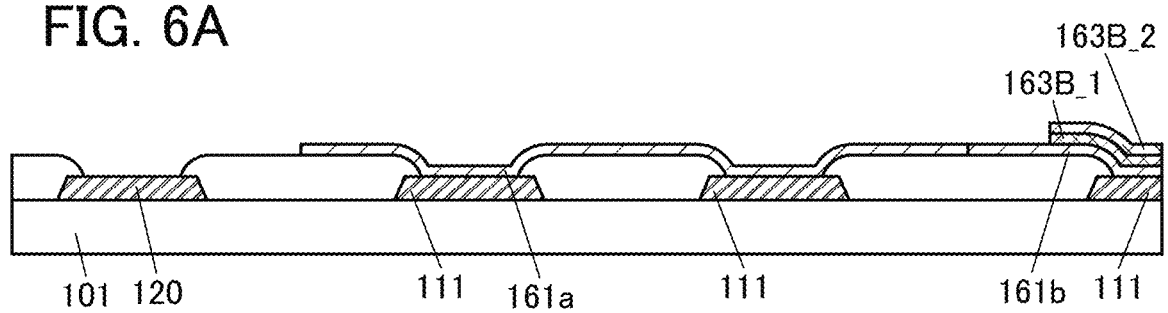
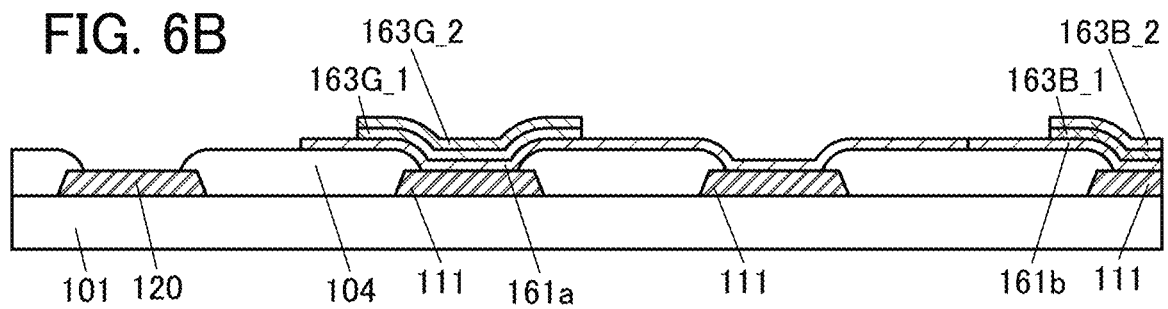
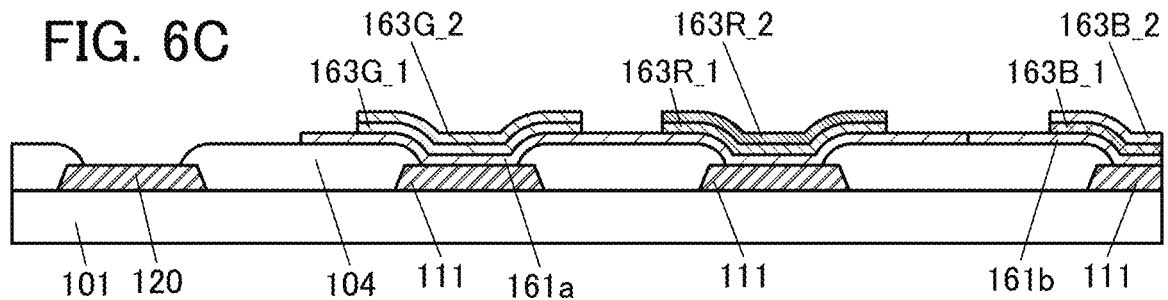

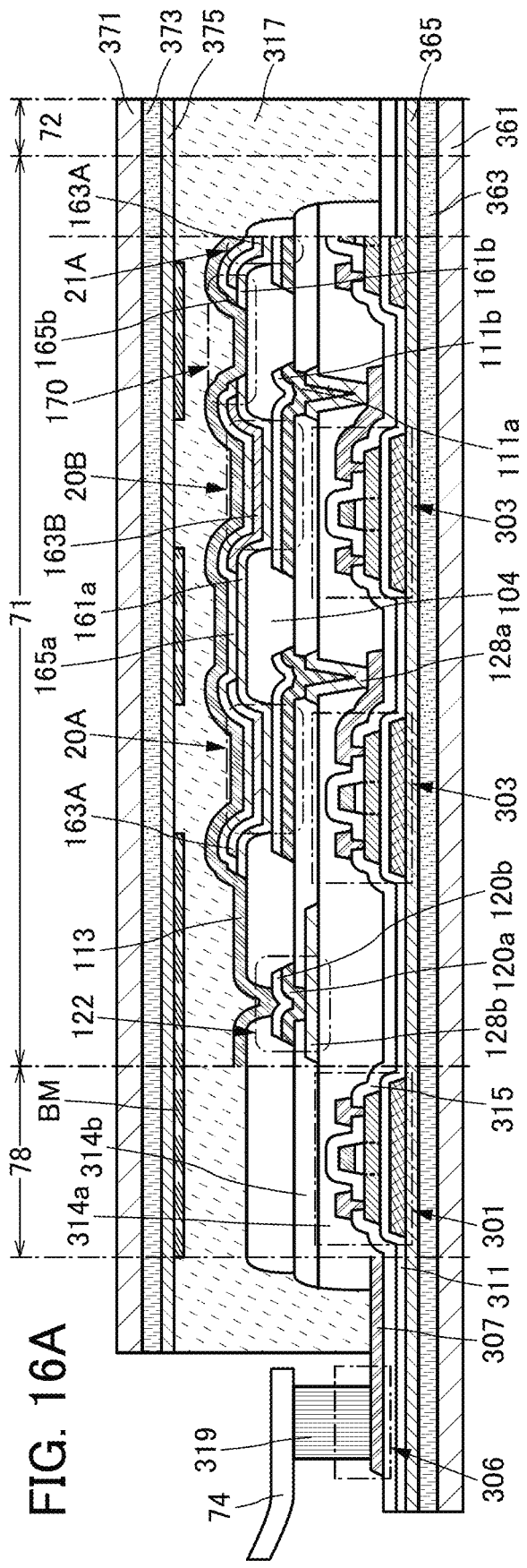
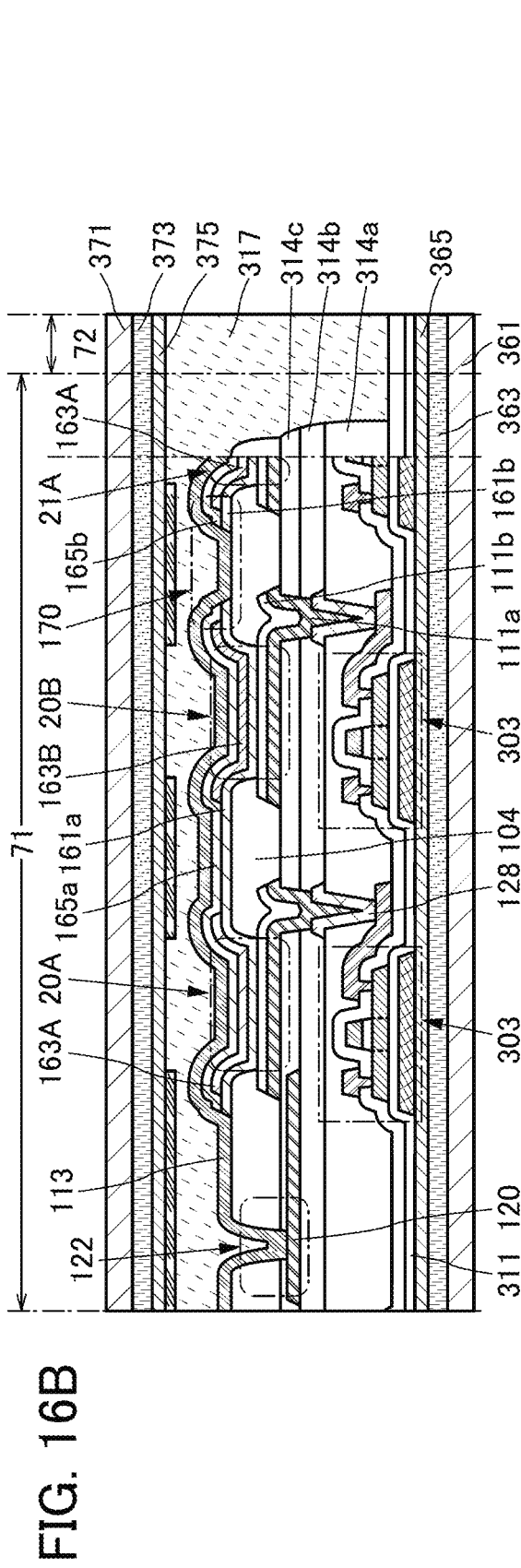
FIG. 16A
FIG. 16B

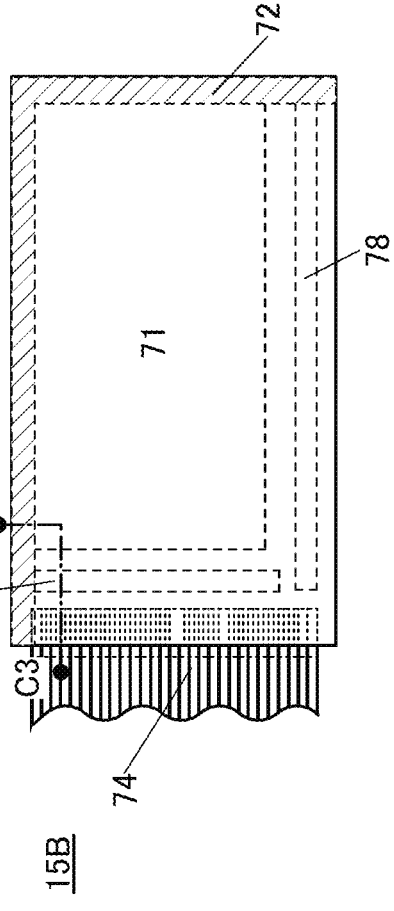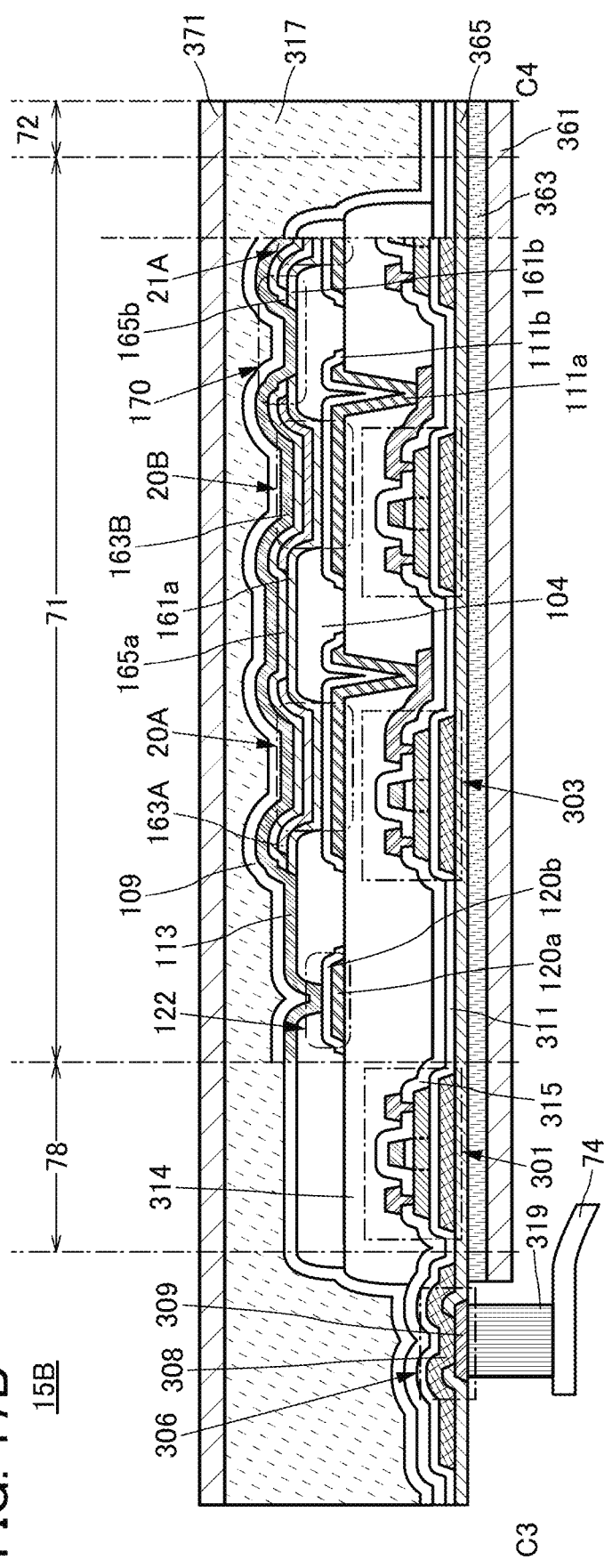

FIG. 18A
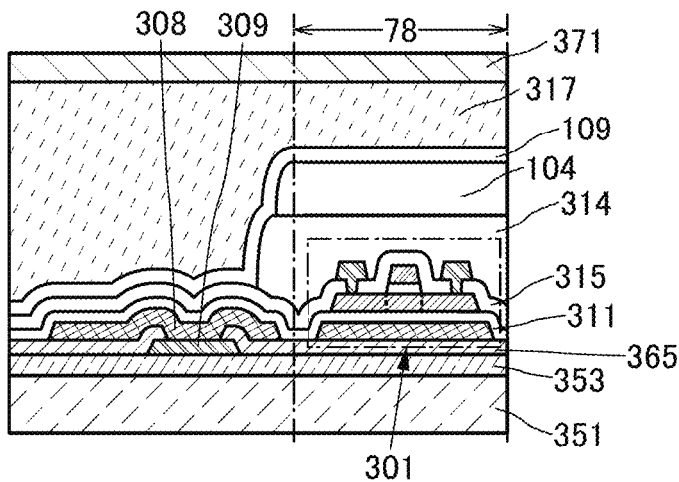
FIG. 18B1
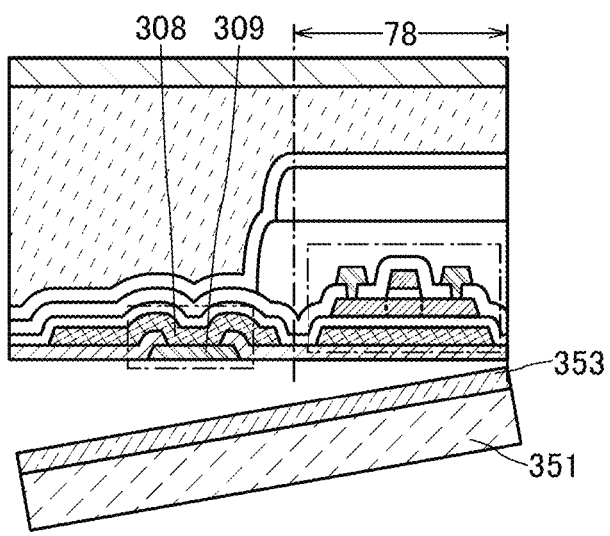
FIG. 18B2
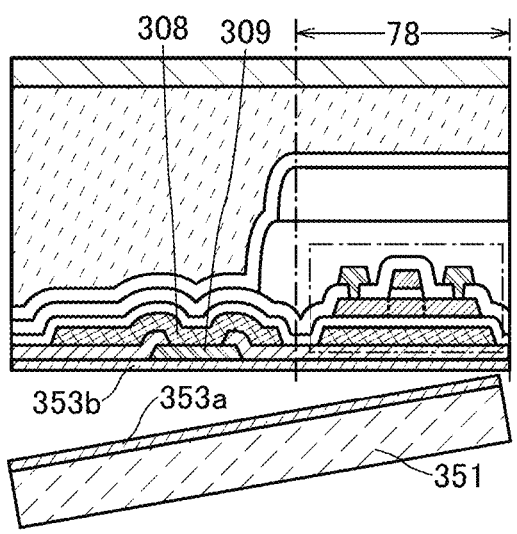
FIG. 18C1
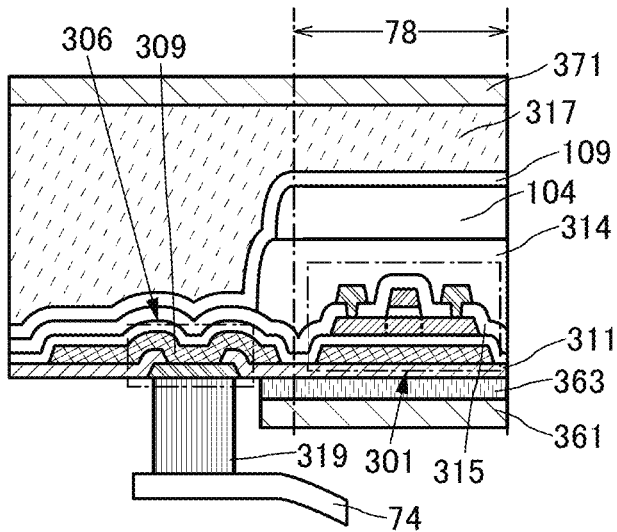
FIG. 18C2
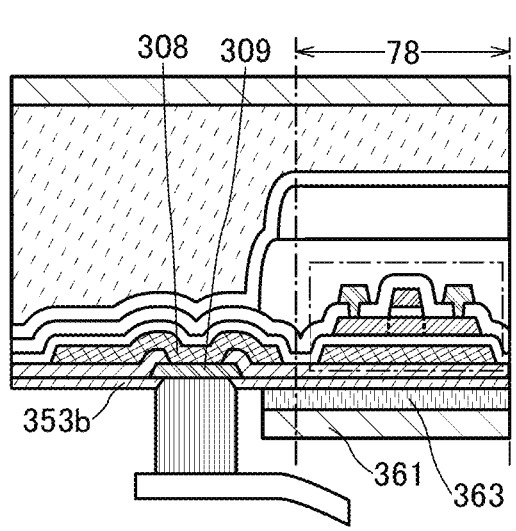

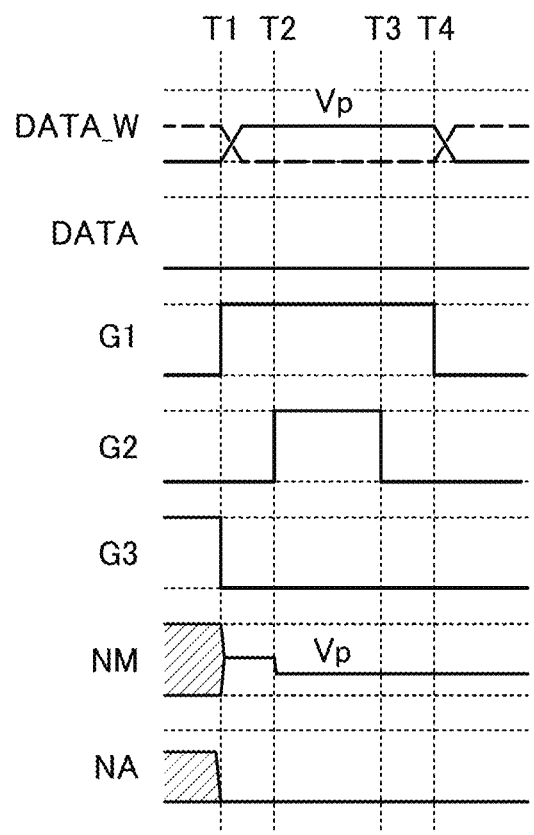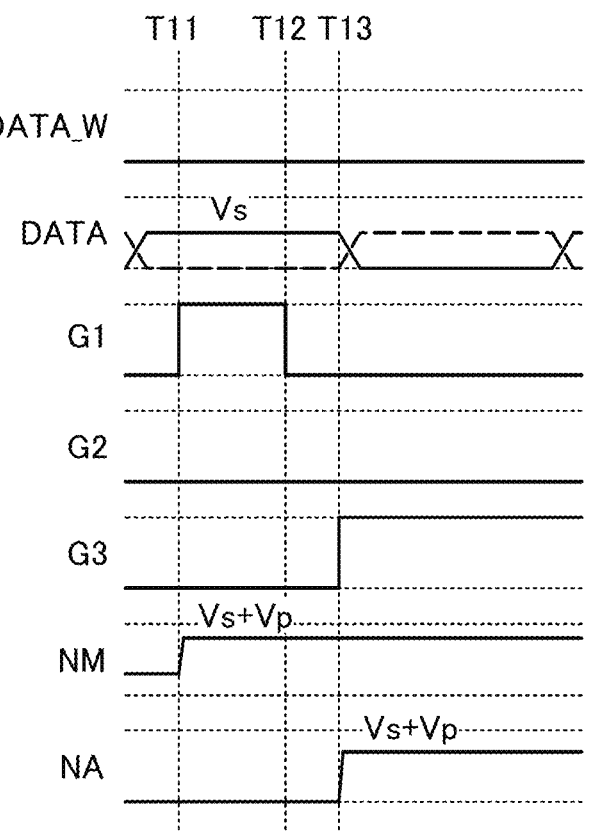

Ref

Sample

Ref (before the test)

Sample (before the test)

Ref (after the test)

Sample (after the test)

FIG. 29A
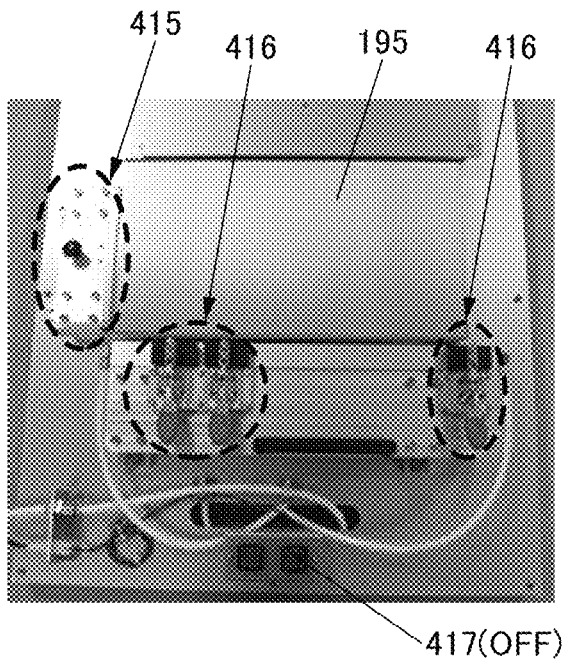
FIG. 29B
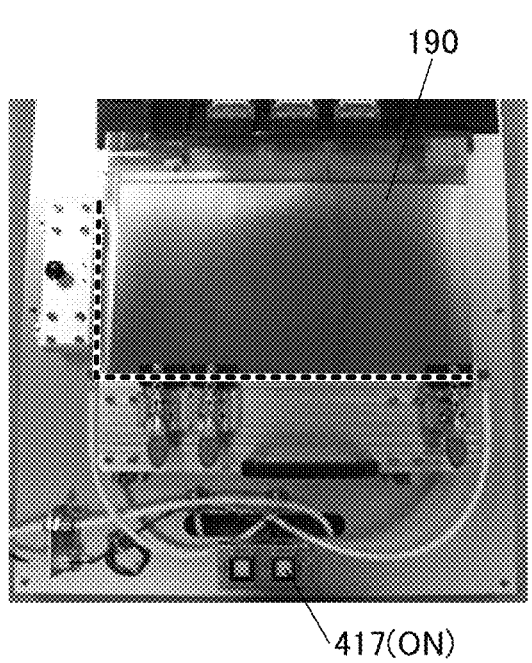
FIG. 29C1
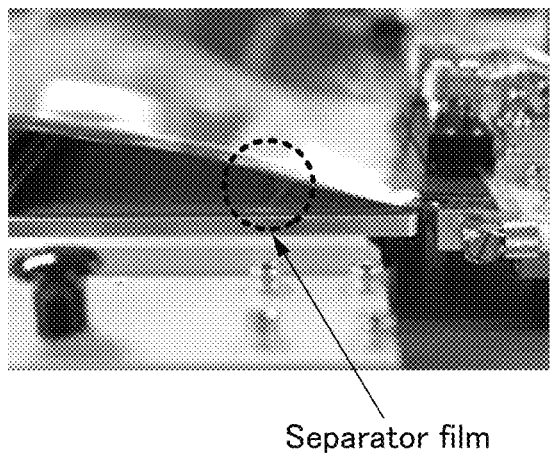
Separator film
FIG. 29D
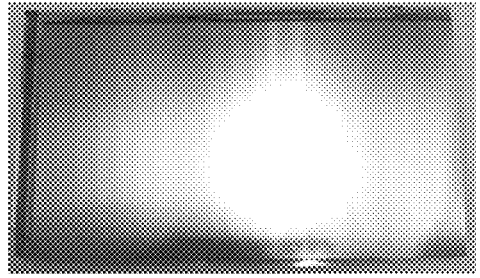
FIG. 29C2
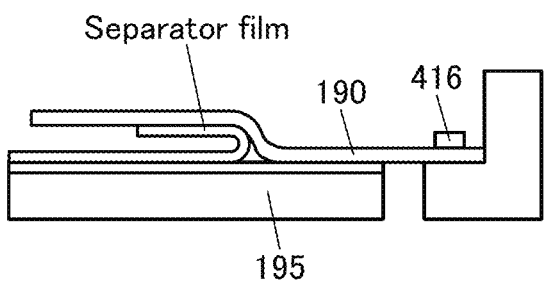
FIG. 29E
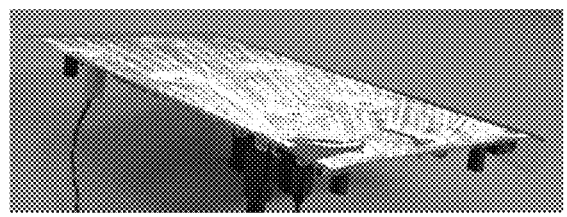

FIG. 34A
FIG. 34B
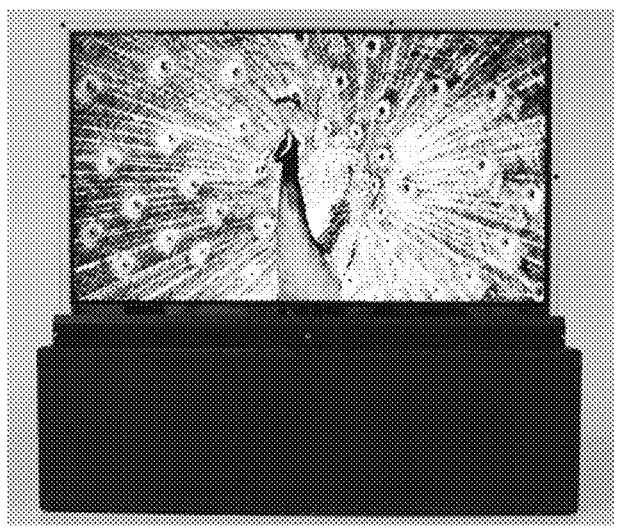
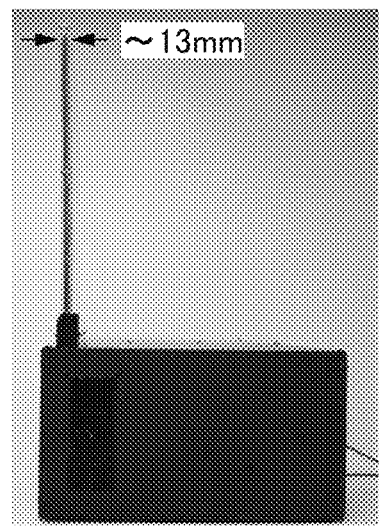
FIG. 34C

DISPLAY PANEL, DISPLAY DEVICE, DISPLAY MODULE, AND ELECTRONIC DEVICE

This application is a continuation of copending U.S. application Ser. No. 16/766,886, filed on May 26, 2020 which is a 371 of international application PCT/IB2018/059087 filed on Nov. 19, 2018 which are all incorporated herein by reference.

TECHNICAL FIELD

One embodiment of the present invention relates to a display panel, a display device, a display module, an electronic device, and a manufacturing method of a display panel.

Note that one embodiment of the present invention is not limited to the above technical field. Examples of the technical field of one embodiment of the present invention include a semiconductor device, a display device, a light-emitting device, an electronic device, a lighting device, an input/output device (e.g., a touch panel), a method for driving any of them, and a method for manufacturing any of them.

BACKGROUND ART

In recent years, display panels with high resolution have been demanded. For example, display panels including a large number of pixels, such as full high definition (1920×1080 pixels), 4K (e.g., 3840×2160 pixels or 4096×2160 pixels), and 8K (e.g., 7680×4320 pixels or 8192×4320 pixels) display panels, have been actively developed.

Furthermore, larger display panels have been required. For example, the screen size of the mainstream home-use television devices has been 50 inches or more diagonally. A larger screen size having a larger number of pixels allows a larger amount of information to be displayed at a time, and a further increase in screen size of digital signage and the like has been demanded.

Light-emitting elements utilizing electroluminescence (also referred to as EL elements) have features such as ease of thinning and lightening, high-speed response to an input signal, and driving with a direct-current low voltage source; thus, application of the EL elements to display panels has been proposed. For example, Patent Document 1 discloses a flexible light-emitting device including an organic EL element.

REFERENCE

Patent Document

[Patent Document 1] Japanese Published Patent Application No. 2014-197522

DISCLOSURE OF INVENTION

The aperture ratio of pixels in a top-emission display panel can be higher than that of pixels in a bottom-emission display panel because a transistor, a capacitor, a wiring, and the like can be provided so as to overlap with a light-emitting region of a light-emitting element in the top-emission display panel. On the other hand, a common electrode of the top-emission display panel needs to transmit visible light because light from the light-emitting element is extracted through the common electrode. The use of a visible-light-transmitting conductive material causes a problem of high resistance of the common electrode. When a voltage drop due to the resistance of the common electrode occurs, potential distribution in a display surface becomes nonuniform, and variation in luminance of light-emitting elements is caused, which degrades display quality.

An object of one embodiment of the present invention is to suppress display unevenness or luminance unevenness of a display panel or a display device. Another object of one embodiment of the present invention is to provide a display panel or display device with high display quality. Another object of one embodiment of the present invention is to provide a display panel or display device with a high aperture ratio of a pixel. Another object of one embodiment of the present invention is to provide a highly reliable display panel or display device.

Another object of one embodiment of the present invention is to increase the size of a display device. Another object of one embodiment of the present invention is to provide a display device including a large display region in which a seam is less likely to be recognized. Another object of one embodiment of the present invention is to reduce the thickness or weight of a display device. Another object of one embodiment of the present invention is to provide a display device that can display an image along a curved surface. Another object of one embodiment of the present invention is to provide a highly browsable display device. Another object of one embodiment of the present invention is to provide a novel display panel or display device.

Note that the description of these objects does not disturb the existence of other objects. One embodiment of the present invention does not necessarily achieve all the objects. Other objects can be derived from the description of the specification, the drawings, and the claims.

One embodiment of the present invention is a display panel including a first pixel electrode, a second pixel electrode, a third pixel electrode, a first light-emitting layer, a second light-emitting layer, a third light-emitting layer, a first common layer, a second common layer, a common electrode, and an auxiliary wiring. The first light-emitting layer is positioned over the first pixel electrode. The second light-emitting layer is positioned over the second pixel electrode. The third light-emitting layer is positioned over the third pixel electrode. The first light-emitting layer has a function of emitting light of a color different from a color of light emitted from the second light-emitting layer. The first light-emitting layer has a function of emitting light of a color identical to a color of light emitted from the third light-emitting layer. The first common layer is positioned over the first pixel electrode and the second pixel electrode. The first common layer includes a portion overlapping with the first light-emitting layer and a portion overlapping with the second light-emitting layer. The second common layer is positioned over the third pixel electrode. The second common layer includes a portion overlapping with the third light-emitting layer. The common electrode includes a portion overlapping with the first pixel electrode with the first common layer and the first light-emitting layer provided therebetween, a portion overlapping with the second pixel electrode with the first common layer and the second light-emitting layer provided therebetween, a portion overlapping with the third pixel electrode with the second common layer and the third light-emitting layer provided therebetween, and a portion in contact with a top surface of the auxiliary wiring. The first common layer may include a portion in contact with the second common layer. The first common layer may include a portion overlapping with the second common layer.

The first common layer may be positioned between the first pixel electrode and the first light-emitting layer. The first common layer may be positioned between the first light-emitting layer and the common electrode.

Another embodiment of the present invention is a display panel including a first pixel electrode, a second pixel electrode, a third pixel electrode, a first organic compound layer, a second organic compound layer, a common electrode, and an auxiliary wiring. The first organic compound layer is positioned over the first pixel electrode and the second pixel electrode. The second organic compound layer is positioned over the third pixel electrode. The first organic compound layer has a function of emitting light of a color identical to a color of light emitted from the second organic compound layer. The common electrode includes a portion overlapping with the first pixel electrode with the first organic compound layer provided therebetween, a portion overlapping with the second pixel electrode with the first organic compound layer provided therebetween, a portion overlapping with the third pixel electrode with the second organic compound layer provided therebetween, and a portion in contact with a top surface of the auxiliary wiring. The first organic compound layer may include a portion in contact with the second organic compound layer. The first organic compound layer may include a portion overlapping with the second organic compound layer.

The first organic compound layer and the second organic compound layer may each include a stack of a plurality of light-emitting layers. The first organic compound layer and the second organic compound layer may have a function of emitting white light.

The auxiliary wiring may be positioned over the same plane as the first pixel electrode.

The display panel having any of the above structures may further include a transistor, and the auxiliary wiring may be positioned over the same plane as a gate electrode or a source electrode included in the transistor.

The first pixel electrode, the second pixel electrode, and the third pixel electrode may each include a reflective electrode and a transparent electrode over the reflective electrode.

The common electrode may have both a visible-light-transmitting property and a visible-light-reflective property.

It is preferable that the auxiliary wiring not overlap with the first pixel electrode, the second pixel electrode, or the third pixel electrode.

Another embodiment of the present invention is a display module including the display panel having any one of the above structures, and at least one of a connector and an integrated circuit.

Another embodiment of the present invention is a display device including a first display panel and a second display panel. The first display panel and the second display panel each have any one of the above structures. The first display panel includes a first display region. The second display panel includes a second display region and a visible-light-transmitting region. The second display region is adjacent to the visible-light-transmitting region. The first display region includes a portion overlapping with the visible-light-transmitting region.

Another embodiment of the present invention is a display device including a flexible display panel, a first impact attenuating layer, a second impact attenuating layer, a first support, a second support, a first gear, and a second gear. The display panel is positioned between the first impact attenuating layer and the second impact attenuating layer. The first support overlaps with the display panel with the first impact attenuating layer provided therebetween, and the second support overlaps with the display panel with the first impact attenuating layer provided therebetween. The first support is connected to the first gear. The second support is connected to the second gear. The first gear and the second gear are engaged with each other, whereby the movements of the first support and the second support are synchronized. The first impact attenuating layer includes a region fixed to the first support, a region fixed to the second support, and a region fixed to neither the first support nor the second support. The display device is configured to change in shape from one of an opened state in which the first support and the second support are positioned substantially on the same plane and a folded state in which the first support and the second support overlap with each other to the other. In the folded state, the display panel is folded so that a display surface of the display panel is placed inward. It is preferable that the first impact attenuating layer and the second impact attenuating layer each contain at least one of urethane, acrylic, and silicone.

Another embodiment of the present invention is an electronic device including the display device having any of the above structures, and at least one of an antenna, a battery (e.g., a secondary battery), a housing, a camera, a speaker, a microphone, and an operation button.

Another embodiment of the present invention is a method for manufacturing a display panel, including the steps of forming a first pixel electrode, a second pixel electrode, and a third pixel electrode over an insulating surface, forming a first common layer over the first pixel electrode and the second pixel electrode, forming a second common layer over the third pixel electrode in a different step from the step of forming the first common layer, forming a first light-emitting layer over the first pixel electrode and forming a third light-emitting layer over the third pixel electrode using a first mask, forming a second light-emitting layer over the second pixel electrode using a second mask in a different step from the step of forming the first light-emitting layer, and forming a common electrode over the first common layer, the second common layer, the first light-emitting layer, the second light-emitting layer, and the third light-emitting layer.

In the above manufacturing method, after the first common layer is formed using a third mask, the third mask may be moved parallel to the insulating surface by one pixel, and then the second common layer may be formed using the third mask. Alternatively, in the above manufacturing method, the first common layer may be formed using the third mask, and the second common layer may be formed using a fourth mask. At this time, an opening pattern of the third mask is shifted from an opening pattern of the fourth mask by one pixel.

Another embodiment of the present invention is a method for manufacturing a display panel, including the steps of forming a first pixel electrode, a second pixel electrode, and a third pixel electrode over an insulating surface, forming a first organic compound layer over the first pixel electrode and the second pixel electrode, forming a second organic compound layer over the third pixel electrode in a different step from the step of forming the first organic compound layer, and forming a common electrode over the first organic compound layer and the second organic compound layer. The first organic compound layer has a function of emitting light of a color identical to a color of light emitted from the second organic compound layer.

In the above manufacturing method, the first organic compound layer may be formed using a first mask, and after the first organic compound layer is formed, the first mask may be moved parallel to the insulating surface by one pixel, and then the second organic compound layer may be formed using the first mask. Alternatively, in the above manufacturing method, the first organic compound layer may be formed using a first mask, and the second organic compound layer may be formed using a second mask. At this time, an opening pattern of the first mask is shifted from an opening pattern of the second mask by one pixel.

In any of the above manufacturing methods, an auxiliary wiring may be formed in the step of forming the first pixel electrode, the second pixel electrode, and the third pixel electrode.

One embodiment of the present invention can suppress display unevenness or luminance unevenness of a display panel or a display device. One embodiment of the present invention can provide a display panel or display device with high display quality. One embodiment of the present invention can provide a display panel or display device with a high aperture ratio of a pixel. One embodiment of the present invention can provide a highly reliable display panel or display device.

One embodiment of the present invention can increase the size of a display device. One embodiment of the present invention can provide a display device including a large display region in which a seam is less likely to be recognized. One embodiment of the present invention can reduce the thickness or weight of a display device. One embodiment of the present invention can provide a display device that can display an image along a curved surface. One embodiment of the present invention can provide a highly browsable display device. One embodiment of the present invention can provide a novel display panel or display device.

Note that the description of these effects does not disturb the existence of other effects.

One embodiment of the present invention does not necessarily achieve all the effects. Other effects can be derived from the description of the specification, the drawings, and the claims.

BRIEF DESCRIPTION OF DRAWINGS

In the accompanying drawings:

The patent or application file contains at least one drawing executed in color or of a photograph. Copies of this patent with color drawing(s) will be provided by the Patent and Trademark Office upon request and payment of the necessary fee.

FIGS. 6A to 6C are cross-sectional views illustrating an example of a method for manufacturing a display panel;

FIGS. 16A and 16B are cross-sectional views illustrating examples of a display panel;

FIG. 17A is a top view illustrating an example of a display panel and FIG. 17B is a cross-sectional view illustrating an example of a display panel;

FIGS. 18A, 18B1, 18B2, 18C1, and 18C2 are cross-sectional views illustrating examples of a method for manufacturing a display panel;

FIGS. 21A and 21B are timing charts showing operation examples of a pixel;

FIGS. 29A, 29B, 29C1, and 29D are photographs showing an example of a method for attaching a display panel, FIG. 29C2 is a side view illustrating an example of a method for attaching a display panel, and FIG. 29E is a photograph of a display panel;

FIGS. 34A to 34C are photographs of a display device of Example;

BEST MODE FOR CARRYING OUT THE INVENTION

Figure 1A:
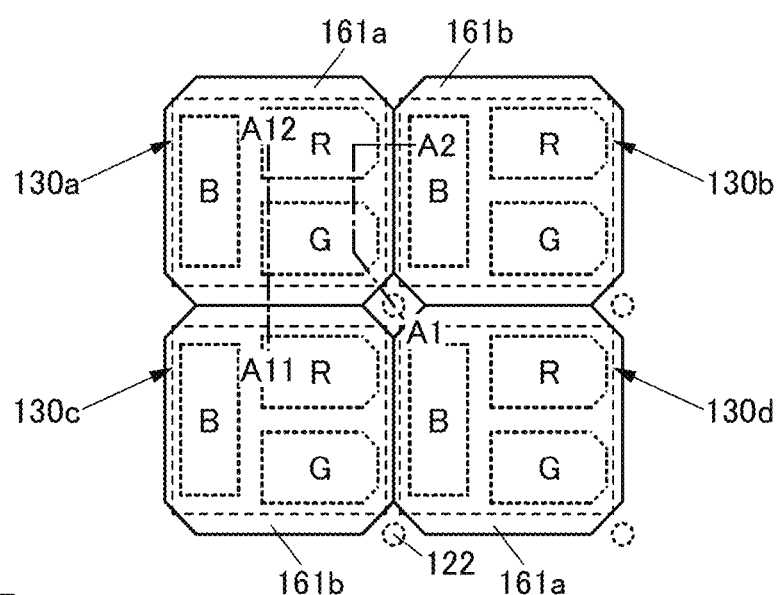
FIG. 1A is a top view illustrating an example of a display panel and FIGS. 1B and 1C are cross-sectional views illustrating an example of a display panel.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. The same hatching pattern is applied to portions having similar functions, and the portions are not denoted by specific reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Embodiment 1

In this embodiment, display panels and display devices of one embodiment of the present invention are described with reference to FIGS. 1A to 1C to FIGS. 18A to 18C2.

The display panel in this embodiment has a top-emission structure and includes a light-emitting element as a display element.

Specifically, the display panel of one embodiment of the present invention includes a first pixel electrode, a second pixel electrode, a third pixel electrode, a first light-emitting layer, a second light-emitting layer, a third light-emitting layer, a first common layer, a second common layer, a common electrode, and an auxiliary wiring. The first light-emitting layer is positioned over the first pixel electrode. The second light-emitting layer is positioned over the second pixel electrode. The third light-emitting layer is positioned over the third pixel electrode. The first light-emitting layer has a function of emitting light of a color different from that of light emitted from the second light-emitting layer. The first light-emitting layer has a function of emitting light of a color identical to that of light emitted from the third light-emitting layer. The first common layer is positioned over the first pixel electrode and the second pixel electrode. The first common layer has a portion overlapping with the first light-emitting layer and a portion overlapping with the second light-emitting layer. The second common layer is positioned over the third pixel electrode. The second common layer has a portion overlapping with the third light-emitting layer. The common electrode has a portion overlapping with the first pixel electrode with the first common layer and the first light-emitting layer provided therebetween, a portion overlapping with the second pixel electrode with the first common layer and the second light-emitting layer provided therebetween, a portion overlapping with the third pixel electrode with the second common layer and the third light-emitting layer provided therebetween, and a portion in contact with a top surface of the auxiliary wiring.

When the auxiliary wiring is connected to the common electrode of the light-emitting element, a voltage drop due to the resistance of the common electrode can be inhibited, resulting in a display panel with high display quality. The common layers of the light-emitting element are separated into the first common layer and the second common layer, whereby the aperture ratio of the pixel can be increased. Thus, a decrease in aperture ratio of the pixel caused by the auxiliary wiring in the pixel portion of the display panel can be suppressed. As the aperture ratio of the pixel is higher, the luminance of subpixels needed for obtaining a certain luminance in the display panel becomes lower, which extends the lifetime of the light-emitting element. Furthermore, the display panel can exhibit a high luminance.

[Comparative Example of Display Panel]

Figure 9A:
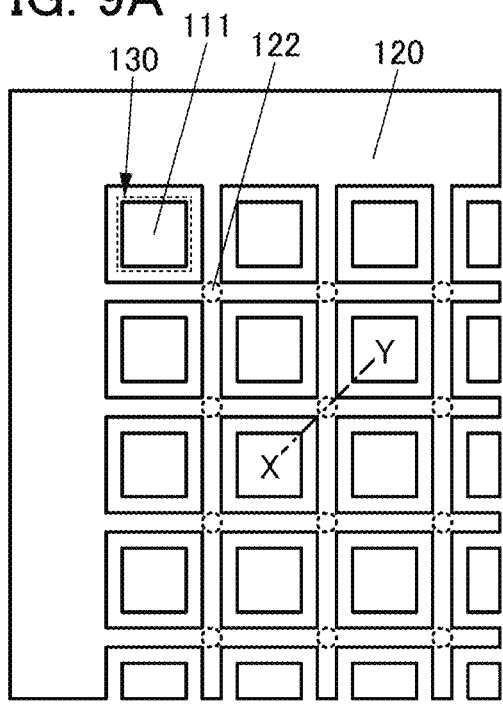
FIGS. 9A and 9C are top views illustrating a comparative example of a display panel and FIG. 9B is a cross-sectional view illustrating a comparative example of a display panel.
Figure 9B:
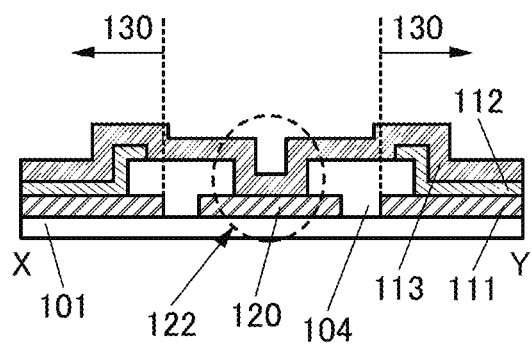

A display panel including an auxiliary wiring, which is a comparative example, is described with reference to FIGS. 9A to 9C. FIG. 9A shows a top view of a pixel electrode 111 and an auxiliary wiring 120 included in the display panel. FIG. 9B shows a cross-sectional view taken along the dashed-dotted line X-Y in FIG. 9A.

As illustrated in FIG. 9A, the auxiliary wiring 120 of a common electrode 113 and the pixel electrode 111 can be provided over the same surface (an insulating layer 101 in FIG. 9B). As illustrated in FIG. 9B, an opening portion of an insulating layer 104 is provided over the auxiliary wiring 120, and all EL layers 112 are formed separately for each color, whereby the auxiliary wiring 120 and the common electrode 113 can be connected to each other in a connection portion 122.

Here, the case where one pixel 130 is composed of three subpixels of red, green, and blue (R, G, and B) is described. In the case where all of the EL layers 112 are formed separately for each color, the number of deposition steps is extremely large. Thus, even in the case where the light-emitting layers are formed separately for each color, layers (e.g., a hole-injection layer, a hole-transport layer, an electron-transport layer, and an electron-injection layer) which can each have a structure shared by subpixels of three colors are preferably formed in one step.

Figure 9C:
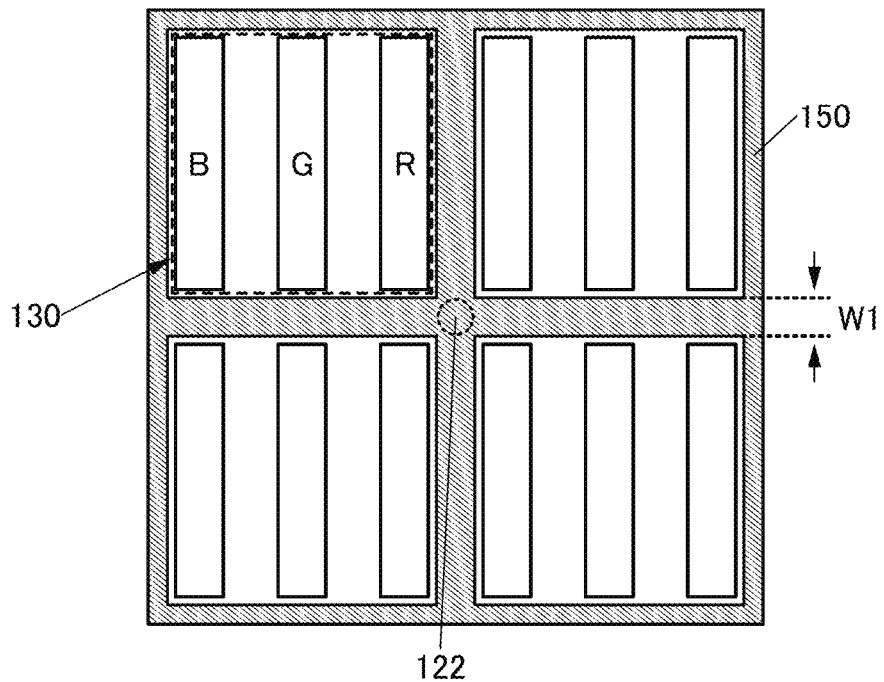

FIG. 9C shows an example of a metal mask that can be used to form the EL layers 112. With the use of a mask 150, layers having a structure shared by three subpixels (common layer) can be formed in one step, and the EL layer 112 is not formed in the connection portion 122. However, in the case of using the mask, evaporation materials are deposited on a region over which the mask is placed, leading to deformation or displacement of a pattern. Thus, in order not to form the EL layer 112 in the connection portion 122, a non-opening portion of the mask 150 is broadly provided between the two pixels 130 (see width W1 of a non-opening portion in FIG. 9C), so that the aperture ratio of the mask 150 is decreased. Furthermore, to prevent generation of a warp of the mask, tension of the mask needs to be ensured sufficiently. To keep the strength of the mask, there is a problem in that the width of the non-opening portion of the mask cannot be shorter than a certain width.

In view of the above, in one embodiment of the present invention, the common layers included in the EL layer are formed in two steps. When the common layers are formed in two steps, the aperture ratio of the pixel can be increased as compared with the case where the common layers are formed in one step. Thus, even when the auxiliary wiring is provided in the pixel portion in the display panel, a decrease in the aperture ratio of the pixel can be suppressed. Note that the common layers can be formed in three or more steps. However, in this case, the number of deposition steps is extremely large; thus, the common layers are preferably formed in two steps. A specific structure of the display panel is described below.

[Specific Example 1 of Display Panel]

Display panels each of which includes an auxiliary wiring and is one embodiment of the present invention are described with reference to FIGS. 1A to 1C to FIGS. 7A to 7C.

Figure 1B:
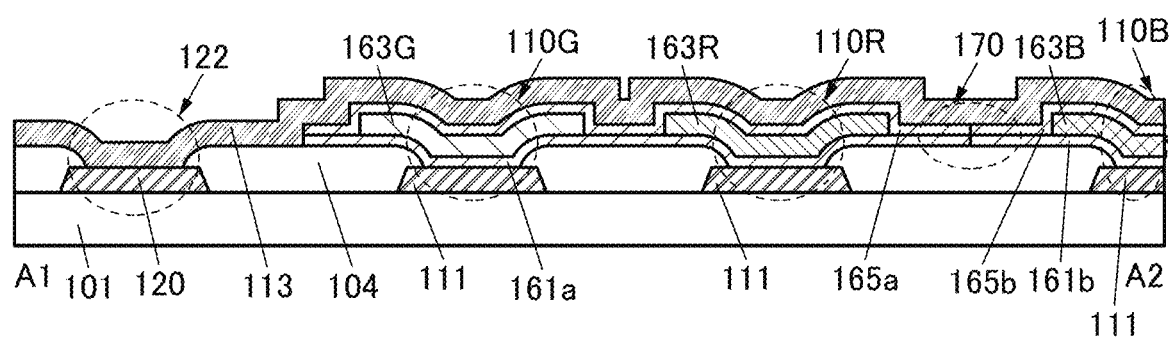
Figure 1C:
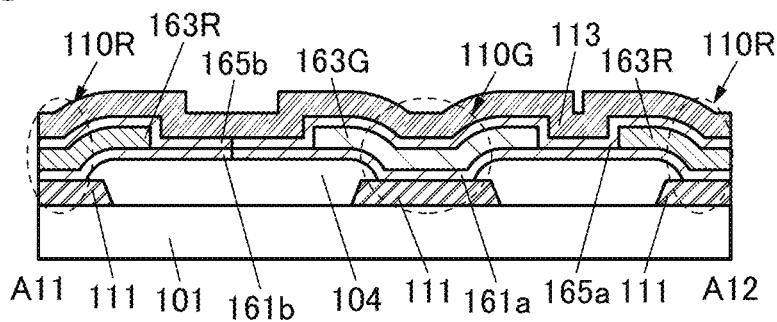
Figure 2A:
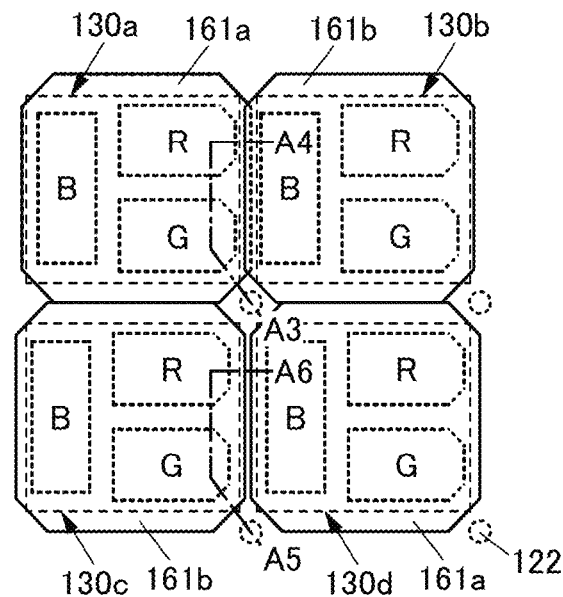
FIGS. 2A and 2B are top views illustrating examples of a display panel and FIGS. 2C and 2D are cross-sectional views illustrating examples of a display panel.
Figure 2B:
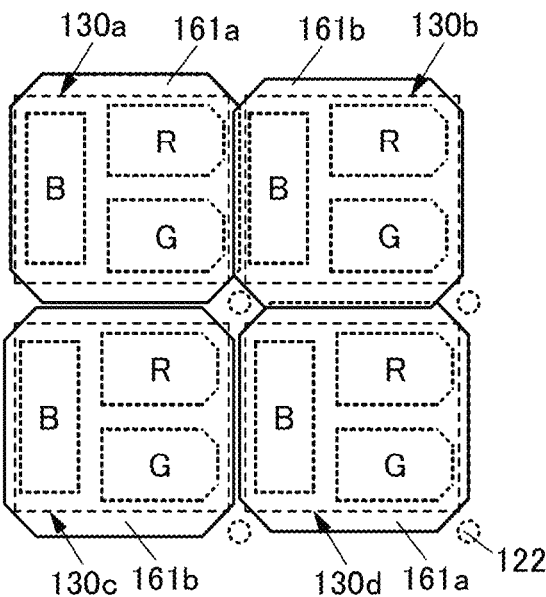
Figure 2C:
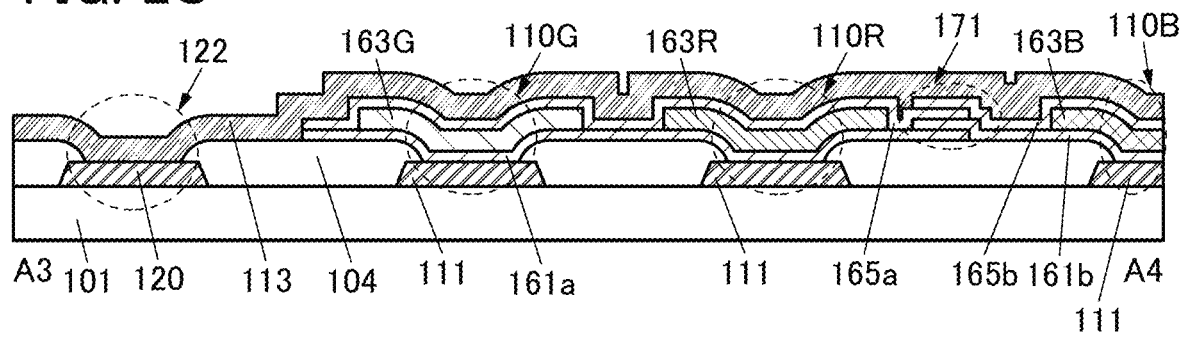
Figure 2D:
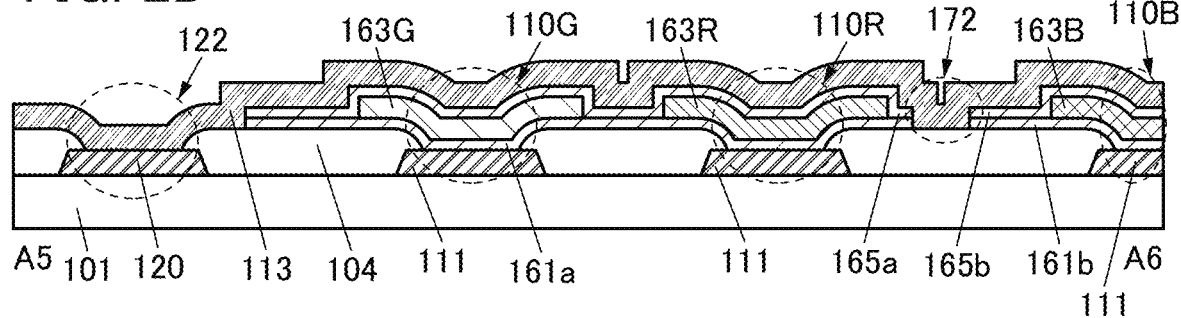

FIG. 1A and FIGS. 2A and 2B each show a top view of a common layer 161a and a common layer 161b included in a display panel. FIGS. 2A and 2B show modification examples of FIG. 1A. FIG. 1B is a cross-sectional view taken along the dashed-dotted line A1-A2 in FIG. 1A. FIG. 1C is a cross-sectional view taken along the dashed-dotted line A11-A12 in FIG. 1A. FIG. 2C is a cross-sectional view taken along the dashed-dotted line A3-A4 in FIG. 2A. FIG. 2D is a cross-sectional view taken along the dashed-dotted line A5-A6 in FIG. 2A.

FIG. 1B is a cross-sectional view showing a red subpixel (R) and a green subpixel (G) included in a pixel 130a and a blue subpixel (B) included in a pixel 130b which is adjacent to the pixel 130a as illustrated in FIG. 1A. Furthermore, FIG. 1C is a cross-sectional view including the red subpixel (R) and the green subpixel (G) included in the pixel 130a and a red subpixel (R) included in a pixel 130c which is adjacent to the pixel 130a.

The display panel illustrated in FIG. 1B includes the pixel electrodes 111 and the auxiliary wiring 120 over the insulating layer 101. The end portion of the pixel electrode 111 and the end portion of the auxiliary wiring 120 are covered with the insulating layer 104. An EL layer is provided over the pixel electrode 111 through an opening in the insulating layer 104. The common electrode 113 is provided over the auxiliary wiring 120 and the EL layer. The common electrode 113 is shared by subpixels of a plurality of colors and a plurality of pixels.

The EL layer includes the common layers (the common layer 161 and a common layer 165 in FIG. 1B) which are shared by the subpixels of a plurality of colors and layers provided for each color (light-emitting layers 163 in FIG. 1B). Note that the common layer 161a and the common layer 161b are collectively referred to as the common layer 161 in some cases. Similarly, the light-emitting layers included in the subpixels are collectively referred to as the light-emitting layers 163, and a common layer 165a and a common layer 165b are collectively referred to as the common layer 165 in some cases. Furthermore, in the drawings, the thicknesses of the light-emitting layers are substantially equal to each other; however, the thickness of the light-emitting layer may differ between colors.

The common layer included in the EL layer may be positioned between the pixel electrode and the light-emitting layer or between the light-emitting layer and the common electrode. This embodiment shows an example in which the light-emitting element includes both the common layer 161 positioned between the pixel electrode 111 and the light-emitting layer 163 and the common layer 165 positioned between the light-emitting layer 163 and the common electrode 113; however, the light-emitting element may include only one of the common layer 161 and the common layer 165.

As illustrated in FIGS. 1A to 1C, a plurality of light-emitting elements included in the same pixel include the same common layer 161 (the common layer 161a or 161b), and one of the two light-emitting elements included in the adjacent pixels includes the common layer 161a, and the other includes the common layer 161b.

The pixel electrode 111 overlaps with the common electrode 113 with the EL layer provided therebetween. When a voltage higher than the threshold voltage of the light-emitting element is applied between the pixel electrode 111 and the common electrode 113, holes are injected to the EL layer from the anode side and electrons are injected to the EL layer from the cathode side. The injected electrons and holes are recombined in the EL layer and a light-emitting substance contained in the EL layer emits light.

In the connection portion 122, the auxiliary wiring 120 is in contact with the common electrode 113. That is, the auxiliary wiring 120 is electrically connected to the common electrode 113. The common electrode 113 is electrically connected to the auxiliary wiring 120, so that a voltage drop due to the resistance of the common electrode 113 can be inhibited. Accordingly, luminance unevenness of the display panel can be suppressed and the display quality of the display panel can be improved. Note that the auxiliary wiring 120 does not overlap with the pixel electrode 111. Furthermore, the auxiliary wiring 120 is electrically insulated from the pixel electrode 111.

In each of the pixel 130a and a pixel 130d, the red subpixel (R) includes a light-emitting element 110R illustrated in FIG. 1B. The light-emitting element 110R includes the pixel electrode 111, the common layer 161a, a light-emitting layer 163R, the common layer 165a, and the common electrode 113. In contrast, in each of the pixel 130b and the pixel 130c, a light-emitting element included in the red subpixel (R) includes neither the common layer 161a nor the common layer 165a, and includes the common layer 161b and the common layer 165b (see FIG. 1C).

In each of the pixel 130a and the pixel 130d, the green subpixel (G) includes a light-emitting element 110G illustrated in FIG. 1B. The light-emitting element 110G includes the pixel electrode 111, the common layer 161a, a light-emitting layer 163G, the common layer 165a, and the common electrode 113. In contrast, in each of the pixel 130b and the pixel 130c, a light-emitting element included in the green subpixel (G) includes neither the common layer 161a nor the common layer 165a, and includes the common layer 161b and the common layer 165b.

In each of the pixel 130b and the pixel 130c, the blue subpixel (B) includes a light-emitting element 110B illustrated in FIG. 1B. The light-emitting element 110B includes the pixel electrode 111, the common layer 161b, a light-emitting layer 163B, the common layer 165b, and the common electrode 113. In contrast, in each of the pixel 130a and the pixel 130d, a light-emitting element included in the blue subpixel (B) includes neither the common layer 161b nor the common layer 165b, and includes the common layer 161a and the common layer 165a.

In a region 170, the common layer 161a and the common layer 161b are in contact with each other. Similarly, in the region 170, the common layer 165a and the common layer 165b are in contact with each other. In the region 170, the common layer 165a is over and in contact with the common layer 161a. Similarly, in the region 170, the common layer 165b is over and in contact with the common layer 161b.

As illustrated in FIG. 1A, regions where neither the common layer 161a nor the common layer 161b is provided are only the connection portion 122 and its surroundings. That is, a plurality of regions where the common layer 161 is not provided are apart from one another. In the case where the common layer 161 is formed in one step with the use of a metal mask, it is difficult to make the plurality of regions where the common layer 161 is not provided apart from one another because of the structure. Thus, the top surface layout of the common layer 161 illustrated in FIG. 1A can be regarded as a characteristic layout obtained by forming the common layer 161 in a plurality of steps, that is, a characteristic layout of one embodiment of the present invention.

Note that displacement of the mask or the like at the time of film formation may result in a portion where the common layer 161a and the common layer 161b overlap with each other and a portion where the common layer 161a and the common layer 161b are apart from each other, as illustrated in FIGS. 2A to 2D.

FIG. 2A shows an example in which the common layer 161a included in the pixel 130a overlaps with the common layer 161b included in the pixel 130b and the common layer 161b included in the pixel 130c and the common layer 161a included in the pixel 130d are apart from each other.

In a region 171 in FIG. 2C, the common layer 161b is positioned over the common layer 161a. Similarly, in the region 171, the common layer 165b is positioned over the common layer 165a.

In a region 172 in FIG. 2D, the common layer 161a and the common layer 161b are apart from each other. Similarly, in the region 172, the common layer 165a and the common layer 165b are apart from each other.

In FIG. 2B, each of the common layers 161a included in the pixel 130a and the pixel 130d overlaps with the common layer 161b included in the pixel 130b and is apart from the common layer 161b included in the pixel 130c.

Also in FIGS. 2A and 2B, neither the common layer 161a nor the common layer 161b is provided in the connection portion 122 and its surroundings. That is, a plurality of regions where the common layer 161 is not provided are apart from each other. The top surface layout of the common layer 161 illustrated in each of FIGS. 2A and 2B can also be regarded as a characteristic layout obtained by forming the common layer 161 in a plurality of steps, that is, a characteristic layout of one embodiment of the present invention.

Note that in FIG. 1B and FIGS. 2C and 2D, the end portion of the common layer 161 and the end portion of the common layer 165 are aligned with each other; however, one embodiment of the present invention is not limited thereto.

Since the display panel of one embodiment of the present invention has a top-emission structure, the pixel electrode 111 is an electrode through which light is not extracted. The pixel electrode 111 preferably includes a visible-light-reflecting conductive film. Furthermore, in the case where the light-emitting element has a micro optical resonator (microcavity) structure, the pixel electrode 111 is preferably a reflective electrode. The reflective electrode has a visible light reflectance of higher than or equal to 40% and lower than or equal to 100%, and preferably higher than or equal to 70% and lower than or equal to 100%.

In the display panel of one embodiment of the present invention, the pixel electrode 111 and the auxiliary wiring 120 can be formed by processing the same conductive film. A material used for the pixel electrode 111 and the auxiliary wiring 120 preferably has a lower resistivity than a material used for the common electrode 113.

For the visible-light-reflecting conductive film, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Moreover, the conductive film can be formed using an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium. An alloy containing silver and copper is preferable because of its high heat resistance. Furthermore, when a metal film or a metal oxide film is stacked on and in contact with an aluminum alloy film, oxidation of the aluminum alloy film can be suppressed. Examples of materials for the metal film or the metal oxide film include titanium and titanium oxide. Alternatively, a visible-light-transmitting conductive film described later and a film containing the metal material or the alloy may be stacked. For example, a stacked film of silver and indium tin oxide (ITO), a stacked film of an alloy of silver and magnesium and ITO, or the like can be used.

The EL layer includes at least a light-emitting layer. The EL layer may include a plurality of light-emitting layers. In addition to the light-emitting layer, the EL layer may include a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like. The EL layer contains one or more kinds of light-emitting substances. The light-emitting substance may be an organic compound or an inorganic compound.

The common layer 161 preferably includes a hole-injection layer. The common layer 161 may further include a hole-transport layer. The common layer 165 preferably includes an electron-injection layer. The common layer 165 may further include an electron-transport layer.

The hole-injection layer injects holes from an anode to the EL layer and contains a material with a high hole-injection property. As the material with a high hole-injection property, a composite material containing a hole-transport material and an acceptor material (electron-accepting material) is preferably used.

The hole-transport layer transports the holes, which are injected from the anode by the hole-injection layer, to the light-emitting layer and contains a hole-transport material.

The light-emitting layer contains a light-emitting substance. Note that as the light-emitting substance, a substance whose emission color is blue, violet, bluish violet, green, yellowish green, yellow, orange, red, or the like is appropriately used. When a plurality of light-emitting layers are formed using different light-emitting substances, different emission colors can be exhibited (for example, complementary emission colors are combined to achieve white light emission). Furthermore, a stacked-layer structure in which one light-emitting layer contains two or more kinds of light-emitting substances may be employed. There is no particular limitation on the light-emitting substances that can be used for the light-emitting layer, and a light-emitting substance that converts singlet excitation energy into light emission in the visible light range or a light-emitting substance that converts triplet excitation energy into light emission in the visible light range can be used. As an example of the light-emitting substance that converts singlet excitation energy into light emission, a substance emitting fluorescence (fluorescent material) can be given. As examples of a light-emitting substance that converts triplet excitation energy into light emission, a substance emitting phosphorescence (phosphorescent material) and a thermally activated delayed fluorescent (TADF) material that exhibits thermally activated delayed fluorescence can be given. It is preferable that a light-emitting substance that converts singlet excitation energy into light emission in the visible light range be used as the blue-light-emitting substance and light-emitting substances that convert triplet excitation energy into light emission in the visible light range be used as the green- and red-light-emitting substances, in which case the spectrum balance between R, G, and B is improved. The light-emitting layer may contain one or more kinds of compounds (a host material and an assist material) in addition to a light-emitting substance (guest material). As the host material and the assist material, one or more kinds of substances having a larger energy gap than the light-emitting substance (the guest material) are used. As the host material and the assist material, compounds which form an exciplex are preferably used in combination. To form an exciplex efficiently, it is particularly preferable to combine a compound that easily accepts holes (hole-transport material) and a compound that easily accepts electrons (electron-transport material).

The electron-transport layer transports the electrons, which are injected from the cathode by the electron-injection layer, to the light-emitting layer and contains an electron-transport material.

The electron-injection layer injects electrons from the cathode to the EL layer and contains a material with a high electron-injection property.

In the case where the light-emitting element has a microcavity structure, optical adjustment can be performed by the electrode or the EL layer. In the case where the optical adjustment is performed by using at least one of layers included in the EL layer, the layer may be provided for each color like the light-emitting layer. For example, the hole-transport layers are formed with different thicknesses for each color, whereby the optical adjustment may be performed.

For the EL layer, either a low-molecular compound or a high-molecular compound can be used, and an inorganic compound (e.g., a quantum dot material) may also be used. Each of the layers included in the EL layer can be formed by any of the following methods: an evaporation method (including a vacuum evaporation method), a transfer method, a printing method, an inkjet method, a coating method, and the like.

The light-emitting element may be a single element including one EL layer or a tandem element in which a plurality of EL layers are stacked with a charge generation layer provided therebetween.

In one embodiment of the present invention, a light-emitting element containing an inorganic compound such as a quantum dot may be employed.

The common electrode 113 is an electrode through which light is extracted. The common electrode 113 preferably includes a visible-light-transmitting conductive film. Furthermore, in the case where the light-emitting element has a microcavity structure, the common electrode 113 preferably has both a visible-light-transmitting property and a visible-light-reflective property, and is preferably a transflective electrode. The transflective electrode has a visible light reflectance of higher than or equal to 20% and lower than or equal to 80%, and preferably higher than or equal to 40% and lower than or equal to 70%.

The visible-light-transmitting conductive film can be formed using, for example, indium oxide, ITO, indium zinc oxide, zinc oxide (ZnO), gallium zinc oxide (Ga—Zn oxide), or aluminum zinc oxide (Al—Zn oxide). Alternatively, a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin enough to have a light-transmitting property. Alternatively, a stacked film of any of the above materials can be used as the conductive film. For example, a stacked film of ITO and an alloy of silver and magnesium is preferably used, in which case conductivity can be increased. Still alternatively, graphene or the like may be used.

Each of the pixel electrode 111 and the common electrode 113 can be formed by an evaporation method or a sputtering method. Alternatively, a discharging method such as an inkjet method, a printing method such as a screen printing method, or a plating method can be used.

A manufacturing method of the display panel in FIG. 1B is described with reference to FIGS. 3A to 3E to FIGS. 6A to 6C.

Note that thin films (e.g., insulating films, semiconductor films, and conductive films) included in the display panel can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

The thin films included in the display panel (e.g., insulating films, semiconductor films, and conductive films) can be formed by a method such as spin coating, dipping, spray coating, ink-jetting, dispensing, screen printing, or offset printing, or with a doctor knife, a slit coater, a roll coater, a curtain coater, or a knife coater.

When the thin films included in the display panel are processed, a lithography method or the like can be used. Alternatively, island-shaped thin films may be formed by a film formation method using a blocking mask. Alternatively, the thin films may be processed by a nano-imprinting method, a sandblasting method, a lift-off method, or the like. Examples of a photolithography method include a method in which a resist mask is formed over a thin film to be processed, the thin film is processed by etching or the like, and the resist mask is removed, and a method in which a photosensitive thin film is formed, and the photosensitive thin film is exposed to light and developed to be processed into a desired shape.

As light for exposure in a lithography method when using light, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when exposure is performed by scanning of a beam such as an electron beam.

For etching of the thin film, a dry etching method, a wet etching method, a sandblasting method, or the like can be used.

Figure 3A:
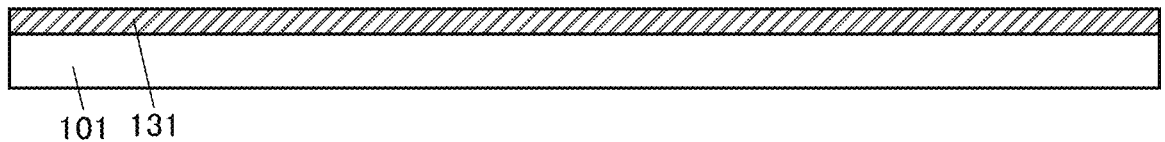
FIGS. 3A to 3E are cross-sectional views illustrating an example of a method for manufacturing a display panel.

First, a conductive film 131 is formed over the insulating layer 101 (FIG. 3A).

Figure 3B:
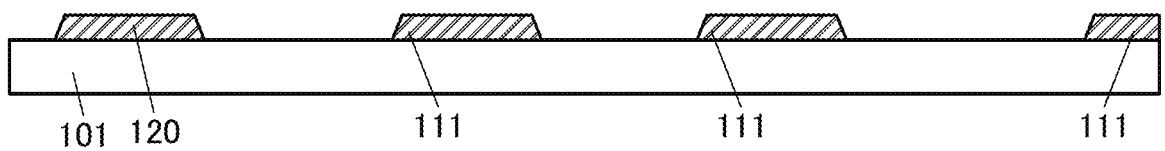
Figure 3C:
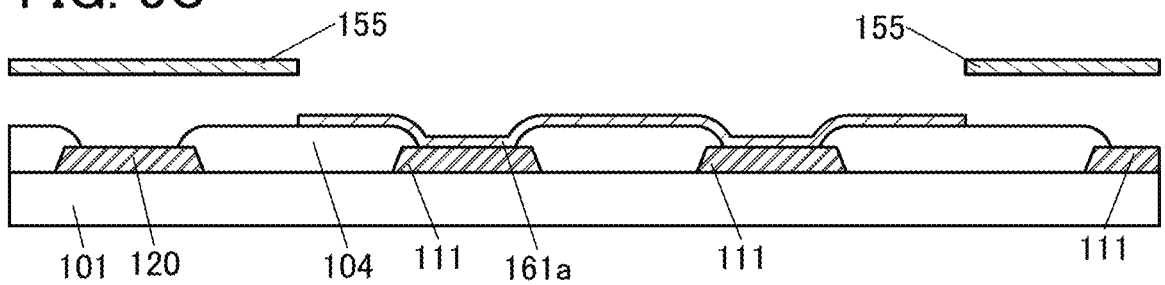

Then, the conductive film 131 is processed to form the pixel electrode 111 and the auxiliary wiring 120 over the insulating layer 101 (FIG. 3B). After that, the insulating layer 104 is formed to cover the end portion of the pixel electrode 111 and the end portion of the auxiliary wiring 120 (FIG. 3C). The insulating layer 104 is provided with an opening so that the top surface of the pixel electrode 111 and the top surface of the auxiliary wiring 120 are exposed.

Figure 4A:
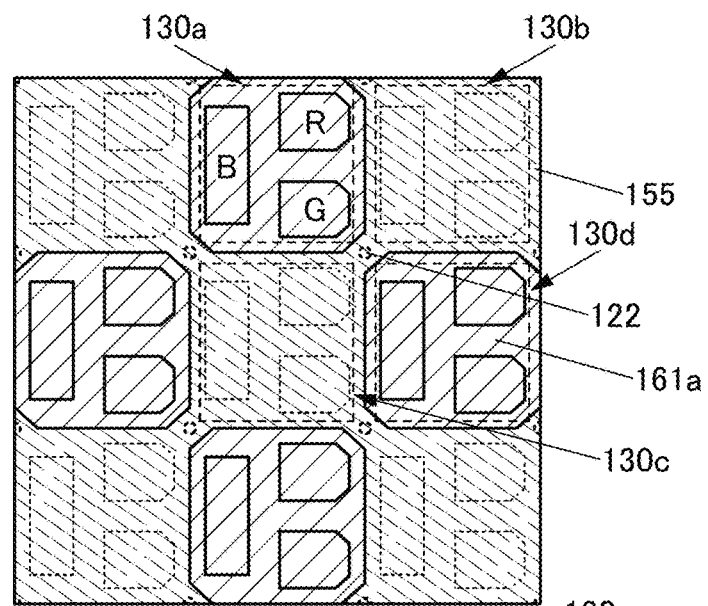
FIGS. 4A to 4C are top views illustrating an example of a method for manufacturing a display panel.

Next, the common layer 161a is formed using a mask 155 (FIG. 3C and FIG. 4A). As illustrated in FIG. 4A, the mask 155 is provided with openings so that the common layer 161a is formed in every other pixel in both the column direction and the row direction. When the common layer 161a is formed in the pixel 130a in FIG. 4A, the common layer 161a is not formed in four pixels adjacent to the pixel 130a. For example, the common layer 161a is formed in regions corresponding to the pixel 130a and the pixel 130d and is not formed in regions corresponding to the pixel 130b, the pixel 130c, and the connection portion 122. The mask 155 is preferably a metal mask.

Then, the mask 155 is moved parallel to the insulating layer 101 by one pixel. The mask 155 moves in one direction, which may be the column direction or the row direction of the pixel arrangement.

Figure 3D:
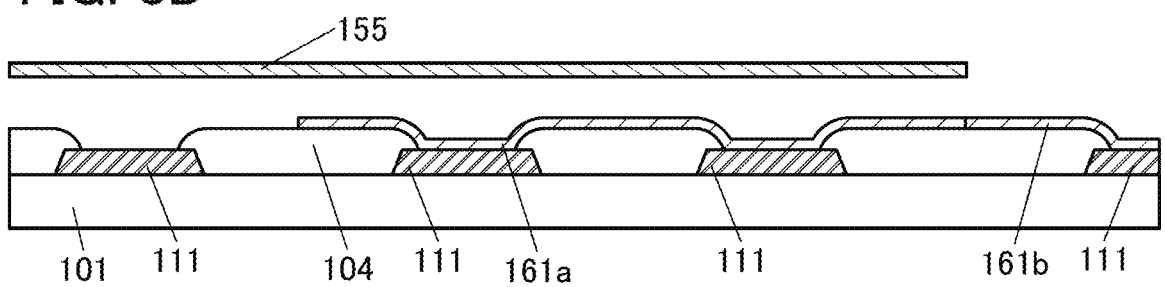
Figure 4B:
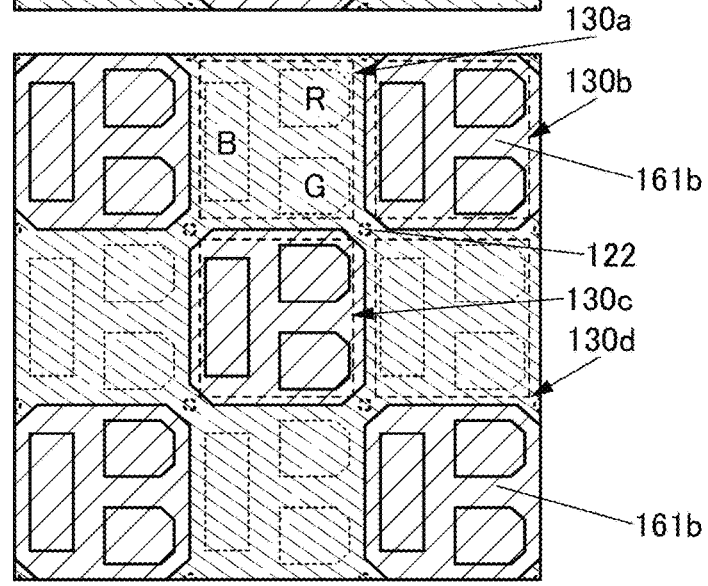

Next, with the mask 155, the common layer 161b is formed (FIG. 3D and FIG. 4B). As illustrated in FIG. 4B, the mask 155 is shifted by one pixel to form the common layer 161b in the pixel in which the common layer 161a is not formed. For example, the common layer 161b is formed in regions corresponding to the pixel 130b and the pixel 130c and is not formed in regions corresponding to the pixel 130a, the pixel 130d, and the connection portion 122.

Note that the common layer 161b may be formed using another mask having an opening pattern shifted from that of the mask 155 by one pixel.

Figure 4C:
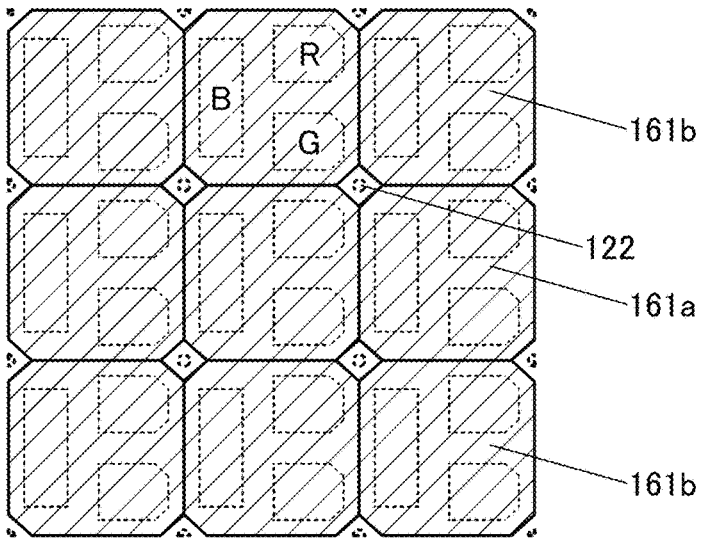

The common layer 161 is formed in two steps, whereby the common layer 161 can be formed in all the pixels and can be prevented from being formed in the connection portion 122, as illustrated in FIG. 4C. When the common layer 161 is formed in two steps, the aperture ratio of the pixel can be large as compared with the case where the common layer 161 is formed in one step.

Figure 3E:
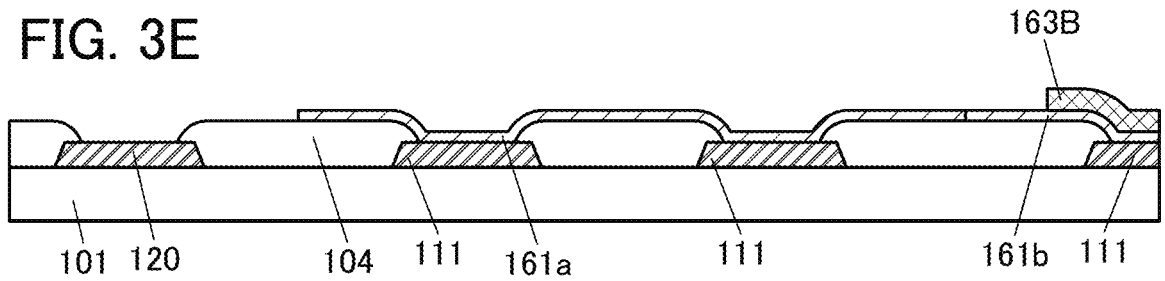
Figure 5A:
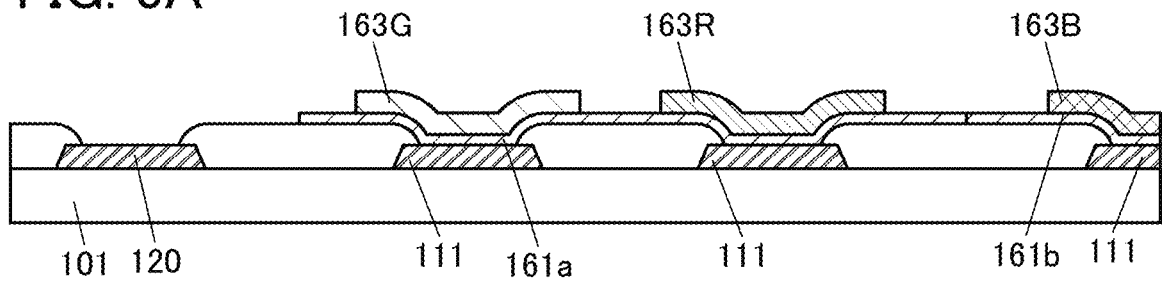
FIGS. 5A to 5D are cross-sectional views illustrating an example of a method for manufacturing a display panel.

Next, the light-emitting layer 163B, the light-emitting layer 163G, and the light-emitting layer 163R are formed in the different steps (FIG. 3E and FIG. 5A). The formation order of the light-emitting layers is not limited. In the example of FIG. 3E, the light-emitting layer 163B is formed first. When the light-emitting layers are formed sequentially from a layer of a color with a short wavelength, a display defect caused by unintentional entry of a light-emitting material into a pixel of another color is less likely to occur in some cases.

Layers other than the light-emitting layer may be formed separately for each color. For example, the hole-injection layer may be formed as the common layer 161, and then the hole-transport layer and the light-emitting layer may be formed separately for each color. At this time, the hole-transport layer and the light-emitting layer are successively formed, which improves the reliability of the light-emitting element. Specifically, as illustrated in FIG. 6A, a hole-transport layer for blue light 163B_1 is formed and a blue light-emitting layer 163B_2 is formed, then as illustrated in FIG. 6B, a hole-transport layer for green light 163G_1 is formed and a green light-emitting layer 163G_2 is formed, and then, as illustrated in FIG. 6C, a hole-transport layer for red light 163R_1 for red light is formed and a red light-emitting layer 163R_2 is formed. Note that the hole-transport layers may each have an optical adjustment function when the thickness of the hole-transport layer differs between colors.

Figure 5B:
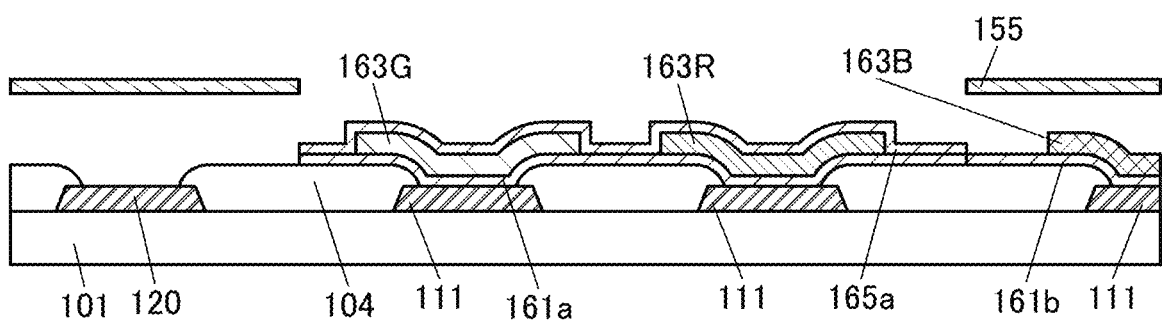

Next, the common layer 165a is formed using the mask 155 (FIG. 5B). Like the common layer 161a, the common layer 165a is formed in regions corresponding to the pixel 130a and the pixel 130d and is not formed in regions corresponding to the pixel 130b, the pixel 130c, and the connection portion 122.

Then, the mask 155 is moved parallel to the insulating layer 101 by one pixel.

Figure 5C:
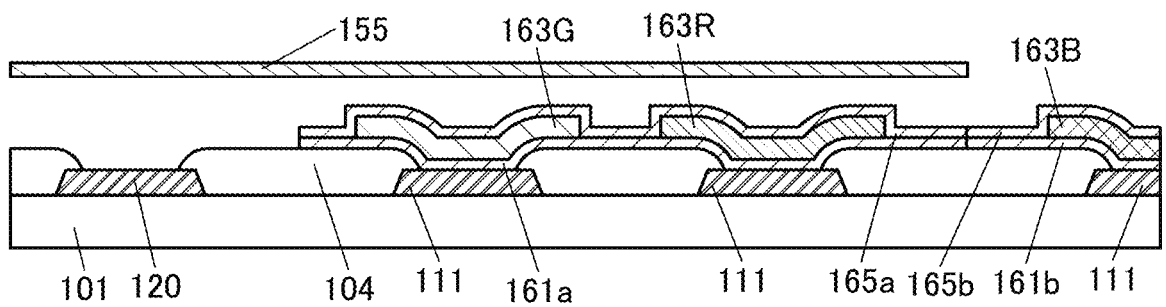

Next, the common layer 165b is formed using the mask 155 (FIG. 5C). Like the common layer 161b, the common layer 165b is formed in regions corresponding to the pixel 130b and the pixel 130c and is not formed in regions corresponding to the pixel 130a, the pixel 130d, and the connection portion 122.

Note that the common layer 165b may be formed using another mask having an opening pattern shifted from that of the mask 155 by one pixel.

Figure 5D:
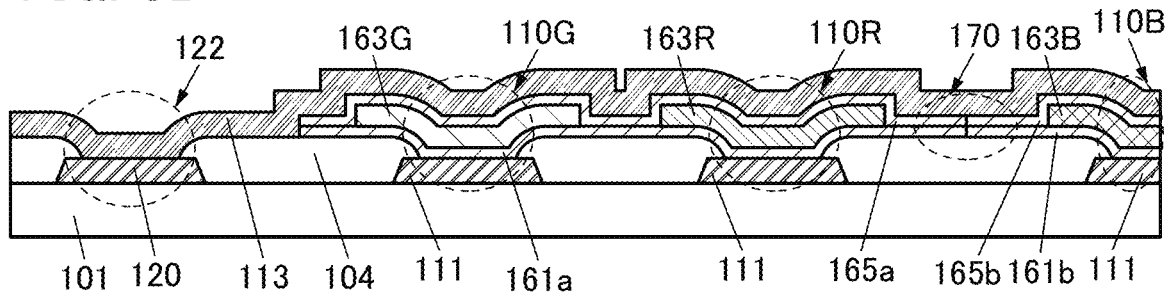

Then, the common electrode 113 is formed to cover the auxiliary wiring 120, the common layer 165a, and the common layer 165b (FIG. 5D). Thus, the auxiliary wiring 120 is connected to the common electrode 113 in the connection portion 122.

As described above, the light-emitting layers 163 are formed for each color, and also each of the common layer 161 and the common layer 165 is formed in two steps, whereby the aperture ratio of the pixel can be increased as compared with the case where each of the common layers is formed in one step. Thus, even when the auxiliary wiring 120 is provided in the pixel portion of the display panel, the aperture ratio of the pixel in the display panel can be increased. Therefore, the luminance of a subpixel needed for obtaining a certain luminance in the display panel can be lowered, so that the lifetime of the light-emitting element can be increased. Since the width of the non-opening portion of the mask 155 can be sufficiently secured, sufficiently strong tension can be applied to the mask 155, which can improve the accuracy of the mask 155.

Note that all of the layers in the EL layer may be common layers shared by subpixels of a plurality of colors. The display panel can employ not only a separate coloring method but also a color filter method, for example.

Figure 7A:
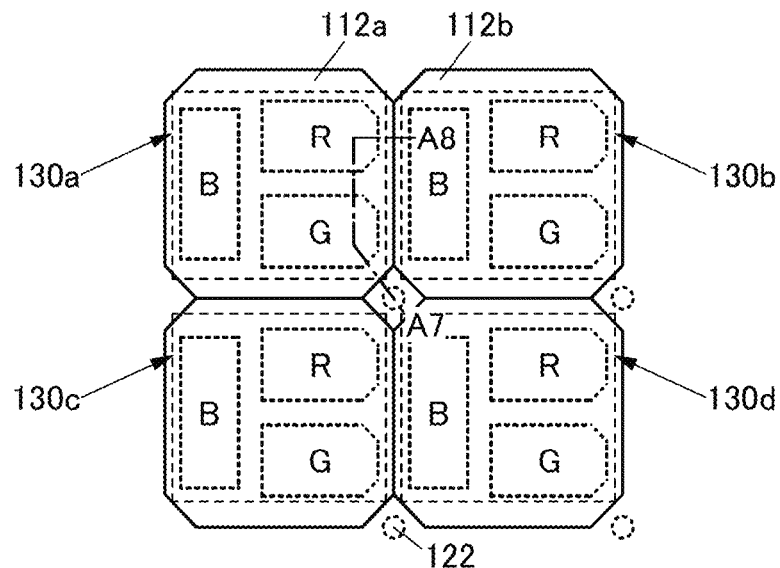
FIGS. 7A and 7C are top views illustrating examples of a display panel and FIG. 7B is a cross-sectional view illustrating an example of a display panel.
Figure 7B:
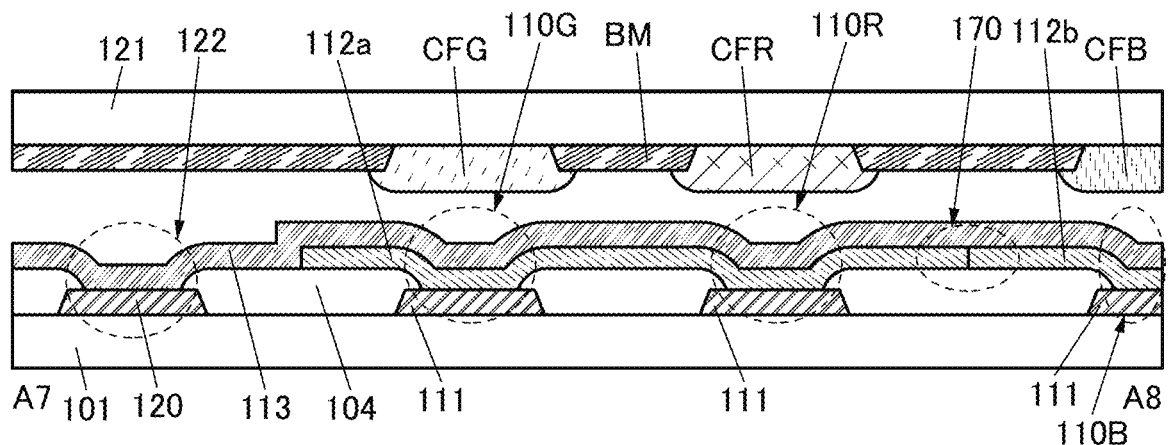

FIG. 7A is a top view of an EL layer 112a and an EL layer 112b included in the display panel. FIG. 7B is a cross-sectional view taken along the dashed-dotted line A7-A8 in FIG. 7A.

FIG. 7B is a cross-sectional view including a red subpixel (R) and a green subpixel (G) included in the pixel 130a and a blue subpixel (B) included in the pixel 130b which is adjacent to the pixel 130a as illustrated in FIG. 7A.

The display panel illustrated in FIG. 7B includes the pixel electrode 111 and the auxiliary wiring 120 over the insulating layer 101. The end portion of the pixel electrode 111 and the end portion of the auxiliary wiring 120 are covered with the insulating layer 104. The EL layer 112a or the EL layer 112b is provided over the pixel electrode 111 through an opening in the insulating layer 104. The common electrode 113 is provided over the auxiliary wiring 120, the EL layer 112a, and the EL layer 112b. In the connection portion 122, the auxiliary wiring 120 is in contact with the common electrode 113. That is, the auxiliary wiring 120 is electrically connected to the common electrode 113. The pixel electrode 111 overlaps with the common electrode 113 with the EL layer 112a or the EL layer 112b provided therebetween. A coloring layer CFR, a coloring layer CFG, a coloring layer CFB, a light-blocking layer BM, and the like are positioned on one surface side of a counter substrate 121. Examples of the counter substrate 121 include a hard substrate, a film substrate, and a polarizing plate.

In each of the pixels 130a and 130d, the red subpixel (R) includes the light-emitting element 110R illustrated in FIG. 7B. The light-emitting element 110R includes the pixel electrode 111, the EL layer 112a, and the common electrode 113. Light is extracted from the light-emitting element 110R to the counter substrate 121 side through the coloring layer CFR. In contrast, in each of the pixels 130b and 130c, the light-emitting element included in the red subpixel (R) does not include the EL layer 112a but includes the EL layer 112b.

In each of the pixels 130a and 130d, the green subpixel (G) includes the light-emitting element 110G illustrated in FIG. 7B. The light-emitting element 110G includes the pixel electrode 111, the EL layer 112a, and the common electrode 113. Light is extracted from the light-emitting element 110G to the counter substrate 121 side through the coloring layer CFG. In contrast, in each of the pixels 130b and 130c, the light-emitting element included in the green subpixel (G) does not include the EL layer 112a but includes the EL layer 112b.

In each of the pixels 130b and 130c, the blue subpixel (B) includes the light-emitting element 110B illustrated in FIG. 7B. The light-emitting element 110B includes the pixel electrode 111, the EL layer 112b, and the common electrode 113. Light is extracted from the light-emitting element 110B to the counter substrate 121 side through the coloring layer CFB. In contrast, in each of the pixels 130a and 130d, the light-emitting element included in the blue subpixel (B) does not include the EL layer 112b but includes the EL layer 112a.

The light-emitting element included in the subpixel of each color preferably emits white light.

In the region 170, the EL layer 112a is in contact with the EL layer 112b. As in the structures in FIGS. 2A to 2D, displacement of the mask or the like at the time of film formation may result in a portion where the EL layer 112a and the EL layer 112b overlap with each other and a portion where the EL layer 112a and the EL layer 112b are apart from each other.

Figure 7C:
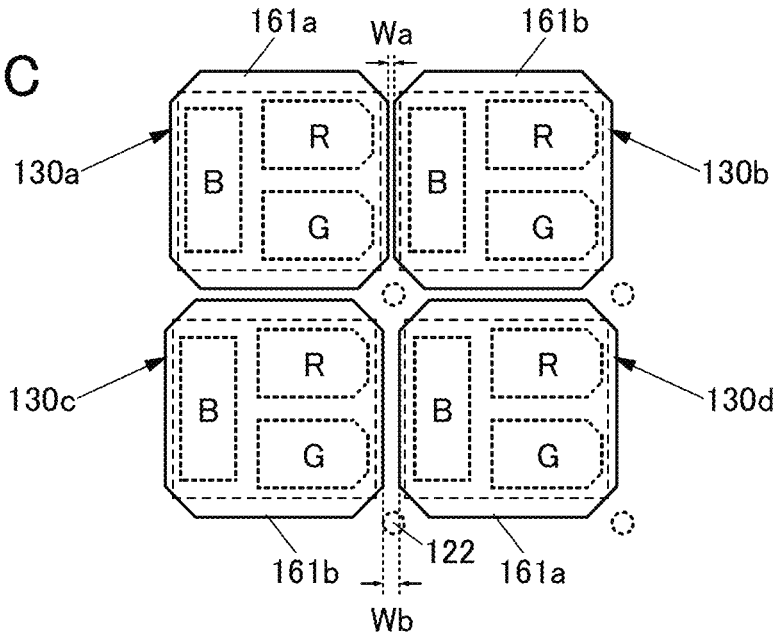

Furthermore, depending on the size of the opening in the mask 155, the common layer 161a and the common layer 161b are not in contact with each other in some cases. Even in such a case, whether the common layer 161 is formed in one step or in a plurality of steps can be determined in some cases. For example, some misalignment may occur between the common layer 161a formed in the first step and the common layer 161b formed in the second step. Thus, as illustrated in FIG. 7C, a distance Wa between the common layer 161a included in the pixel 130a and the common layer 161b included in the pixel 130b may be different from a distance Wb between the common layer 161a included in the pixel 130d and the common layer 161b included in the pixel 130c. When the common layers 161 are formed in two steps, the characteristic layout in which the pitch of the common layer 161 differs between columns or rows may be obtained. As described above, the pitches of the common layers 161 are different from each other, and thus it can be confirmed that the common layers 161 are formed in a plurality of steps.

Note that in the case where the EL layer includes a layer having high conductivity, current leaks to an adjacent light-emitting element through the layer having high conductivity, so that the light-emitting element other than a desired light-emitting element might emit light (this phenomenon is also referred to as crosstalk). Since the common layers 161 in FIG. 7C are separately provided for each pixel, crosstalk can be suppressed.

Figure 8A:
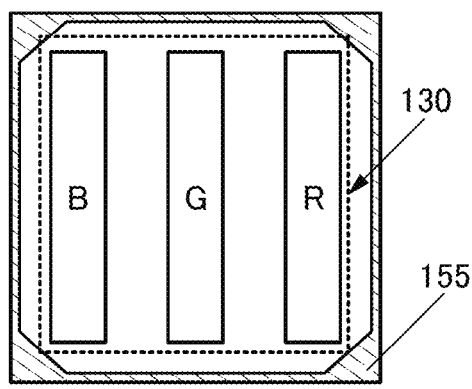
FIGS. 8A and 8B are top views illustrating examples of a pixel.
Figure 8B:
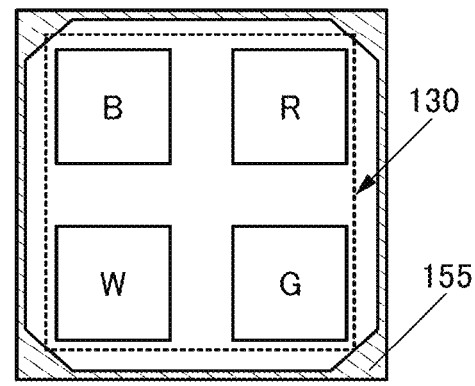

Although the alignment of the subpixels are not limited to the structure in FIG. 1A, the structure in FIG. 1A is preferable because the aperture ratio can be increased. FIGS. 8A and 8B illustrate alignment of subpixels which are different from that in FIG. 1A. FIG. 8A illustrates an example of stripe arrangement, and FIG. 8B illustrates an example of matrix arrangement. In addition to the above, S stripe arrangement, pentile arrangement, Bayer arrangement, or the like can be employed.

The coloring layer is a colored layer that transmits light in a specific wavelength range. For example, a color filter for transmitting light in a red, green, blue, or yellow wavelength range can be used. Examples of a material that can be used for the coloring layer include a metal material, a resin material, and a resin material containing a pigment or dye.

The light-blocking layer BM is provided between the adjacent coloring layers. The light-blocking layer BM blocks light emitted from an adjacent light-emitting element to inhibit color mixture between the adjacent light-emitting elements. Here, the coloring layer is provided such that its end portion overlaps with the light-blocking layer BM, whereby light leakage can be reduced. For the light-blocking layer BM, a material that can block light from the light-emitting element can be used; for example, a black matrix can be formed using a metal material or a resin material containing a pigment or dye. Note that it is preferable to provide the light-blocking layer BM in a region other than a pixel portion, such as a driver circuit, in which case undesired leakage of guided light or the like can be suppressed.

[Specific Example 2 of Display Panel]

Figure 10A:
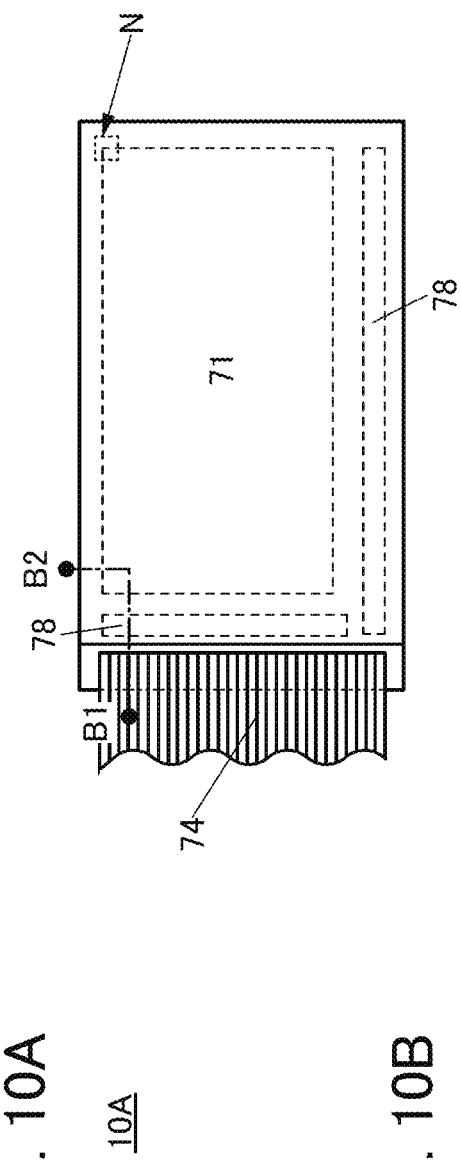
FIG. 10A is a top view illustrating an example of a display panel and FIG. 10B is a cross-sectional view illustrating an example of a display panel.
Figure 10B:
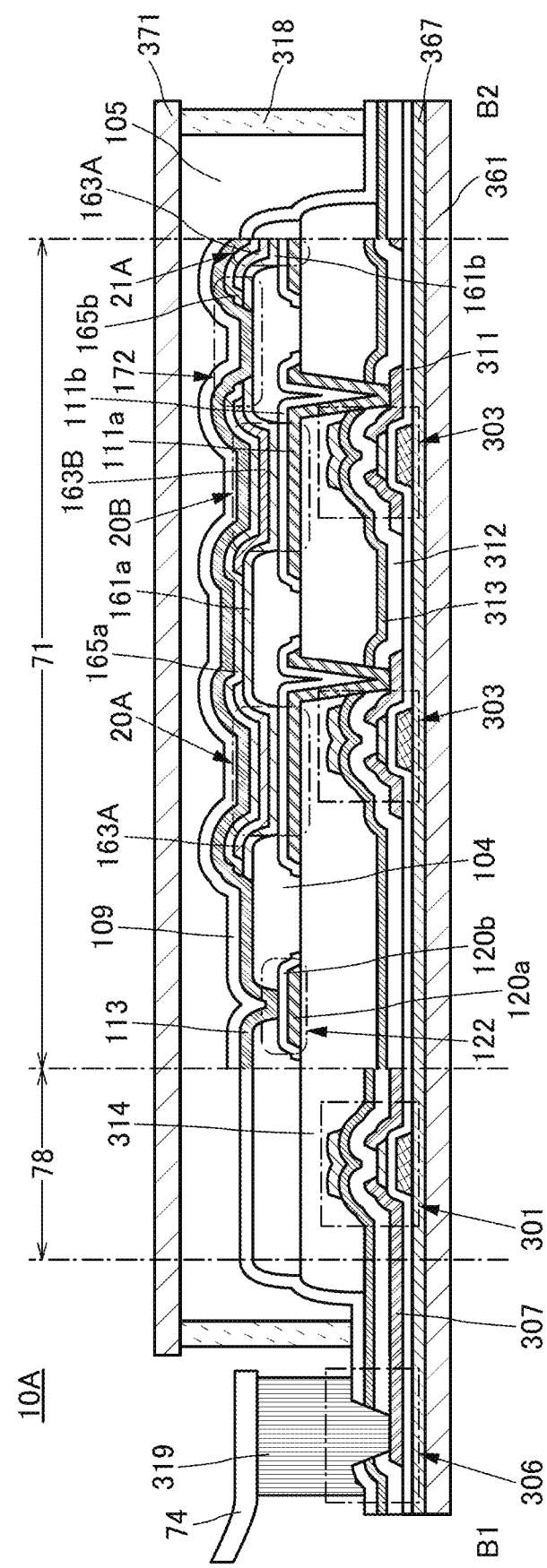

FIG. 10A is a top view of a display panel 10A. FIG. 10B is a cross-sectional view of the display panel 10A. FIG. 10B corresponds to a cross-sectional view taken along the dashed-dotted line B1-B2 in FIG. 10A.

The display panel 10A illustrated in FIG. 10A includes a pixel portion 71 and a driver circuit 78. An FPC 74 is connected to the display panel. A connector such as a flexible printed circuit (FPC) or an integrated circuit (IC) can be connected to the display panel. For example, a display module can be fabricated by incorporating a scan line driver circuit into a display panel and providing a signal line driver circuit externally.

The display panel 10A is a top-emission display panel employing a separate coloring method. Since the display panel 10A includes an auxiliary wiring, a voltage drop due to the resistance of the common electrode 113 can be suppressed and display unevenness can be reduced. Since the common layers included in the EL layer is formed in two steps, the display panel 10A has a high aperture ratio of a pixel even when the pixel portion 71 includes an auxiliary wiring.

As illustrated in FIG. 10B, the display panel 10A includes a substrate 361, an insulating layer 367, transistors 301 and 303, a conductive layer 307, an insulating layer 314, light-emitting elements 20A, 20B, and 21A, the insulating layer 104, a protective layer 109, auxiliary wirings 120a and 120b, a bonding layer 318, a substrate 371, and the like.

The light-emitting elements 20A, 20B, and 21A each include pixel electrodes 111a and 111b, an EL layer, and the common electrode 113.

The pixel electrode 111a is electrically connected to the source or the drain of the transistor 303. They are directly connected to each other or connected via another conductive layer.

The pixel electrode 111b included in each of the light-emitting elements 20A, 20B, and 21A functions as an optical adjustment layer. With the light-emitting element having a microcavity structure, light with high color purity can be extracted from the display panel. The structure of the pixel electrode is not limited to a stacked-layer structure and may be a single-layer structure.

The insulating layer 104 covers end portions of the pixel electrodes 111a and 111b. The two adjacent pixel electrodes are electrically insulated from each other by the insulating layer 104. The pixel electrode is also electrically isolated from the auxiliary wiring by the insulating layer 104.

The EL layer includes the common layer (the common layer 161 and the common layer 165 in FIG. 10B) which is shared by the subpixels of a plurality of colors and layers provided for each color (the light-emitting layers 163 in FIG. 10B). Here, the light-emitting element 20A illustrated in FIG. 10B is included in a pixel which also includes the light-emitting element 20B and is different from a pixel including the light-emitting element 21A. The pixel including the light-emitting element 21A is adjacent to the pixel including the light-emitting element 20A. The light-emitting elements 20A and 20B included in the same pixel each include the common layer 161a and the common layer 165a. The light-emitting element 21A included in the pixel adjacent to the pixel including these two light-emitting elements includes the common layer 161b and the common layer 165b. In the region 172, the common layer 161a and the common layer 161b are apart from each other, and similarly, the common layer 165a and the common layer 165b are apart from each other. The light-emitting elements 20A and 21A each include a light-emitting layer 163A, and the light-emitting element 20B includes the light-emitting layer 163B. That is, here, an example in which the subpixel including the light-emitting element 20A has the same color as the subpixel including the light-emitting element 21A and has a different color from that of the subpixel including the light-emitting element 20B is shown. An end portion of the EL layer is covered with the common electrode 113. The common electrode 113 covers the end portion of the EL layer and is in contact with the insulating layer 104 more on the outside than the end portion of the EL layer. Further, the common electrode 113 is in contact with the auxiliary wiring 120b in the connection portion 122.

The protective layer 109 covers an end portion of the common electrode 113 and is in contact with the insulating layer 104 more on the outside than the end portion of the common electrode 113. Moreover, the protective layer 109 covers an end portion of the insulating layer 314 and an end portion of the insulating layer 104 at and in the vicinity of an end portion of the display panel 10A and is in contact with an insulating layer 313 more on the outside than the end portion of the insulating layer 314 and the end portion of the insulating layer 104. In the display panel of this embodiment, the variety of insulating layers and the protective layer 109 are preferably provided so that an end portion of an inorganic film (or an inorganic insulating film) is positioned outward from an end portion of an organic film and inorganic films (or inorganic insulating films) are stacked in contact with each other at and in the vicinity of the end portion of the display panel. With such a structure, impurities such as moisture are less likely to enter the display panel from the outside of the display panel, whereby deterioration of the transistor and the light-emitting element can be suppressed.

The auxiliary wirings 120a and 120b are electrically connected to the common electrode 113 through the opening in the insulating layer 104. The auxiliary wiring 120a can be formed using the same material and the same step as those used for the pixel electrode 111a. The auxiliary wiring 120b can be formed using the same material and the same step as those used for the pixel electrode 111b.

Note that the auxiliary wiring of the common electrode 113 is not necessarily formed in the same fabrication step as the pixel electrode. For example, the auxiliary wiring can be formed using the same material and the same step as those used for the wirings included in the display panel, or at least one of the electrodes of the display panel. When the auxiliary wiring is formed in the same layer as another conductive layer included in the display panel, the auxiliary wiring can be provided for the display panel without increasing the number of fabrication steps of the display panel. In contrast, the auxiliary wiring is formed in a layer different from another conductive layer included in the display panel, whereby the auxiliary wiring can have a large area, so that a voltage drop due to the resistance of the common electrode 113 can be effectively suppressed.

Figure 11:
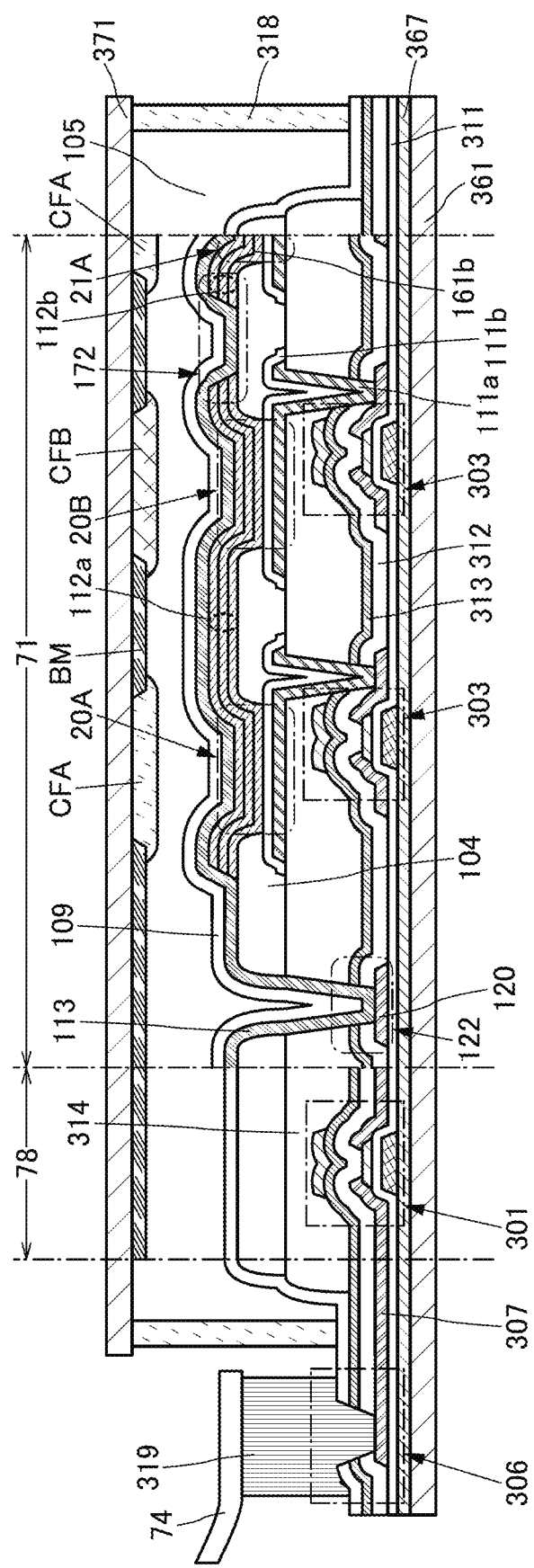
FIG. 11 is a cross-sectional view illustrating an example of a display panel.

FIG. 11 illustrates an example in which the auxiliary wiring 120 is formed using the same material and the same step as those used for the source and the drain of the transistor.

In FIG. 11, all of the layers included in the EL layer are each a common layer which is shared by the subpixels of a plurality of colors. The EL layer includes at least a light-emitting layer. The light-emitting element 20A is included in a pixel which also includes the light-emitting element 20B and is different from a pixel including the light-emitting element 21A. The pixel including the light-emitting element 21A is adjacent to the pixel including the light-emitting element 20A. The light-emitting elements 20A and 20B included in the same pixel each include the EL layer 112a. The light-emitting element 21A included in the pixel adjacent to the pixel including these two light-emitting elements includes the EL layer 112b. In the region 172, the EL layer 112a and the EL layer 112b are apart from each other. An end portion of the EL layer is covered with the common electrode 113. The common electrode 113 covers the end portion of the EL layer and is in contact with the insulating layer 104 more on the outside than the end portion of the EL layer. Further, the common electrode 113 is in contact with the auxiliary wiring 120 in the connection portion 122. Although the EL layer 112a and the EL layer 112b have a three-layer structure in FIG. 11, there is no limitation on the number of EL layers. A coloring layer CFA, the coloring layer CFB, the light-blocking layer BM, and the like are positioned on one surface side of the substrate 371. The light-emitting element 20A and the light-emitting element 21A each overlap with the coloring layer CFA. That is, here, an example in which the subpixel including the light-emitting element 20A and the subpixel including the light-emitting element 21A exhibit the same color is shown. The light-emitting element 20B overlaps with the coloring layer CFB. That is, here, an example in which the subpixel including the light-emitting element 20A and the subpixel including the light-emitting element 20B exhibit different colors is shown.

For the light-emitting element and the auxiliary wiring, the description in Specific example 1 of display panel can be referred to.

The display panel preferably includes the protective layer 109 covering the light-emitting element. When a film with a high barrier property is used for the protective layer 109, entry of impurities such as moisture and oxygen into the light-emitting element can be suppressed. Thus, deterioration of the light-emitting element can be suppressed and the reliability of the display panel can be improved.

Since light from the light-emitting element is extracted to the outside of the display panel through the protective layer 109, the protective layer 109 preferably has a high visible-light-transmitting property.

The protective layer 109 preferably includes an inorganic film (or an inorganic insulating film). When the light-emitting element is surrounded by the inorganic film, entry of impurities such as moisture and oxygen from the outside into the light-emitting element can be suppressed. The reaction between impurities and an organic compound or a metal material contained in the light-emitting element might cause deterioration of the light-emitting element. Therefore, deterioration of the light-emitting element is suppressed by employing the structure with which impurities are less likely to enter the light-emitting element, whereby the reliability of the light-emitting element can be improved.

The inorganic film (or the inorganic insulating film) preferably has high moisture resistance through which water is less likely to be diffused and transmitted. The inorganic film (or the inorganic insulating film) through which one or both of hydrogen and oxygen are less likely to be diffused and transmitted is further preferable. Thus, the inorganic film (or the inorganic insulating film) can function as a barrier film. Diffusion of impurities from the outside into the light-emitting element can be effectively suppressed, which enables the fabrication of a highly reliable display panel.

The protective layer 109 preferably includes one or more insulating films. For the protective layer 109, an oxide insulating film, a nitride insulating film, an oxynitride insulating film, a nitride oxide insulating film, or the like can be used. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film. Examples of the nitride oxide insulating film include a silicon nitride oxide film.

Note that in this specification and the like, oxynitride refers to a material that contains more oxygen than nitrogen, and nitride oxide refers to a material that contains more nitrogen than oxygen.

In particular, a silicon nitride film, a silicon nitride oxide film, and an aluminum oxide film are suitably used for the protective layer 109 because those films each have high moisture resistance.

An inorganic film containing ITO, Ga—Zn oxide, Al—Zn oxide, In—Ga—Zn oxide, or the like can be used for the protective layer 109. The inorganic film preferably has high resistance, specifically, higher resistance than the common electrode 113. The inorganic film may further contain nitrogen.

The protective layer 109 can be formed by a CVD method, a sputtering method, an ALD method, or the like. The protective layer 109 may have a stacked-layer structure including two or more insulating films formed by different deposition methods.

A sputtering method and an ALD method are capable of forming a film at a low temperature. An EL layer included in a light-emitting element has low heat resistance. Therefore, the protective layer 109 formed after the fabrication of the light-emitting element is preferably formed at a relatively low temperature, typically a temperature of lower than or equal to 100° C., and a sputtering method and an ALD method are suitable.

The thickness of the inorganic film formed by a sputtering method is preferably greater than or equal to 50 nm and less than or equal to 1000 nm, further preferably greater than or equal to 100 nm and less than or equal to 300 nm.

The thickness of the inorganic film formed by an ALD method is preferably greater than or equal to 1 nm and less than or equal to 100 nm, further preferably greater than or equal to 5 nm and less than or equal to 50 nm.

The water vapor transmission rate of the protective layer 109 is lower than $1\times10^{-2}$ g/(m²·day), preferably lower than or equal to $5\times10^{-3}$ g/(m²·day), further preferably lower than or equal to $1\times10^{-4}$ g/(m²·day), still further preferably lower than or equal to $1\times10^{-5}$ g/(m²·day), yet further preferably lower than or equal to $1\times10^{-6}$ g/(m²·day). The lower the water vapor transmission rate is, the more diffusion of water from the outside into the transistor and the light-emitting element can be reduced.

The thickness of the protective layer 109 is greater than or equal to 1 nm and less than or equal to 1000 nm, preferably greater than or equal to 50 nm and less than or equal to 500 nm, further preferably greater than or equal to 100 nm and less than or equal to 300 nm. The thickness of the insulating layer is preferably small because the thinner the insulating layer is, the thinner the whole display panel can be. The thinner the insulating layer is, the more throughput is improved, so that the productivity of the display panel can be improved.

Examples of an organic insulating material that can be used for the insulating layer 104 include an acrylic resin, an epoxy resin, a polyimide resin, a polyamide resin, a polyimide-amide resin, a polysiloxane resin, a benzocyclobutene-based resin, and a phenol resin. Instead of the insulating layer 104, an inorganic insulating layer may be used. An inorganic insulating film that can be used for the protective layer 109 can be used for the inorganic insulating layer.

When an inorganic insulating film is used for an insulating layer covering an end portion of the pixel electrode, impurities are less likely to enter the light-emitting element as compared with the case where an organic insulating film is used; therefore, the reliability of the light-emitting element can be improved. When an organic insulating film is used for the insulating layer covering the end portion of the pixel electrode, a short circuit in the light-emitting element can be prevented because the organic insulating film has higher step coverage and is less likely to be influenced by the shape of the pixel electrode than the inorganic insulating film.

Note that the insulating layer 104 and the protective layer 109 can each have a single-layer structure or a stacked-layer structure including one or both of an inorganic insulating film and an organic insulating film.

The substrate 361 and the substrate 371 are bonded to each other with a bonding layer 318. A space 105 formed by the substrates 361 and 371 and the bonding layer 318 is preferably filled with a resin or an inert gas such as nitrogen or argon.

For the substrates 361 and 371, a material such as glass, quartz, a resin, a metal, an alloy, or a semiconductor can be used. The substrate on the side from which light from the light-emitting element is extracted is formed using a material which transmits the light. A flexible substrate is preferably used as each of the substrates 361 and 371. Furthermore, a polarizing plate may be used as the substrate 361 or the substrate 371.

In the case where a circularly polarizing plate overlaps with the display panel, a highly optically isotropic substrate is preferably used as the substrate included in the display panel. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

For the bonding layer, various curable adhesives such as a photocurable adhesive (e.g., an ultraviolet curable adhesive), a reactive curable adhesive, a thermosetting adhesive, and an anaerobic adhesive can be used. Alternatively, an adhesive sheet or the like may be used.

The driver circuit 78 includes the transistor 301. The pixel portion 71 includes the transistor 303.

Each transistor includes a gate, a gate insulating layer 311, a semiconductor layer, a back gate, a source, and a drain. The gate (the lower gate in FIG. 10B and FIG. 11) and the semiconductor layer overlap with each other with the gate insulating layer 311 positioned therebetween. The back gate (the upper gate in FIG. 10B and FIG. 11) and the semiconductor layer overlap with each other with an insulating layer 312 and the insulating layer 313 positioned therebetween.

The structure in which the semiconductor layer where a channel is formed is provided between two gates is used in each of the transistors 301 and 303. It is preferable that the two gates be connected to each other and supplied with the same signal to operate the transistor. Such a transistor can have higher field-effect mobility and thus have higher on-state current than other transistors. Consequently, a circuit capable of high-speed operation can be obtained.

Furthermore, the area occupied by a circuit portion can be reduced. The use of the transistor having high on-state current can reduce signal delay in wirings and can suppress display unevenness even in a display panel or a display device in which the number of wirings is increased because of an increase in size or resolution. Alternatively, by supplying a potential for controlling the threshold voltage to one of the two gates and a potential for driving to the other, the threshold voltage of the transistor can be controlled.

The structure of the transistor may be different between the driver circuit 78 and the pixel portion 71. The driver circuit 78 and the pixel portion 71 may each include a plurality of kinds of transistors.

The transistor, the capacitor, the wiring, and the like are provided to overlap with a light-emitting region of the light-emitting element, whereby the aperture ratio of the pixel portion 71 can be increased.

A material through which impurities such as water and hydrogen are less likely to be diffused is preferably used for at least one of the insulating layers 312, 313, and 314. Diffusion of impurities from the outside into the transistor can be effectively suppressed, leading to improved reliability of the display panel. The insulating layer 314 functions as a planarization layer.

The insulating layer 367 functions as a base film. A material through which impurities such as water and hydrogen are less likely to be diffused is preferably used for the insulating layer 367.

A connection portion 306 includes the conductive layer 307. The conductive layer 307 can be formed using the same material and the same step as those used for the source and the drain of the transistor. The conductive layer 307 is electrically connected to an external input terminal through which a signal or a potential from the outside is transmitted to the driver circuit 78. Here, an example in which the FPC 74 is provided as an external input terminal is shown. The FPC 74 and the conductive layer 307 are electrically connected to each other through a connector 319.

As the connector 319, any of various anisotropic conductive films (ACF), anisotropic conductive pastes (ACP), and the like can be used.

[Specific Example of Display Device]

Next, a display device including a plurality of display panels is described with reference to FIGS. 12A to 12C.

Figure 12A:
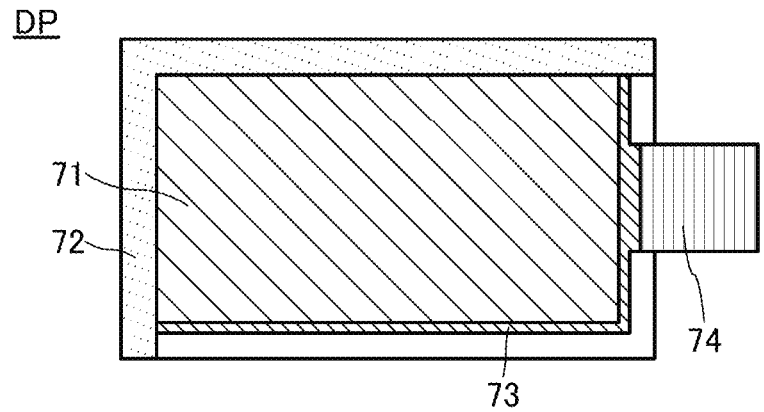
FIG. 12A is a top view illustrating an example of a display panel and FIGS. 12B and 12C are perspective views illustrating an arrangement example of a display panel.
Figure 12B:
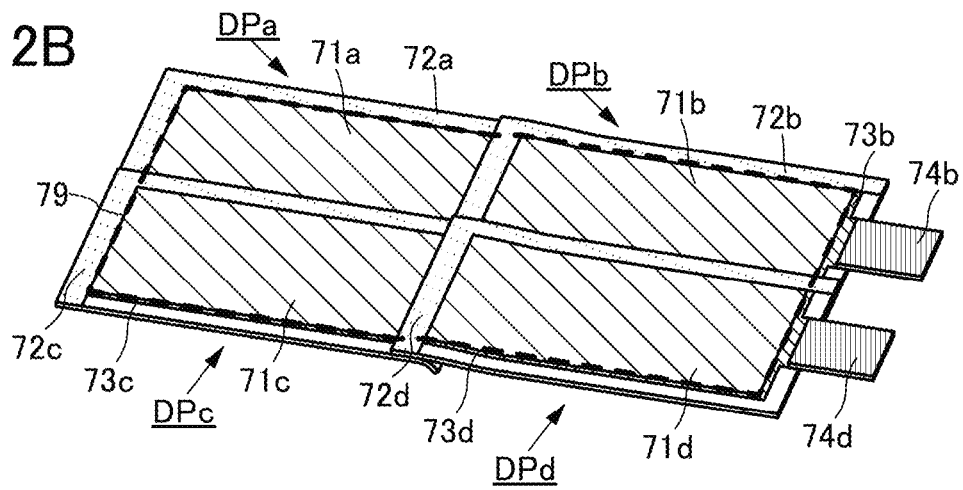
Figure 12C:
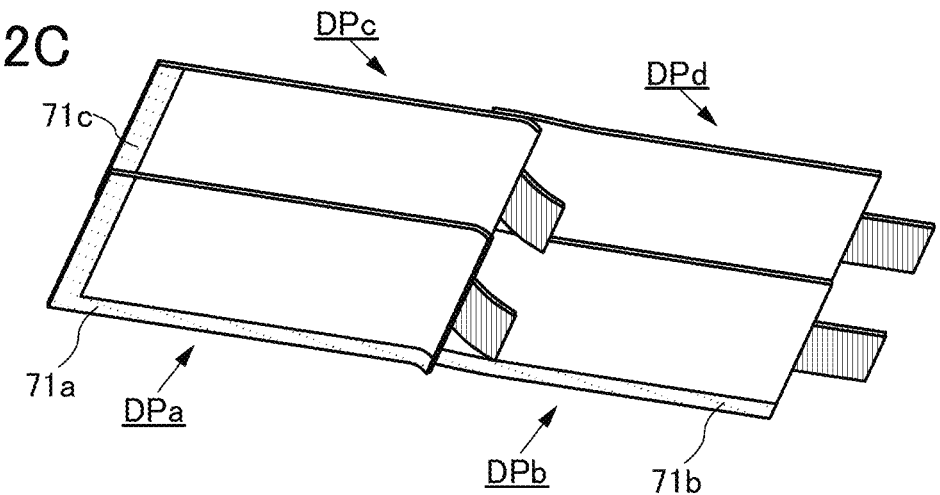

FIG. 12A is a top view of a display panel DP and FIGS. 12B and 12C are perspective views of a display device including four display panels DP.

When a plurality of display panels DP are arranged in one or more directions (e.g., in one column or in matrix), a display device with a large display region can be manufactured.

In the case where a large display device is manufactured using a plurality of display panels DP, each of the display panels DP is not required to be large. Thus, an apparatus for manufacturing the display panel DP is not necessarily large, whereby space-saving can be achieved. In addition, since an apparatus for manufacturing small- and medium-size display panels can be used, there is no need to use a novel manufacturing apparatus for increasing the size of the display device, which leads to a reduction in manufacturing cost. In addition, a decrease in yield caused by an increase in the size of the display panel DP can be suppressed.

A display portion including a plurality of display panels DP has a larger display region than a display portion including one display panel DP when the display panels DP have the same size, and has an effect of displaying more information at a time, for example.

Here, the case where the display panel DP has a non-display region that surrounds the pixel portion 71 is considered. At this time, for example, if output images of a plurality of display panels DP are used to display one image, the image appears divided to a user of the display device.

Making the non-display regions of the display panels DP small (using the display panels DP with narrow frames) can inhibit an image displayed on the display panels DP from appearing divided; however, it is difficult to totally remove the non-display regions of the display panels DP.

A small non-display region of the display panel DP leads to a decrease in the distance between an end portion of the display panel DP and an element in the display panel DP, in which case the element easily deteriorates by impurities from the outside of the display panel DP in some cases.

Thus, in one embodiment of the present invention, a plurality of display panels DP are arranged to partly overlap with one another. In two display panels DP overlapping with each other, at least the display panel DP on the display surface side (upper side) includes a visible-light-transmitting region 72 that is adjacent to the pixel portion 71. In one embodiment of the present invention, the pixel portion 71 of the display panel DP on the lower side and the visible-light-transmitting region 72 of the display panel DP on the upper side overlap with each other.

Therefore, a non-display region between the pixel portions 71 of the overlapping two display panels DP can be reduced or even removed. As a result, a large-sized display device in which a joint portion of the display panels DP is hardly seen by the user can be obtained.

At least part of a non-display region of the display panel DP on the upper side is the visible-light-transmitting region 72, and can overlap with the pixel portion 71 of the display panel DP on the lower side. Furthermore, at least part of a non-display region of the display panel DP on the lower side can overlap with the pixel portion 71 of the display panel DP on the upper side or a visible-light-blocking region 73 thereof. It is not necessary to reduce the areas of these non-display regions because a reduction in the area of the frame of the display device (a reduction in area except a pixel portion) is not affected by these regions.

A large non-display region of the display panel DP leads to an increase in the distance between the end portion of the display panel DP and an element in the display panel DP, in which case the deterioration of the element due to impurities from the outside of the display panel DP can be suppressed. For example, in the case where an organic EL element is used as a display element, impurities such as moisture and oxygen are less likely to enter (or less likely to reach) the organic EL element from the outside of the display panel DP as the distance between the end portion of the display panel DP and the organic EL element increases. Since a sufficient area of the non-display region of the display panel DP is secured in the display device of one embodiment of the present invention, the highly reliable large display device can be fabricated even when the display panel DP including an organic EL element or the like is used.

As described above, when a plurality of display panels DP are provided in the display device, the plurality of display panels DP are preferably arranged so that the pixel portions 71 are arranged continuously between the adjacent display panels DP.

The display panel DP illustrated in FIG. 12A includes a pixel portion 71, a visible light-transmitting region 72, and a visible light-blocking region 73. The visible-light-transmitting region 72 and the visible-light-blocking region 73 are each provided adjacent to the pixel portion 71. FIG. 12A shows an example in which the display panel DP is provided with the FPC 74.

The pixel portion 71 includes a plurality of pixels. The visible-light-transmitting region 72 may include a pair of substrates forming the display panel DP, a sealant for sealing the display element sandwiched between the pair of substrates, and the like. Here, for members provided in the visible-light-transmitting region 72, visible-light-transmitting materials are used. In the visible-light-blocking region 73, for example, a wiring electrically connected to the pixel in the pixel portion 71 may be provided. Moreover, one or both of a scan line driver circuit and a signal line driver circuit may be provided for the visible-light-blocking region 73. Furthermore, a terminal connected to the FPC 74, a wiring connected to the terminal, and the like may be provided for the visible-light-blocking region 73.

FIGS. 12B and 12C show an example in which the display panels DP illustrated in FIG. 12A are arranged in a 2×2 matrix (two display panels DP are arranged in the longitudinal direction and the lateral direction). FIG. 12B is a perspective view of the display surface side of the display panel DP, and FIG. 12C is a perspective view of the side opposite to the display surface side of the display panel DP.

Four display panels DP (display panels DPa, DPb, DPc, and DPd) are arranged so as to have regions overlapping with each other. Specifically, the display panels DPa, DPb, DPc, and DPd are arranged so that the visible-light-transmitting region 72 of one display panel DP has a region overlapping with the top surface (the display surface side) of the pixel portion 71 of another display panel DP and the visible-light-blocking region 73 of one display panel DP does not overlap with the top surface of the pixel portion 71 of another display panel DP. In a portion where the four display panels DP overlap with each other, the display panels DPb, DPc, and DPd overlap with the top surface of the display panel DPa, the top surface of the display panel DPb, and the top surface of the display panel DPc, respectively.

The short side of the display panel DPa and the short side of the display panel DPb overlap with each other, and part of a pixel portion 71a and part of a visible-light-transmitting region 72b overlap with each other. Furthermore, the long side of the display panel DPa and the long side of the display panel DPc overlap with each other, and part of the pixel portion 71a and part of a visible-light-transmitting region 72c overlap with each other.

Part of a pixel portion 71b overlap with part of the visible-light-transmitting region 72c and part of a visible-light-transmitting region 72d. In addition, part of a pixel portion 71c overlaps with part of the visible-light-transmitting region 72d.

Therefore, a region where the pixel portions 71a to 71d are placed almost seamlessly can be a display region 79 of the display device.

Here, it is preferable that the display panel DP have flexibility. For example, the pair of substrates forming the display panel DP preferably has flexibility.

Thus, as illustrated in FIGS. 12B and 12C, a region near an FPC 74a of the display panel DPa can be bent so that part of the display panel DPa and part of the FPC 74a can be placed under the pixel portion 71b of the display panel DPb adjacent to the FPC 74a. As a result, the FPC 74a can be placed without physical interference with the rear surface of the display panel DPb. Furthermore, when the display panel DPa and the display panel DPb overlap with each other and are fixed, it is not necessary to consider the thickness of the FPC 74a; thus, the top surface of the visible-light-transmitting region 72b and the top surface of the display panel DPa can be substantially leveled. This can make an end portion of the display panel DPb over the pixel portion 71a less noticeable.

Moreover, each display panel DP has flexibility, whereby the display panel DPb can be curved gently so that the top surface of the pixel portion 71b of the display panel DPb and the top surface of the pixel portion 71a of the display panel DPa are equal to each other in height. Thus, the heights of the display regions can be equal to each other except in the vicinity of the region where the display panel DPa and the display panel DPb overlap with each other, so that the display quality of a picture displayed on the display region 79 can be improved.

Although the relation between the display panel DPa and the display panel DPb is taken as an example in the above description, the same can apply to the relation between any other two adjacent display panels DP.

To reduce the step between two adjacent display panels DP, the thickness of the display panel DP is preferably small. For example, the thickness of the display panel DP is preferably less than or equal to 1 mm, further preferably less than or equal to 300 µm, still further preferably less than or equal to 100 µm.

[Specific Example 3 of Display Panel]

Figure 13A:
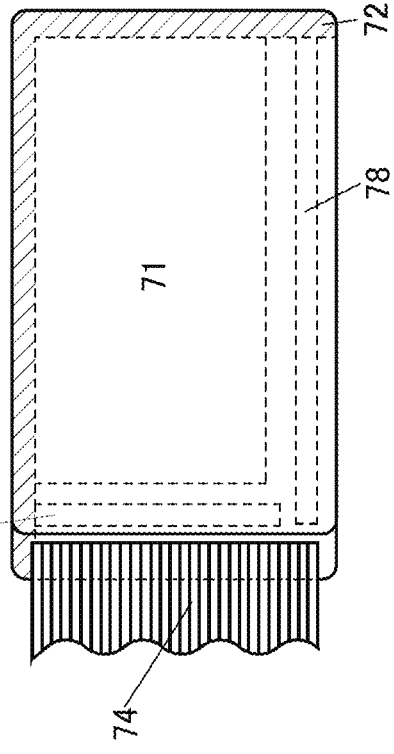
FIGS. 13A and 13B are top views illustrating examples of a display panel and FIG. 13C is a cross-sectional view illustrating an example of a display panel.
Figure 13B:
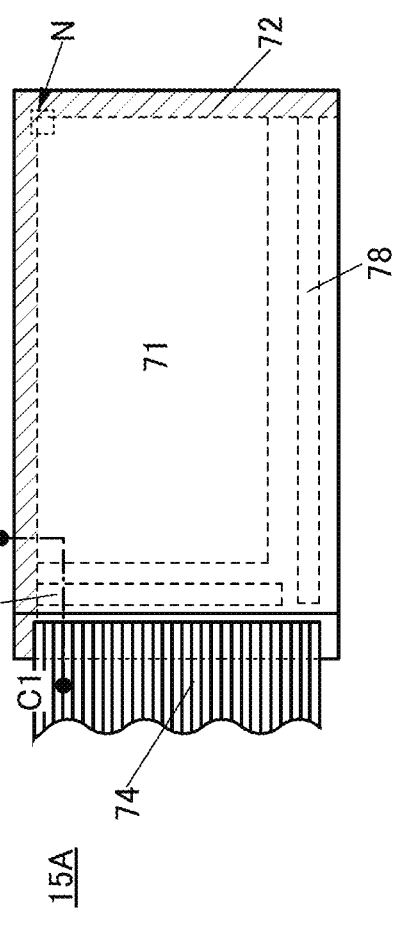
Figure 13C:
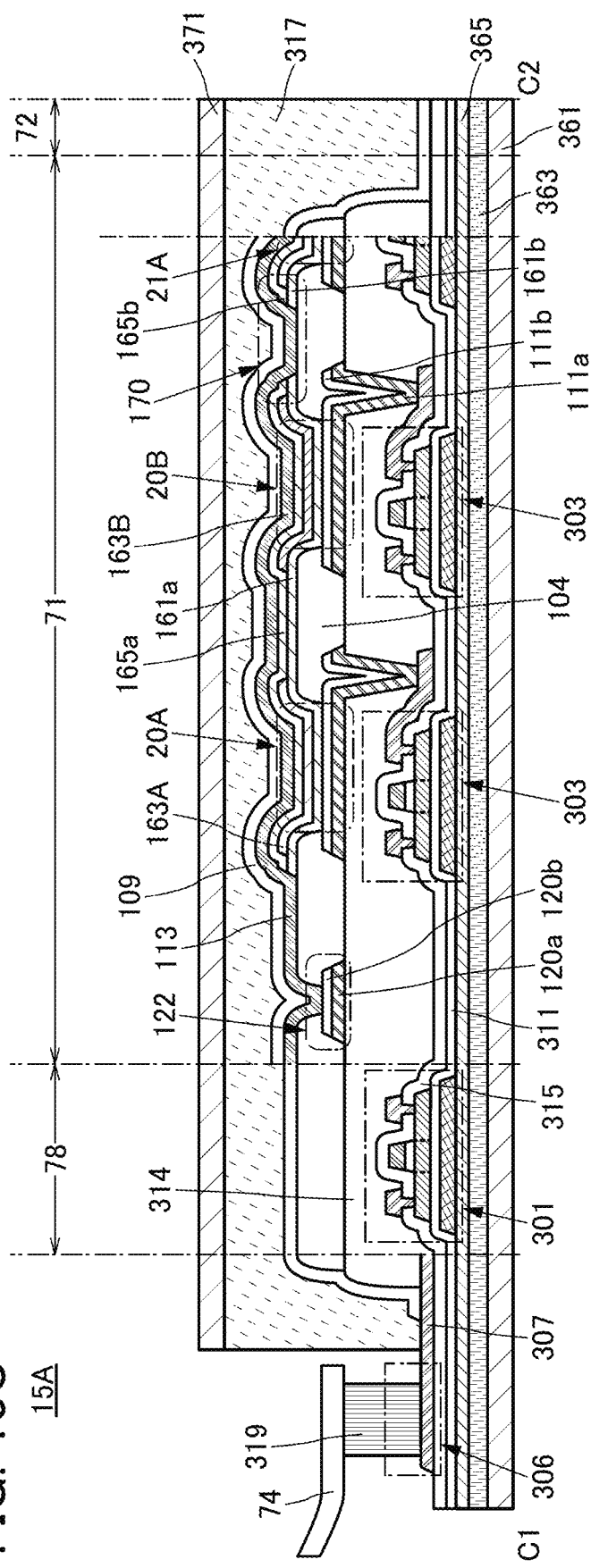

FIGS. 13A and 13B are top views of display panels 15A. FIG. 13C is a cross-sectional view taken along the dashed-dotted line C1-C2 in FIG. 13A.

The display panels illustrated in FIGS. 13A and 13B each include the pixel portion 71, the visible-light-transmitting region 72, and the driver circuit 78. An FPC 74 is connected to the display panel. FIGS. 13A and 13B each illustrate an example in which the visible-light-transmitting region 72 is adjacent to the pixel portion 71 and provided along two sides of the pixel portion 71.

The display panel illustrated in FIG. 13A has a sharp corner and the display panel illustrated in FIG. 13B has a rounded corner. A display panel using a film substrate can be fabricated to have various top surface shapes. For example, a display panel with a corner having a curvature is easily fabricated in some cases because the display panel is less likely to be cracked when the display panel is divided.

The display panel 15A is a top-emission display panel employing a separate coloring method. The display panel 15A includes the visible-light-transmitting region 72 along two sides. Since the lead wiring of the common electrode 113 cannot be provided in the visible-light-transmitting region 72, the influence of a voltage drop becomes more significant. When the display device illustrated in FIGS. 12A to 12C is fabricated using a plurality of display panels 15A and a voltage drop occurs, discontinuous luminance between adjacent display panels is easily recognized as luminance unevenness of the whole display device. However, since the display panel 15A includes the auxiliary wiring, a voltage drop due to the resistance of the common electrode 113 can be suppressed to reduce display unevenness. Since the common layer included in the EL layer is formed in two steps, the aperture ratio of a pixel in the display panel 15A is high even when the pixel portion 71 includes an auxiliary wiring.

As illustrated in FIG. 13C, the display panel 15A includes the substrate 361, a bonding layer 363, an insulating layer 365, the transistors 301 and 303, the conductive layer 307, the insulating layer 314, the light-emitting elements 20A, 20B, and 21A, the insulating layer 104, the protective layer 109, the auxiliary wirings 120a and 120b, a bonding layer 317, the substrate 371, and the like.

The substrate 361 and the substrate 371 are bonded to each other with the bonding layer 317. The substrate 361 and the insulating layer 365 are bonded to each other with the bonding layer 363.

In the fabrication of the display panel 15A, the transistor, the light-emitting element, and the like formed over a formation substrate are transferred to the substrate 361.

The light-emitting elements 20A, 20B, and 21A each include the pixel electrodes 111a and 111b, an EL layer, and the common electrode 113.

The pixel electrode 111a is electrically connected to the source or the drain of the transistor 303. They are directly connected to each other or connected via another conductive layer.

The pixel electrode 111b included in each of the light-emitting elements 20A, 20B, and 21A functions as an optical adjustment layer. FIG. 10B and the like each illustrate an example in which the pixel electrode 111b covers the pixel electrode 111a; however, as illustrated in FIG. 13C, the pixel electrode 111b does not necessarily cover the side surface of the pixel electrode 111a.

The driver circuit 78 includes the transistor 301. The pixel portion 71 includes the transistor 303.

Each transistor includes a back gate, the gate insulating layer 311, a semiconductor layer, a gate insulating layer, a gate, an insulating layer 315, a source, and a drain. The semiconductor layer includes a channel formation region and a pair of low-resistance regions. The back gate (the lower gate in FIG. 13C) and the channel formation region overlap with each other with the gate insulating layer 311 positioned therebetween. The gate (the upper gate in FIG. 13C) and the channel formation region overlap with each other with the gate insulating layer positioned therebetween. The source and the drain are electrically connected to the low-resistance regions through openings provided in the insulating layer 315.

The above description of the display panel 10A (FIG. 10B) can be referred to for the structures of the pixel portion 71, the driver circuit 78, and the connection portion 306 of the display panel 15A illustrated in FIG. 13C because the structures are in common with those in the display panel 10A in many points.

The layers included in the visible-light-transmitting region 72 transmit visible light. FIG. 13C illustrates an example in which the visible-light-transmitting region 72 includes the substrate 361, the bonding layer 363, the insulating layer 365, the gate insulating layer 311, the insulating layer 315, the protective layer 109, the bonding layer 317, and the substrate 371. In this stacked-layer structure, the materials for the layers are preferably selected such that a difference in refractive index at each interface is minimized. A difference in refractive index between two layers that are in contact with each other is reduced, so that a junction between the two display panels cannot be easily recognized by a user.

It is preferable that the number of insulating layers in the visible-light-transmitting region 72 be smaller than that in a region of the pixel portion 71 in the vicinity of the visible-light-transmitting region 72. The number of insulating layers included in the visible-light-transmitting region 72 is reduced, and thus the number of interfaces at which a difference in refractive index is large can be reduced. Thus, the reflection of external light in the visible-light-transmitting region 72 can be suppressed. In this case, the visible light transmittance in the visible-light-transmitting region 72 can be increased. Thus, the difference in the luminance (brightness) of display on the display panel on the lower side between a portion seen through the visible-light-transmitting region 72 and a portion seen not through the region can be small. Accordingly, the display unevenness or luminance unevenness of the display device can be suppressed.

Figure 14:
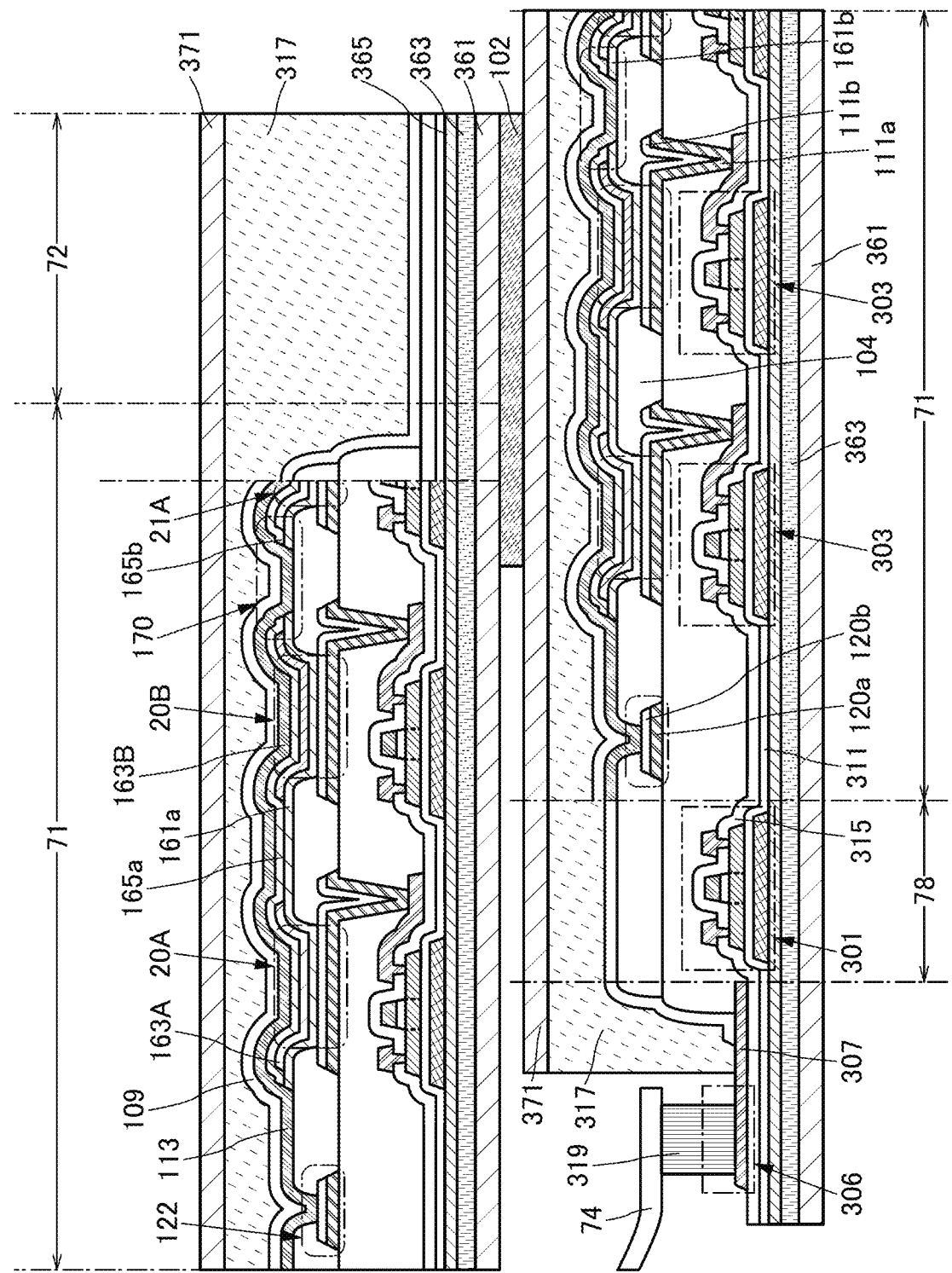
FIG. 14 is a cross-sectional view illustrating an example of a display device.

FIG. 14 illustrates an example of a cross-sectional view of a display device in which two display panels 15A illustrated in FIG. 13C overlap with each other.

In the display device illustrated in FIG. 14, the display panel positioned on the display surface side (upper side) includes the visible-light-transmitting region 72 adjacent to the pixel portion 71. The pixel portion 71 of the lower display panel and the visible-light-transmitting region 72 of the upper display panel overlap with each other. The visible-light-blocking region of the lower display panel (e.g., the driver circuit 78 and the connection portion 306) overlaps with the pixel portion 71 of the upper display panel. Therefore, a non-display region between the pixel portions of the overlapping two display panels can be reduced or even removed. Accordingly, a large display device in which a junction between display panels is less likely to be noticed by a user can be obtained.

The display device illustrated in FIG. 14 includes a light-transmitting layer 102 having a refractive index higher than that of air and transmitting visible light between the pixel portion 71 of the lower display panel and the visible-light-transmitting region 72 of the upper display panel. Thus, air can be suppressed from entering between the two display panels, so that the interface reflection due to a difference in refractive index can be reduced. In addition, display unevenness or luminance unevenness of the display device can be suppressed.

Next, a structure of the common layer in a region N in FIG. 13A is described with reference to FIGS. 15A to 15D. Here, the case where the common layers 161a and 161b are formed using one mask 155 is described.

Figure 15A:
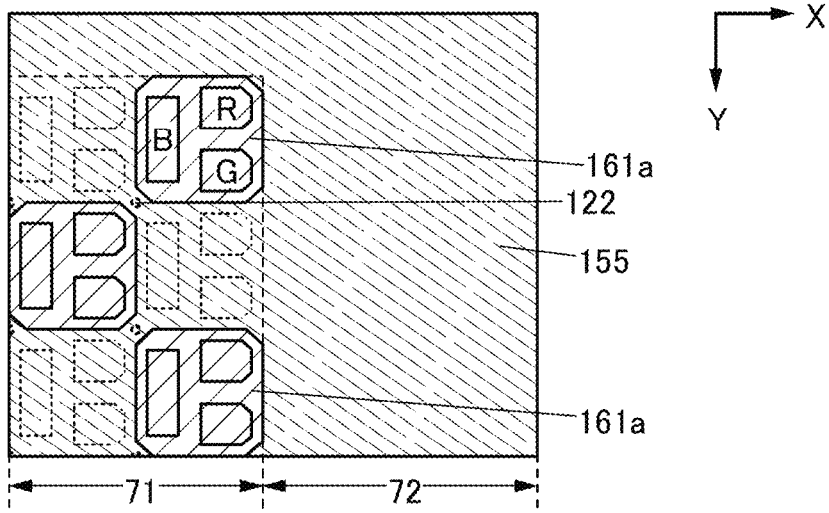
FIGS. 15A to 15D are top views illustrating an example of a display panel.
Figure 15B:
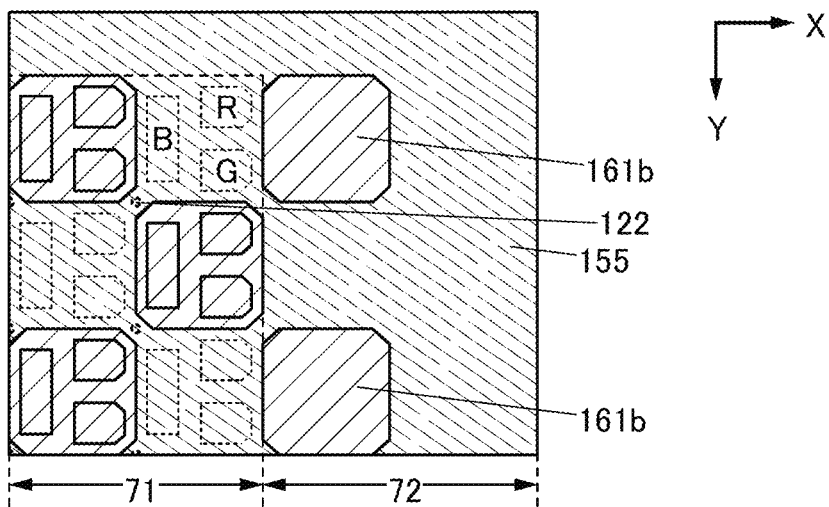
Figure 15C:
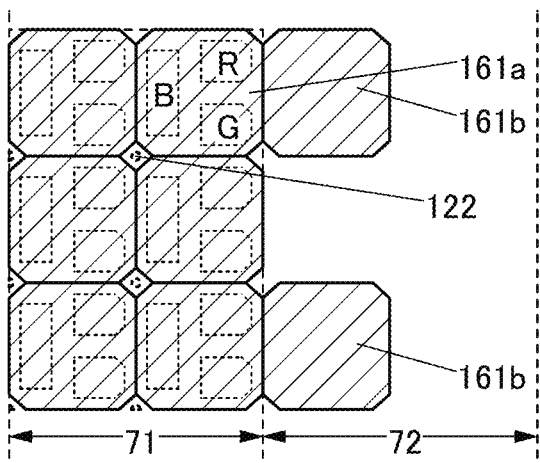
Figure 15D:
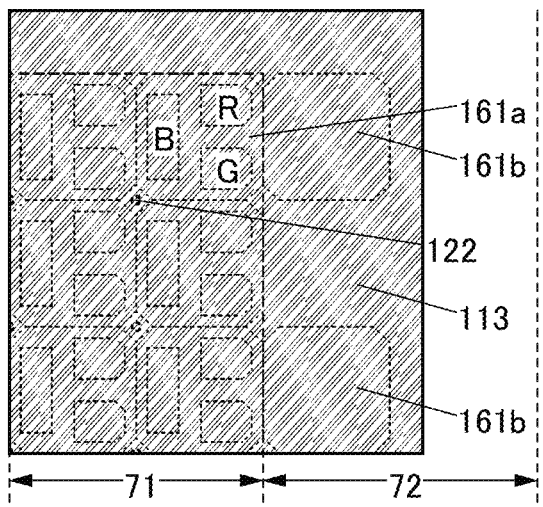

After the common layer 161a is formed using the mask 155 as illustrated in FIG. 15A, the mask 155 is shifted in the X direction or the Y direction by one pixel, whereby the common layer 161b can also be formed using the same mask 155. FIG. 15B shows the case where the mask 155 is shifted in the X direction by one pixel, and the common layer 161b is formed. Here, as illustrated in FIG. 15B, the common layer 161b is formed also in the visible-light-transmitting region 72 in the Y direction per pixel. FIG. 15C is a top view of the common layers 161a and 161b. In this case, as illustrated in FIG. 15D, it is preferable that the common electrode 113 cover the common layer 161b formed in the visible-light-transmitting region 72 and the end portion of the common electrode 113 be positioned outward from the end portion of the common layer 161b. In particular, the end portion of the common electrode 113 is preferably in contact with an inorganic film. This can suppress entry of impurities into the common layer 161b in the visible-light-transmitting region 72.

Note that the above structure can be used not only in the region N in FIG. 13A but also in the region N in FIG. 10A. In other words, when the common layer 161a and the common layer 161b are formed using one mask, the common layers 161a or the common layers 161b are provided outside the pixel portion 71 of the display panel with substantially the same pitches. This can also be a feature obtained by forming the common layer 161 in a plurality of steps, that is, a feature of one embodiment of the present invention.

Furthermore, FIGS. 16A and 16B show a modification example of the display panel. The display panel illustrated in FIGS. 16A and 16B is formed by transferring a protective layer 375 and the light-blocking layer BM formed over the formation substrate to the substrate 371. The substrate 371 and the protective layer 375 are bonded to each other with a bonding layer 373. In this manner, the protective layer 109 over the light-emitting element is not provided, and a protective layer may be provided on the counter substrate side.

In FIG. 16A, the source or the drain of the transistor 303 is electrically connected to the pixel electrode 111a of the light-emitting element through a conductive layer 128a. In this manner, the light-emitting element and the transistor may each be provided with a layer of a conductive layer. Specifically, the conductive layer 128a is provided over the insulating layer 314a covering the transistor 303, the insulating layer 314b is provided over the conductive layer 128a, and the pixel electrode 111a is provided over the insulating layer 314b. The pixel electrode 111a is connected to the conductive layer 128a through an opening in the insulating layer 314b, and the conductive layer 128a is connected to the source or the drain of the transistor 303 through an opening in the insulating layer 314a. A conductive layer 128b is provided over the insulating layer 314a. The conductive layer 128b can be formed using the same material and the same step as those used for the conductive layer 128a. Since the conductive layer 128b is electrically connected to the common electrode 113, the conductive layer 128b can function as an auxiliary wiring of the common electrode 113. In the connection portion 122, the common electrode 113 is connected to the auxiliary wiring 120b through an opening in the insulating layer 104. The auxiliary wiring 120b is provided over and in contact with the auxiliary wiring 120a. The auxiliary wiring 120a is connected to the conductive layer 128b through an opening in the insulating layer 314b. In this manner, the common electrode 113 may be electrically connected to both the conductive layer that is in the same layer as the pixel electrode and the conductive layer that is in another layer. The auxiliary wirings 120a and 120b are not necessarily provided, and the common electrode 113 may be directly connected to the conductive layer 128b.

FIG. 16B illustrates an example in which the layer of the auxiliary wiring 120 is provided separately from the layer of the transistor, the wiring, and the light-emitting element. The layer of only the auxiliary wiring 120 is provided, whereby the auxiliary wiring 120 having a large area can be provided. Accordingly, a voltage drop due to the resistance of the common electrode 113 can be suppressed more effectively. In FIG. 16B, the conductive layer 128 is provided over the insulating layer 314a, the insulating layer 314b is provided over the conductive layer 128, the auxiliary wiring 120 is provided over the insulating layer 314b, and an insulating layer 314c is provided over the auxiliary wiring 120. The common electrode 113 is electrically connected to the auxiliary wiring 120 through an opening provided in the insulating layer 104 and the insulating layer 314c. The conductive layer 128 is electrically connected to the transistor through an opening provided in the insulating layer 314a. The pixel electrode is electrically connected to the conductive layer 128 through an opening provided in the insulating layer 314b and the insulating layer 314c.

[Specific Example 4 of Display Panel]

FIG. 17A is a top view of a display panel 15B. FIG. 17B is a cross-sectional view taken along the dashed-dotted line C3-C4 in FIG. 17A.

The display panel 15B illustrated in FIG. 17A includes the pixel portion 71, the visible-light-transmitting region 72, and the driver circuit 78. The FPC 74 is connected to the display panel 15B. While the display panel 15A (FIG. 13A) has a structure in which the FPC 74 is connected on the display surface side, the display panel 15B has a structure in which the FPC 74 is connected on the side opposite to the display surface (the rear surface side). FIG. 17A shows an example in which the visible-light-transmitting region 72 is adjacent to the pixel portion 71 and provided along two sides of the pixel portion 71.

The display panel 15A and the display panel 15B are different from each other mainly in the structure of the connection portion 306.

In the connection portion 306 of the display panel 15B, a conductive layer 309 is electrically connected to the FPC 74 through the connector 319. The conductive layer 309 is electrically connected to the conductive layer 308 through an opening in the insulating layer 365.

Next, a method for manufacturing the display panel 15B is described with a focus on the connection portion 306 with reference to FIGS. 18A to 18C2.

First, a separation layer 353 is formed over a formation substrate 351, and a layer to be separated is formed over the separation layer 353 (FIG. 18A). The layer to be separated is formed in the following manner. First, the conductive layer 309 is formed over the separation layer 353, the insulating layer 365 is formed over the separation layer 353 and the conductive layer 309, and an opening overlapping with the conductive layer 309 is provided in the insulating layer 365. Then, the conductive layer 308 which is connected to the conductive layer 309 through the opening is formed. The conductive layer 308 can be formed using the same material and the same step as those used for the gate of the transistor. Note that the conductive layer 308 may be formed using the same material and the same step as those used for the source and the drain of the transistor. Then, the gate insulating layer 311 to the substrate 371 are formed in this order.

Next, the formation substrate 351 is separated. FIG. 18B1 illustrates an example in which separation occurs at the interface between the separation layer 353 and the conductive layer 309 and the interface between the separation layer 353 and the insulating layer 365. Thus, the conductive layer 309 can be exposed. Then, as illustrated in FIG. 18C1, the conductive layer 309 can be electrically connected to the FPC 74 using the connector 319.

As illustrated in FIG. 18B2, separation might occur in the separation layer 353. At this time, a separation layer 353a remains on the formation substrate 351 side and a separation layer 353b remains in contact with the conductive layer 309. In the case where the conductive layer 309 is not exposed after the separation of the formation substrate 351, the conductive layer 309 is preferably exposed by removing part of the separation layer 353b. Then, as illustrated in FIG. 18C2, the conductive layer 309 can be electrically connected to the FPC 74 using the connector 319.

The fabrication substrate 351 has stiffness high enough for easy transfer and has resistance to heat applied in the manufacturing process. Examples of a material that can be used for the formation substrate 351 include glass, quartz, ceramics, sapphire, a resin, a semiconductor, a metal, and an alloy. Examples of the glass include alkali-free glass, barium borosilicate glass, and aluminoborosilicate glass.

The separation layer 353 can be formed using an organic material or an inorganic material.

Examples of an organic material that can be used for the separation layer 353 include a polyimide resin, an acrylic resin, an epoxy resin, a polyamide resin, a polyimide-amide resin, a siloxane resin, a benzocyclobutene-based resin, and a phenol resin.

Examples of an inorganic material that can be used for the separation layer 353 include a metal containing an element selected from tungsten, molybdenum, titanium, tantalum, niobium, nickel, cobalt, zirconium, zinc, ruthenium, rhodium, palladium, osmium, iridium, and silicon; an alloy containing any of the above elements; and a compound containing any of the above elements. A crystal structure of a layer containing silicon may be amorphous, microcrystal, or polycrystal.

The formation substrate 351 may be separated by irradiating the separation interface with a laser. As the laser, an excimer laser, a solid laser, or the like can be used. For example, a diode-pumped solid-state laser (DPSS) may be used. Alternatively, the formation substrate 351 may be separated when a perpendicular tensile force is applied to the separation layer 353.

To the display panel 15B, the FPC 74 is connected to the side opposite to the display surface (rear surface side). For example, by using the display panel 15B, a multidisplay in FIG. 32 to be described in Example 2 can be fabricated.

<Structure Example of Transistor>

Next, transistors that can be used for the display panel or the display device are described.

The structure of the transistors in the display panel or the display device is not particularly limited. For example, a planar transistor, a staggered transistor, or an inverted staggered transistor may be used. A top-gate transistor or a bottom-gate transistor may be used. Gate electrodes may be provided above and below a channel.

Figure 19A:
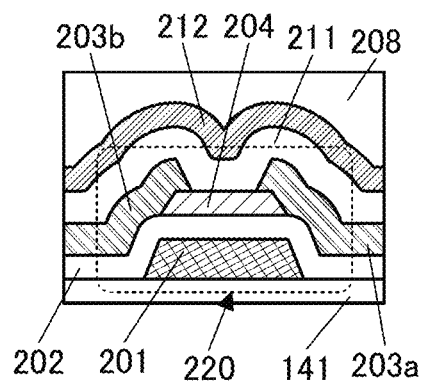
FIGS. 19A and 19B are cross-sectional views illustrating examples of transistors.
Figure 19B:
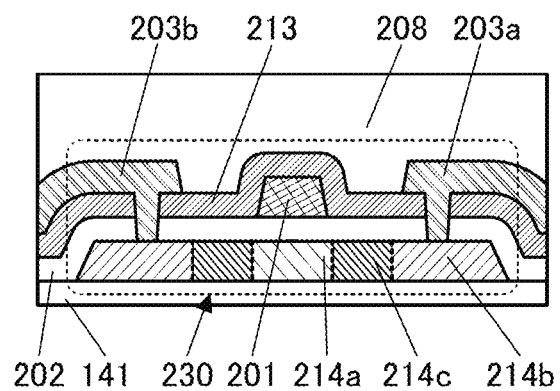

FIGS. 19A and 19B illustrate structure examples of transistors. Each transistor is provided between an insulating layer 141 and an insulating layer 208. The insulating layer 141 preferably functions as a base film. The insulating layer 208 preferably functions as a planarization film.

A transistor 220 illustrated in FIG. 19A is a bottom-gate transistor containing a metal oxide in a semiconductor layer 204. The metal oxide can function as an oxide semiconductor.

An oxide semiconductor is preferably used as the semiconductor of the transistor. The use of a semiconductor material having a wider band gap and a lower carrier density than silicon is preferable because off-state current of the transistor can be reduced.

The transistor 220 includes the conductive layer 201, the insulating layer 202, the conductive layer 203a, the conductive layer 203b, and the semiconductor layer 204. The conductive layer 201 functions as a gate. The insulating layer 202 functions as a gate insulating layer. The semiconductor layer 204 overlaps with the conductive layer 201 with the insulating layer 202 positioned therebetween. The conductive layers 203a and 203b are electrically connected to the semiconductor layer 204. The transistor 220 is preferably covered with insulating layers 211 and 212. Various inorganic insulating films can be used for the insulating layers 211 and 212. In particular, an oxide insulating film is suitably used for the insulating layer 211, and a nitride insulating film is suitably used for the insulating layer 212.

A transistor 230 illustrated in FIG. 19B is a top-gate transistor containing polysilicon in the semiconductor layer.

The transistor 230 includes the conductive layer 201, the insulating layer 202, the conductive layer 203a, the conductive layer 203b, the semiconductor layer, and an insulating layer 213. The conductive layer 201 functions as a gate. The insulating layer 202 functions as a gate insulating layer. The semiconductor layer includes a channel formation region 214a and a pair of low-resistance regions 214b. The semiconductor layer may further include a lightly doped drain (LDD) region. FIG. 19B illustrates an example in which an LDD region 214c is provided between the channel formation region 214a and the low-resistance region 214b. The channel formation region 214a overlaps with the conductive layer 201 with the insulating layer 202 provided therebetween. The conductive layer 203a is electrically connected to one of the pair of low-resistance regions 214b through an opening in the insulating layer 202 and the insulating layer 213. Similarly, the conductive layer 203b is electrically connected to the other of the pair of low-resistance regions 214b. Various inorganic insulating films can be used for the insulating layer 213. In particular, a nitride insulating film is suitably used for the insulating layer 213.

[Metal Oxide]

For the semiconductor layer, a metal oxide functioning as an oxide semiconductor is preferably used. A metal oxide that can be used for the semiconductor layer is described below.

The metal oxide preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. The element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also called a metal oxide in some cases. Moreover, a metal oxide containing nitrogen may be called a metal oxynitride. For example, a metal oxide containing nitrogen, such as zinc oxynitride (ZnON), may be used for a semiconductor layer.

An oxide semiconductor (metal oxide) is classified into a single crystal oxide semiconductor and a non-single-crystal oxide semiconductor. Examples of the non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that it is difficult to observe a clear crystal grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced with indium, the layer can also be referred to as an (In, M, Zn) layer. When indium of the In layer is replaced with the element M, the layer can also be referred to as an (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide. This means that the CAAC-OS has small amounts of impurities and defects (e.g., oxygen vacancies (Vo)). Thus, a metal oxide including the CAAC-OS is physically stable. Therefore, the metal oxide including the CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that indium-gallium-zinc oxide (hereinafter referred to as IGZO) that is a metal oxide containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

The metal oxide film functioning as a semiconductor layer can be formed using one or both of an inert gas and an oxygen gas. Note that there is no particular limitation on the flow rate ratio of oxygen (the partial pressure of oxygen) in the step of forming the metal oxide film. In the case where a transistor having high field-effect mobility is obtained, the flow rate ratio of oxygen (the partial pressure of oxygen) in the step of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

As described above, the display panel of this embodiment includes the auxiliary wiring connected to the common electrode of the light-emitting element and the aperture ratio of the pixel is high. Accordingly, luminance unevenness of the display panel can be suppressed and the display quality of the display panel can be improved. Furthermore, a display panel which has high reliability and enables high-luminance display can be obtained.

This embodiment can be combined with any of the other embodiments and the examples as appropriate. In the case where a plurality of structure examples are described in one embodiment in this specification, some of the structure examples can be combined as appropriate.

Embodiment 2

In this embodiment, a display panel of one embodiment of the present invention is described with reference to FIGS. 20A and 20B and FIGS. 21A and 21B.

Figure 20A:
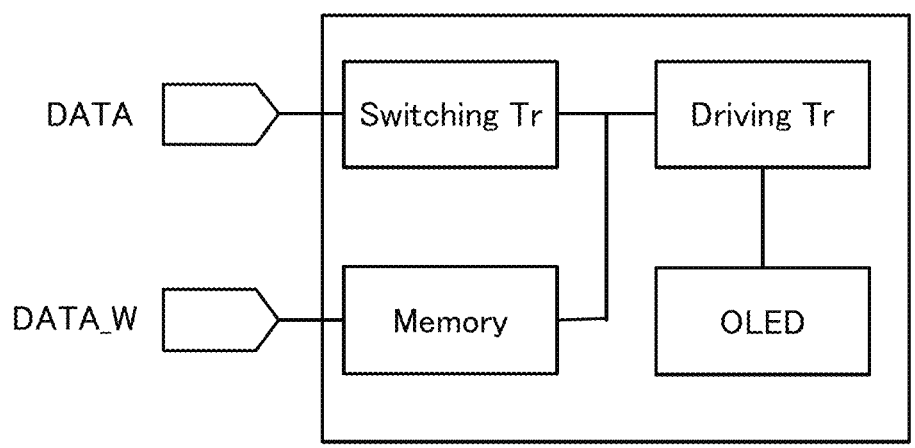
FIG. 20A is a block diagram illustrating an example of a pixel and FIG. 20B illustrates an example of a pixel.

FIG. 20A is a block diagram of a pixel. A pixel of this embodiment includes a memory (Memory) in addition to a switching transistor (Switching Tr), a driving transistor (Driving Tr), and a light-emitting element (OLED).

Data DATA_W is supplied to the memory. When the data DATA_W is supplied to the pixel in addition to display data DATA, a current flowing through the light-emitting element is large, so that the display panel can have high luminance.

10 When the potential of the data DATA_W is represented by $V_w$, the potential of the display data DATA is represented by $V_{data}$, and the capacitance of the memory is represented by $C_w$, the gate voltage $V_g$ of the driving transistor can be expressed by Formula (1).

[Formula 1]

$$V_g = V_w + \frac{C_w}{C_w + C_s} V_{data} \quad (1)$$

When $V_w$ equals to $V_{data}$, a voltage higher than $V_{data}$ is applied as $V_g$, and a larger current can flow. That is, the current flowing through the light-emitting element becomes large, and the luminance of the light-emitting element is increased.

Figure 20B:
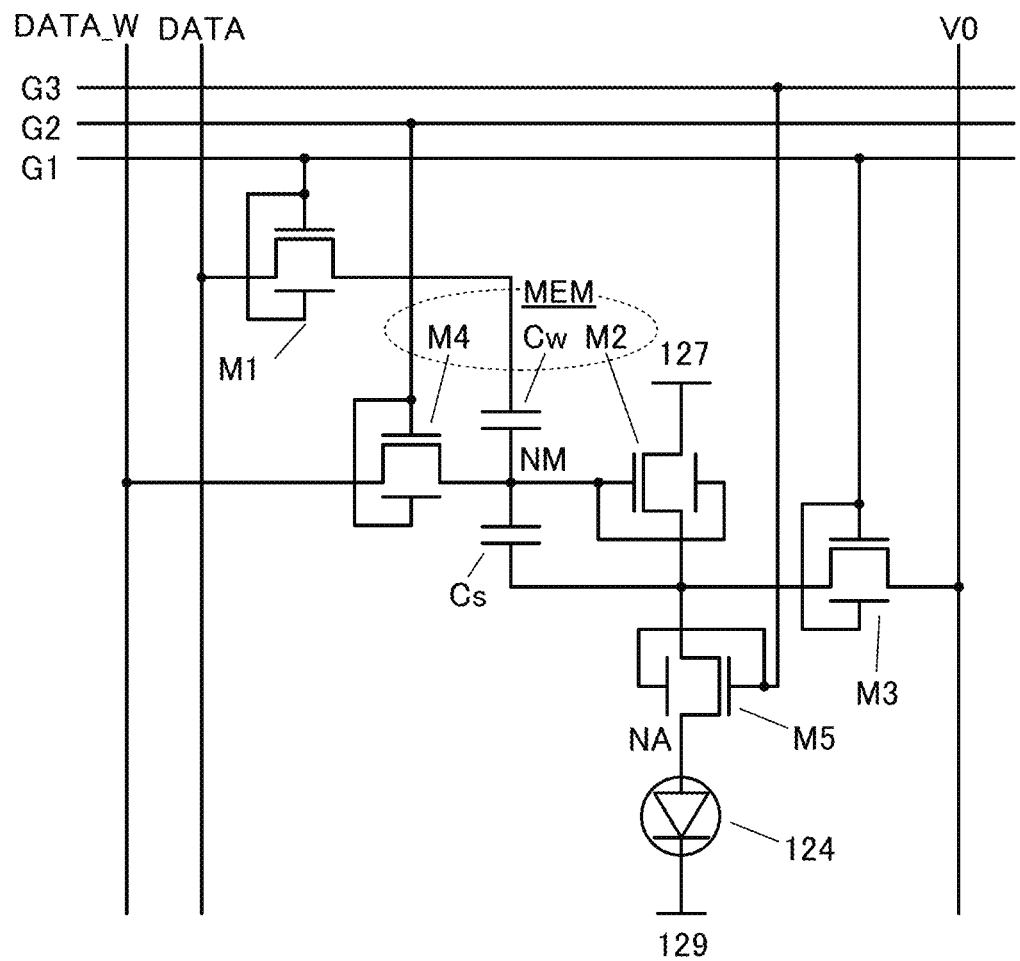

FIG. 20B is a specific circuit diagram of the pixel.

The pixel illustrated in FIG. 20B includes a transistor M1, a transistor M2, a transistor M3, a transistor M4, a transistor M5, a capacitor Cs, a capacitor Cw, and a light-emitting element 124.

One of a source and a drain of the transistor M1 is electrically connected to one electrode of the capacitor Cw. The other electrode of the capacitor Cw is electrically connected to one of a source and a drain of the transistor M4. The one of the source and the drain of the transistor M4 is electrically connected to a gate of the transistor M2. The gate of the transistor M2 is electrically connected to one electrode of the capacitor Cs. The other electrode of the capacitor Cs is electrically connected to one of a source and a drain of the transistor M2. The one of the source and the drain of the transistor M2 is electrically connected to one of a source and a drain of the transistor M5. The one of the source and the drain of the transistor M5 is electrically connected to one of a source and a drain of the transistor M3. The other of the source and the drain of the transistor M5 is electrically connected to one electrode of the light-emitting element 124. The transistors illustrated in FIG. 20B each include a back gate electrically connected to its gate; however, the connection of the back gate is not limited thereto. The transistor does not necessarily include the back gate.

Here, a node to which the other electrode of the capacitor Cw, the one of the source and the drain of the transistor M4, the gate of the transistor M2, and the one electrode of the capacitor Cs are connected is referred to as a node NM. A node to which the other of the source and the drain of the transistor M5 and the one electrode of the light-emitting element 124 are connected is referred to as a node NA.

A gate of the transistor M1 is electrically connected to a wiring G1. A gate of the transistor M3 is electrically connected to the wiring G1. A gate of the transistor M4 is electrically connected to a wiring G2. A gate of the transistor M5 is electrically connected to a wiring G3. The other of the source and the drain of the transistor M1 is electrically connected to a wiring DATA. The other of the source and the drain of the transistor M3 is electrically connected to a wiring V0. The other of the source and the drain of the transistor M4 is electrically connected to a wiring DATA_W.

The other of the source and the drain of the transistor M2 is electrically connected to a power supply line 127 (at high potential). The other electrode of the light-emitting element 124 is electrically connected to a common wiring 129. Note that a given potential can be supplied to the common wiring 129.

The wirings G1, G2, and G3 can function as a signal line for controlling the operation of the corresponding transistor. The wiring DATA can function as a signal line for supplying an image signal to the pixel. The wiring DATA_W can function as a signal line for writing data to a memory circuit MEM. The wiring DATA_W can function as a signal line for supplying a correction signal to the pixel. The wiring V0 functions as a monitor line for obtaining the electrical characteristics of the transistor M4. A specific potential is supplied from the wiring V0 to the one electrode of the capacitor Cs through the transistor M3, whereby writing of an image signal can be stable.

The memory circuit MEM is formed of the transistors M2, the transistor M4, and the capacitor Cw. The node NM is a storage node; when the transistor M4 is turned on, a signal supplied to the wiring DATA_W can be written to the node NM. The use of a transistor with an extremely low off-state current as the transistor M4 allows the potential of the node NM to be retained for a long time.

As the transistor M4, a transistor containing a metal oxide in its channel formation region (hereinafter referred to as an OS transistor) can be used, for example. Thus, the off-state current of the transistor M4 can be extremely low, and the potential of the node NM can be retained for a long time. In this case, an OS transistor is preferably used as the other transistors included in the pixel. For the specific example of the metal oxide, Embodiment 1 can be referred to.

An OS transistor exhibits ultralow off-state current characteristics because of a large energy gap. Unlike in a transistor in which Si is included in the channel formation region (hereinafter referred to as a Si transistor), impact ionization, avalanche breakdown, short-channel effects, and the like do not occur in an OS transistor; accordingly, a highly reliable circuit can be configured.

Furthermore, a Si transistor may be used as the transistor M4. In this case, Si transistors are preferably used as the other transistors included in the pixel.

Examples of the Si transistor include a transistor containing amorphous silicon, a transistor containing crystalline silicon (typically, low-temperature polysilicon), and a transistor containing single crystal silicon.

One pixel may include both an OS transistor and a Si transistor.

In the pixel, the signal written to the node NM is capacitively coupled to the image signal supplied from the wiring DATA, and the resulting data can be output to the node NA. Note that the transistor M1 can have a function of selecting a pixel. The transistor M5 can function as a switch that controls light emission of the light-emitting element 124.

For example, when the signal written to the node NM from the wiring DATA_W is higher than the threshold voltage ($V_{th}$) of the transistor M2, the transistor M2 is turned on, and the light-emitting element 124 emits light before the image signal is written. For this reason, it is preferred that the transistor M5 be provided and that after the potential of the node NM is fixed, the transistor M5 be turned on so that the light-emitting element 124 emits light.

In other words, when an intended correction signal is stored in the node NM in advance, the correction signal can be added to the supplied image signal. Note that the correction signal is sometimes attenuated by a component on the transmission path; hence, the signal is preferably produced in consideration of the attenuation.

The details of the operation of the pixel in FIG. 20B are described using timing charts shown in FIGS. 21A and 21B. Note that although a given positive or negative signal can be used as the correction signal (Vp) supplied to the wiring DATA_W, the case where a positive signal is supplied is described here. In the following description, "H" represents high potential and "L" represents low potential.

First, the operation of writing the correction signal (Vp) to the node NM is described with reference to FIG. 21A. The operation may be performed for every frame, and writing is performed at least once before the image signal is supplied. Furthermore, refresh operation is performed as appropriate to rewrite the same correction signal to the node NM.

At Time T1, the potential of the wiring G1 is set to "H", the potential of the wiring G2 is set to "L", the potential of the wiring G3 is set to "L", and the potential of the wiring DATA is set to "L"; thus, the transistor M1 is turned on and the potential of the other electrode of the capacitor Cw becomes "L".

This operation is reset operation for performing subsequent capacitive coupling operation. Before Time T1, the light-emitting element 124 emits light in the previous frame; however, the reset operation changes the potential of the node NM, thereby changing the amount of current flowing through the light-emitting element 124. Thus, the transistor M5 is preferably turned off to stop light emission of the light-emitting element 124.

At Time T2, the potential of the wiring G1 is set to "H", the potential of the wiring G2 is set to "H", the potential of the wiring G3 is set to "L", and the potential of the wiring DATA is set to "L"; thus, the transistor M4 is turned on, and the potential of the wiring DATA_W (the correction signal (Vp)) is written to the node NM.

At Time T3, the potential of the wiring G1 is set to "H", the potential of the wiring G2 is set to "L", the potential of the wiring G3 is set to "L", and the potential of the wiring DATA is set to "L"; thus, the transistor M4 is turned off and the correction signal (Vp) is retained in the node NM.

At Time T4, the potential of the wiring G1 is set to "L", the potential of the wiring G2 is set to "L", the potential of the wiring G3 is set to "L", and the potential of the wiring DATA is set to "L"; thus, the transistor M1 is turned off and the operation of writing the correction signal (Vp) is finished.

Next, the operation of correcting the image signal (Vs) and operation of making the light-emitting element 124 emit light are described with reference to FIG. 21B.

At Time T11, the potential of the wiring G1 is set to "H", the potential of the wiring G2 is set to "L", the potential of the wiring G3 is set to "L", and the potential of the wiring DATA_W is set to "L"; thus, the transistor M1 is turned on and the potential of the wiring DATA is added to the potential of the node NM by capacitive coupling through the capacitor Cw. That is, the potential of the node NM becomes a potential (Vs+Vp) obtained by adding the correction signal (Vp) to the image signal (Vs).

At Time T12, the potential of the wiring G1 is set to "L", the potential of the wiring G2 is set to "L", the potential of the wiring G3 is set to "L", and the potential of the wiring DATA_W is set to "L"; thus, the transistor M1 is turned off, and the potential of the node NM is fixed to Vs+Vp.

At Time T13, the potential of the wiring G1 is set to "L", the potential of the wiring G2 is set to "L", the potential of the wiring G3 is set to "H", and the potential of the wiring DATA_W is set to "L"; thus, the transistor M5 is turned on, the potential of the node NA becomes Vs+Vp, and the light-emitting element 124 emits light. Strictly speaking, the potential of the node NA is lower than Vs+Vp by the threshold voltage ($V_{th}$) of the transistor M2; here, Vth is adequately low and negligible.

The operation of correcting the image signal (Vs) and the operation of making the light-emitting element 124 emit light are described above. Note that the aforementioned operation of writing the correction signal (Vp) and the operation of inputting the image signal (Vs) may be concurrently performed; however, it is preferable to perform the operation of inputting the image signal (Vs) after the correction signal (Vp) is written to all pixels. In one embodiment of the present invention, since the same image signal can be supplied to a plurality of pixels at the same time, the correction signal (Vp) is written to all the pixels first, whereby the operating speed can be increased.

As described above, when the light-emitting element emits light with the use of the image signal and the correction signal, the amount of current flowing through the light-emitting element can be increased, and high luminance can be achieved. A voltage higher than or equal to the output voltage of a source driver can be applied to the gate voltage of the driving transistor, so that the power consumption of the source driver can be reduced.

This embodiment can be combined with any of the other embodiments and the examples as appropriate.

Embodiment 3

In this embodiment, electronic devices of one embodiment of the present invention are described with reference to FIGS. 22A to 22D.

Electronic devices of this embodiment are each provided with a display device of one embodiment of the present invention in a display portion. In the display device of one embodiment of the present invention, the number of display panels is increased, whereby the area of the display region can be increased unlimitedly. Thus, the display device of one embodiment of the present invention can be favorably used for digital signage, a public information display (PID), or the like.

The display portion of the electronic device of this embodiment can display, for example, an image with a resolution of full high definition, 4K2K, 8K4K, 16K8K, or more. As the screen size of the display portion, the diagonal size can be greater than or equal to 20 inches, greater than or equal to 30 inches, greater than or equal to 50 inches, greater than or equal to 60 inches, or greater than or equal to 70 inches.

Examples of electronic devices include electronic devices having relatively large screens, such as a television device, a desktop or laptop personal computer, a monitor of a computer, digital signage, and a large game machine (e.g., a pachinko machine); a digital camera; a digital video camera; a digital photo frame; a mobile phone; a portable game console; a portable information terminal; an audio reproducing device; and the like.

The electronic device of this embodiment can be incorporated along a curved inside/outside wall surface of a house or a building or a curved interior/exterior surface of a car.

The electronic device of this embodiment may include an antenna. When a signal is received by the antenna, the electronic device can display an image, information, or the like on a display portion. When the electronic device includes the antenna and a secondary battery, the antenna may be used for contactless power transmission.

The electronic device of this embodiment may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 22A:
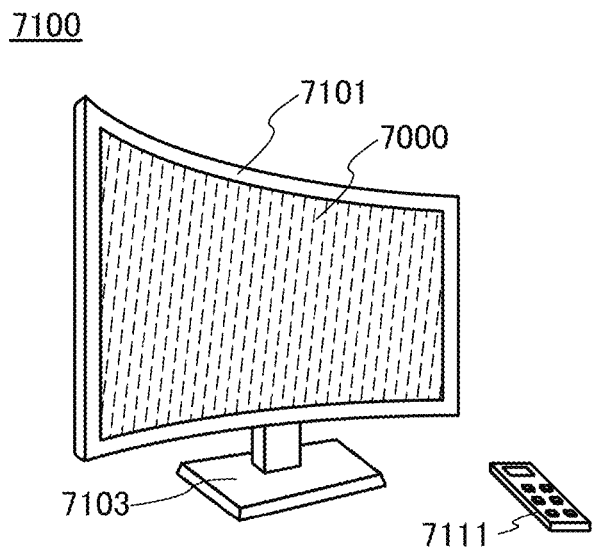
FIGS. 22A to 22D illustrate examples of electronic devices.

FIG. 22A illustrates an example of a television device. In a television device 7100, a display portion 7000 is incorporated into a housing 7101. Here, the housing 7101 is supported by a stand 7103.

The display device of one embodiment of the present invention can be used in the display portion 7000.

The television device 7100 illustrated in FIG. 22A can be operated with an operation switch provided in the housing 7101 or a separate remote controller 7111. Furthermore, the display portion 7000 may include a touch sensor, and the television device 7100 may be operated by touching the display portion 7000 with a finger or the like. The remote controller 7111 may be provided with a display portion for displaying data output from the remote controller 7111. With operation keys or a touch panel of the remote controller 7111, channels and volume can be controlled and images displayed on the display portion 7000 can be controlled.

Note that the television device 7100 is provided with a receiver, a modem, and the like. With use of the receiver, general television broadcasting can be received. When the television device is connected to a communication network with or without wires via the modem, one-way (from a transmitter to a receiver) or two-way (between a transmitter and a receiver or between receivers) data communication can be performed.

Figure 22B:
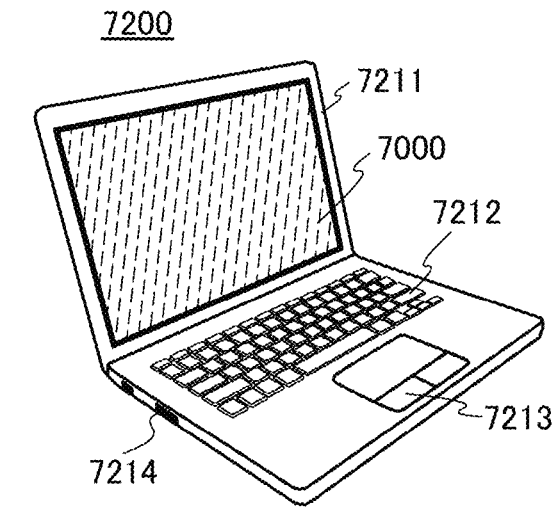

FIG. 22B illustrates an example of a laptop personal computer. A laptop personal computer 7200 includes a housing 7211, a keyboard 7212, a pointing device 7213, an external connection port 7214, and the like. The display portion 7000 is incorporated into the housing 7211.

The display device of one embodiment of the present invention can be used in the display portion 7000.

Figure 22C:
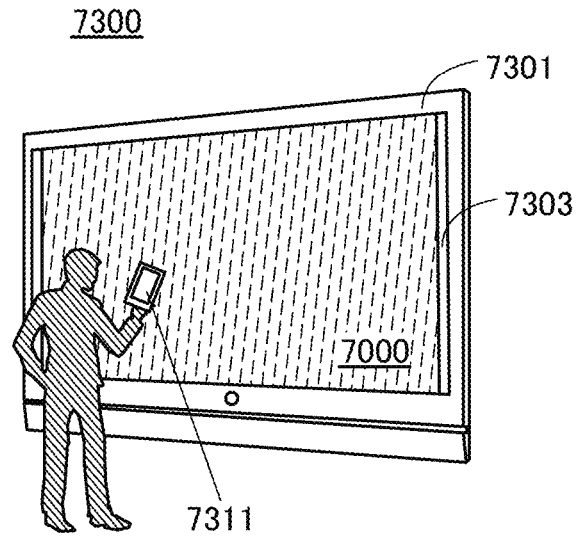
Figure 22D:
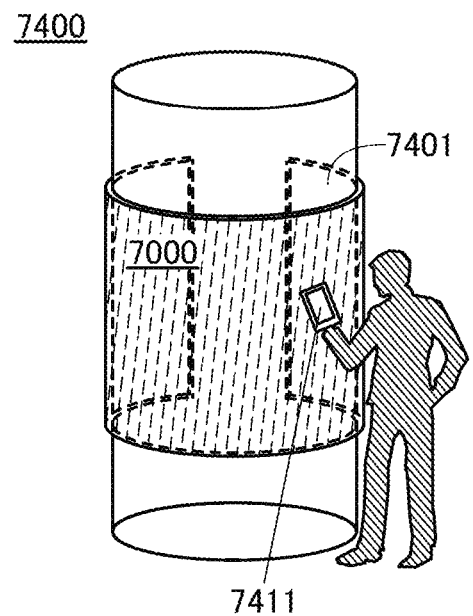

FIGS. 22C and 22D illustrate examples of digital signage.

Digital signage 7300 illustrated in FIG. 22C includes a housing 7301, the display portion 7000, a speaker 7303, and the like. The Digital signage 7300 can also include an LED lamp, operation keys (including a power switch or an operation switch), a connection terminal, a variety of sensors, a microphone, and the like.

FIG. 22D illustrates digital signage 7400 mounted on a cylindrical pillar 7401. The digital signage 7400 includes the display portion 7000 provided along a curved surface of the pillar 7401.

The display device of one embodiment of the present invention can be used in each of the display portions 7000 illustrated in FIGS. 22C and 22D.

A larger area of the display portion 7000 can provide more information at a time. In addition, the larger display portion 7000 attracts more attention, so that the effectiveness of the advertisement can be increased, for example.

It is preferable to use a touch panel in the display portion 7000 because a device with such a structure does not just display a still or moving image on the display portion 7000, but can be operated by users intuitively. In the case where the display device of one embodiment of the present invention is used for providing information such as route information or traffic information, usability can be enhanced by intuitive operation.

Furthermore, as illustrated in FIGS. 22C and 22D, it is preferable that the digital signage 7300 or the digital signage 7400 work with an information terminal 7311 or an information terminal 7411 such as a user's smartphone through wireless communication. For example, information of an advertisement displayed on the display portion 7000 can be displayed on a screen of the information terminal 7311 or 7411. Moreover, by operation of the information terminal 7311 or 7411, a displayed image on the display portion 7000 can be changed.

Furthermore, it is possible to make the digital signage 7300 or 7400 execute a game with use of the screen of the information terminal 7311 or 7411 as an operation means (controller). Thus, an unspecified number of people can join in and enjoy the game concurrently.

This embodiment can be combined with any of the other embodiments and the examples as appropriate.

Example 1

In this example, the results of considering the structure of an auxiliary wiring and actually fabricating a display panel are described.

[Auxiliary Wiring Example 1]

First, the pixel 130a illustrated in FIG. 1A and the connection portion 122 illustrated in FIG. 1B, which are described in Specific example 1 of display panel, were considered. In addition, a display panel was actually fabricated on the basis of the results of the consideration, and the cross section of the connection portion 122 of the display panel was observed.

When the connection portion 122 was devised under conditions where the pixel size is 225 square μm (13-inch high definition (HD)) and the distance between the opening edge of the metal mask and the opening edge of the pixel and the distance between the opening edge of the metal mask and the center of the connection portion 122 are each 20 μm, the aperture ratio of the pixel 130*a* was estimated to be 41.1%. In the case where the common layers are formed in one step, the aperture ratio is calculated to be 30%; thus, it is found that when the common layers are formed in two steps, the aperture ratio can be significantly increased.

Figure 23:
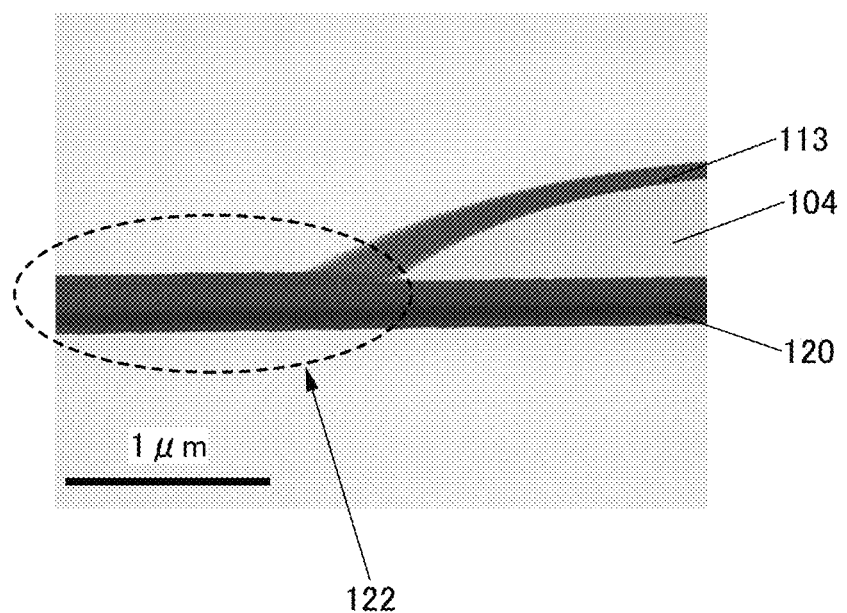
FIG. 23 is a cross-sectional STEM image of a connection portion.

Next, FIG. 23 shows a scanning transmission electron microscope (STEM) image of the connection portion 122 in the fabricated display panel. As illustrated in FIG. 23, in the connection portion 122, the common electrode 113 was connected to the auxiliary wiring 120.

[Auxiliary Wiring Example 2]

In addition, a method by which an auxiliary wiring and a common electrode are electrically connected to each other even when common layers which are shared by subpixels of a plurality of colors are formed in the entire display region of a display panel was considered. Furthermore, a display panel was actually fabricated, and whether the auxiliary wiring and the common electrode were electrically connected to each other was examined. A specific method is described with reference to FIGS. 24A to 24F.

Figure 24A:
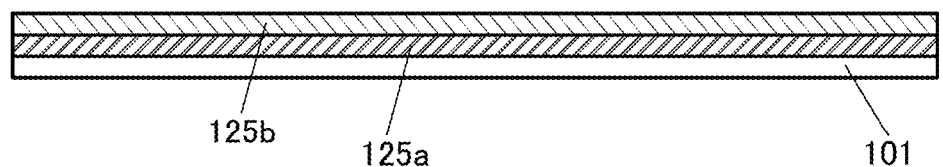
FIGS. 24A to 24F are cross-sectional views illustrating an example of a method for manufacturing a display panel.
Figure 24B:
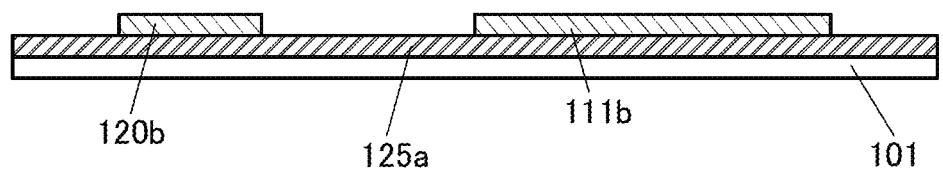
Figure 24C:
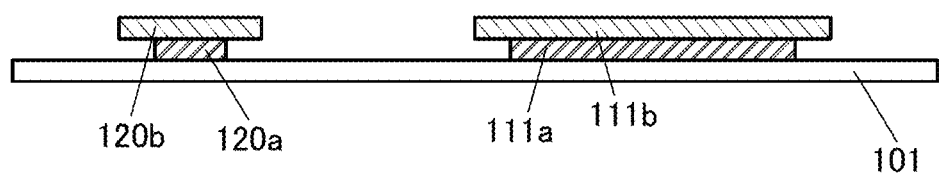
Figure 25A:
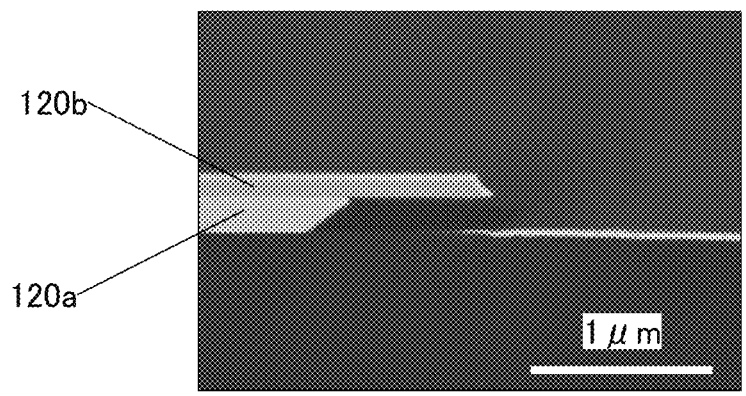
FIGS. 25A and 25B are cross-sectional STEM images of auxiliary wirings.

First, as illustrated in FIG. 24A, a reflective electrode 125*a* and a transparent electrode 125*b* were formed in this order over the insulating layer 101. Next, as illustrated in FIG. 24B, only the transparent electrode 125*b* was processed to form the pixel electrode 111*b* and the auxiliary wiring 120*b*. Then, as illustrated in FIG. 24C, the reflective electrode 125*a* was processed to form the pixel electrode 111*a* and the auxiliary wiring 120*a*. At this time, the etching time was adjusted so that the end portion of the auxiliary wiring 120*a* is positioned inward from the end portion of the auxiliary wiring 120*b*, and thus the auxiliary wiring having an overhang shape was formed. The processing was performed using wet etching, which allows isotropic etching. FIG. 25A shows a STEM image of an overhang-shaped auxiliary wiring which was actually fabricated. FIG. 25A shows that the auxiliary wiring having an overhang shape in which the end portion of the auxiliary wiring 120*a* is positioned inward from the end portion of the auxiliary wiring 120*b* was formed.

Figure 24D:
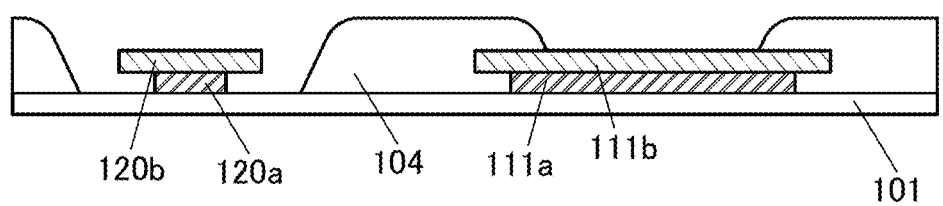
Figure 24E:
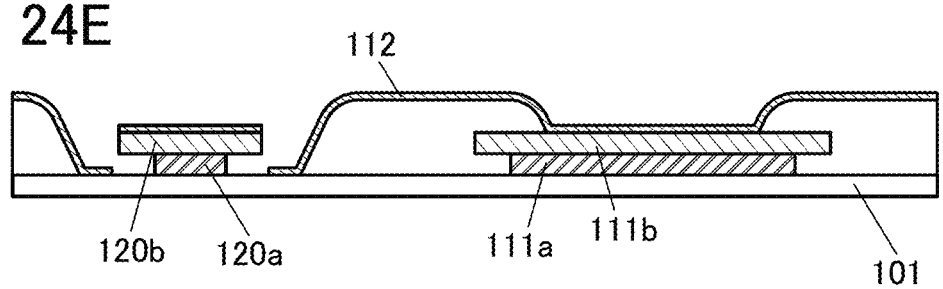
Figure 24F:
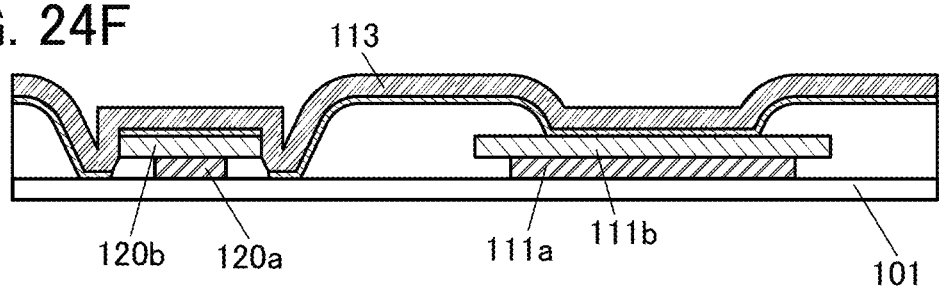

Then, the insulating layer 104 was formed (FIG. 24D). The insulating layer 104 was formed to cover the end portions of the pixel electrode 111*a* and the pixel electrode 111*b* and not to cover the end portions of the auxiliary wiring 120*a* and the auxiliary wiring 120*b*. Then, as illustrated in FIG. 24E, the EL layer 112 was formed to be disconnected by the overhang-shaped auxiliary wiring. Furthermore, as illustrated in FIG. 24E, the common electrode 113 was formed to be connected to the side surface of the auxiliary wiring 120*b*. The results of measuring the resistance after the EL layer 112 and the common electrode 113 were formed demonstrated that the auxiliary wiring was electrically connected to the common electrode 113.

Figure 25B:
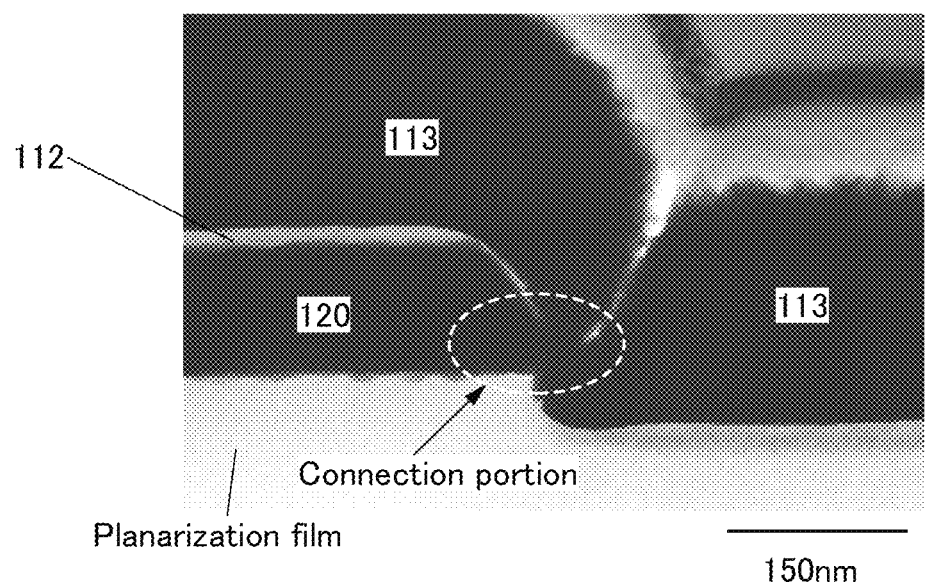

FIG. 25B shows a STEM image of an overhang-shaped auxiliary wiring which was actually fabricated. Note that the sample shown in FIG. 25B is different from the sample shown in FIG. 25A. In FIG. 25B, the auxiliary wirings 120*a* and 120*b* are collectively referred to as the auxiliary wiring 120. As shown in FIG. 25B, the EL layer 112 was cut and the auxiliary wiring 120 and the common electrode 113 were connected to each other.

[Auxiliary Wiring Example 3]

In addition, a structure in which an auxiliary wiring is provided on the counter substrate side was considered, a display panel was actually fabricated, and the cross section of a connection portion between the auxiliary wiring and the common electrode was observed. A specific method is described with reference to FIGS. 26A and 26B.

Figure 26A:
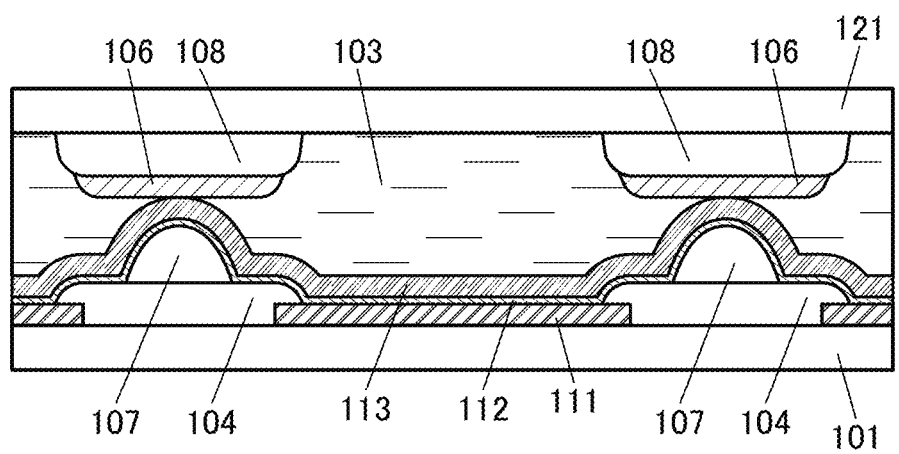
FIG. 26A is a cross-sectional view illustrating an example of a display panel and FIG. 26B is a top view illustrating an example of a display panel.

As illustrated in FIG. 26A, a spacer 108 and an auxiliary wiring 106 were formed on the counter substrate 121 side so as to be aligned with the position where the insulating layer 104 on the insulating layer 101 side was provided. In addition, a spacer 107 was formed over the insulating layer 104. In other words, the spacer 107, the spacer 108, and the auxiliary wiring 106 were formed to be provided between two subpixels. Then, the counter substrate 121 and the insulating layer 101 were bonded to each other with a bonding layer 103 so that the auxiliary wiring 106 and the common electrode 113 were in contact with each other.

Figure 26B:
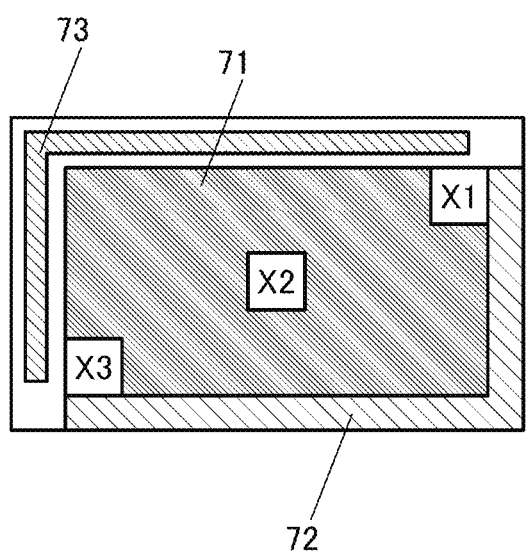
Figure 27A:
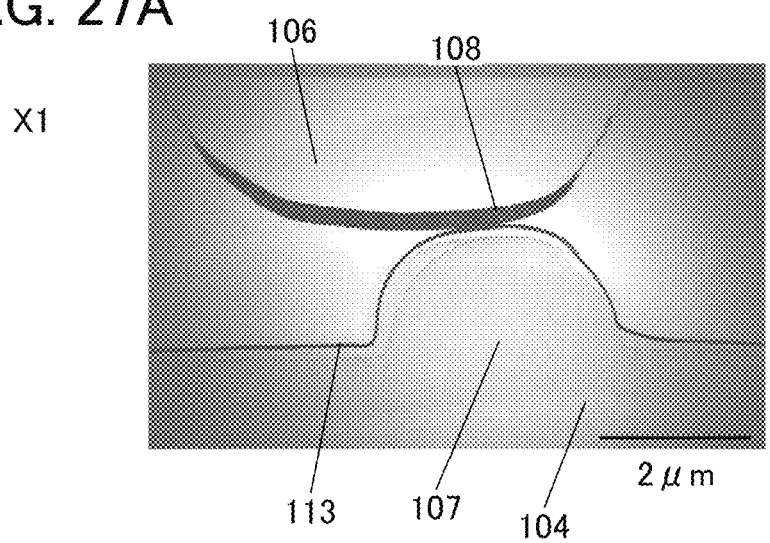
FIGS. 27A to 27C are cross-sectional STEM images of connection portions.
Figure 27B:
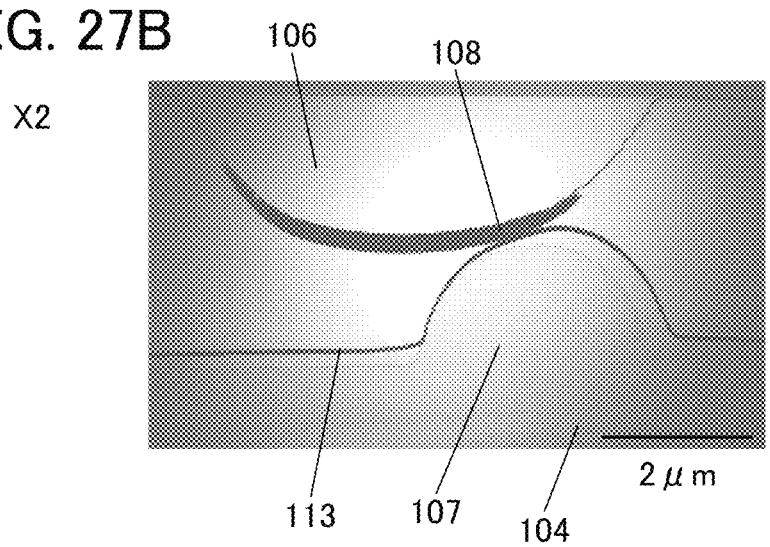
Figure 27C:
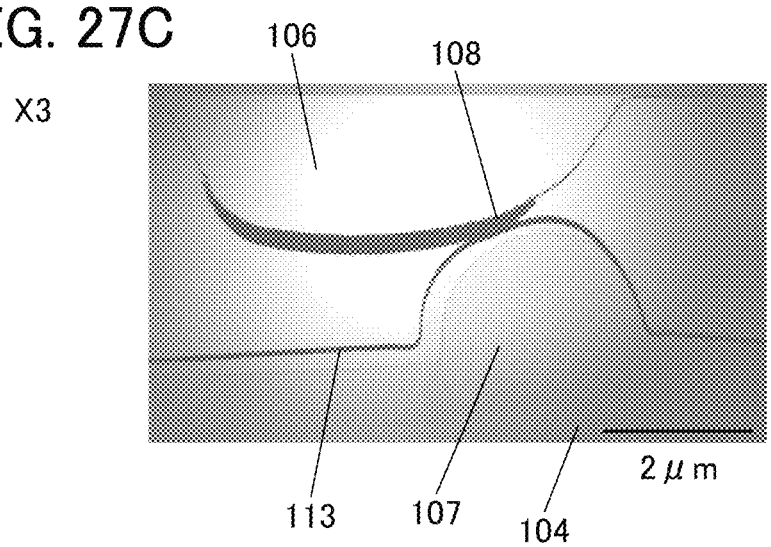

FIG. 26B is a top view of a display panel. The display panel includes the pixel portion 71, the visible-light-transmitting region 72, and the visible-light-blocking region 73 (lead wiring). The cross sections of three positions in the pixel portion 71 were observed. As shown in FIGS. 27A to 27C, the auxiliary wiring 106 is in contact with the common electrode 113 in any of these positions.

Example 2

In this example, the results of fabricating the display device of one embodiment of the present invention are described.

[Preservation Test of Display Panel]

A flexible display may be changed in shape because of the temperature change and the humidity change. In view of this, a preservation test was performed on a display panel 190, which is a flexible panel, bonded to a support 195 as illustrated in FIGS. 28A and 28B.

Like the display panel DP in FIG. 12A, the display panel 190 includes the visible-light-transmitting region 72 along two sides. At least part of the visible-light-transmitting region 72 overlaps with another display panel, and thus does not overlap with the support 195.

Figure 28A:
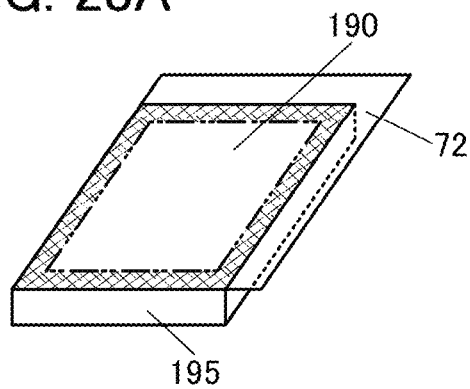
FIGS. 28A and 28B are perspective views illustrating samples used in a preservation test of a display panel and FIGS. 28C to 28F are photographs showing the results of a preservation test of a display panel.
Figure 28B:
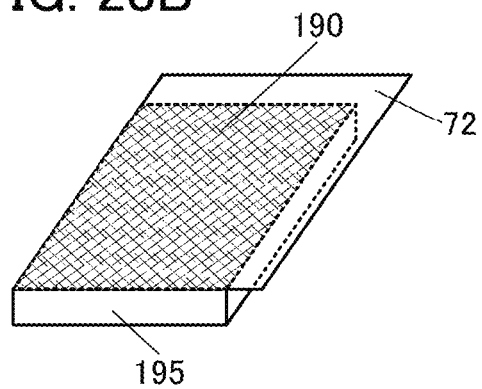

As illustrated in FIG. 28A, in a comparative sample (Ref), the display panel 190 was attached to only the vicinity of the four sides of the outer edge of the support 195, whereby the display panel 190 was fixed to the support 195. As illustrated in FIG. 28B, in a sample (Sample), the display panel 190 was attached to the entire surface of the support 195, whereby the display panel 190 was fixed to the support 195. For the support 195, an aluminum plate with a coefficient of thermal expansion (CTE) of 24 ppm/° C. was used.

In the preservation test, the sample and the comparative sample were preserved at 30° C. for 12 hours, and then further preserved at 0° C. for 12 hours.

Figure 28C:
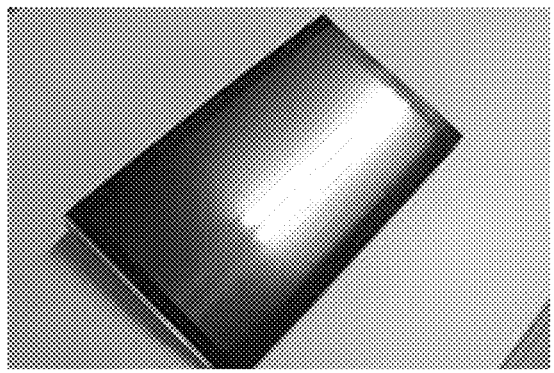
Figure 28D:
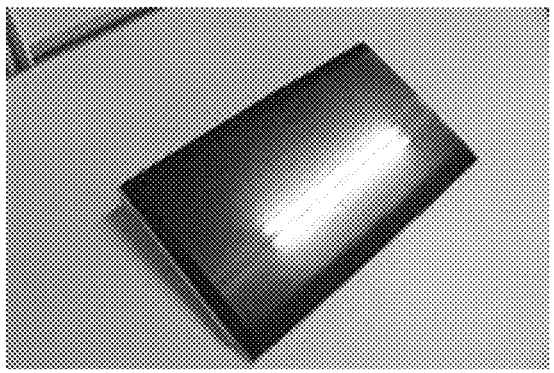
Figure 28E:
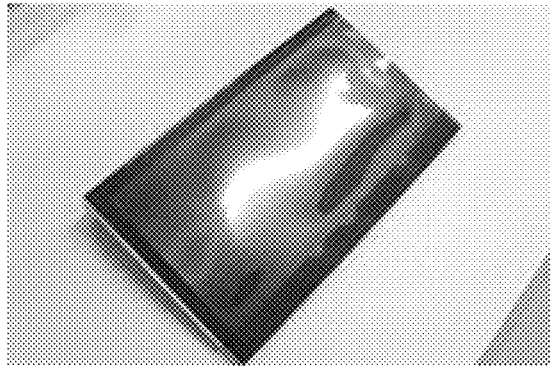
Figure 28F:
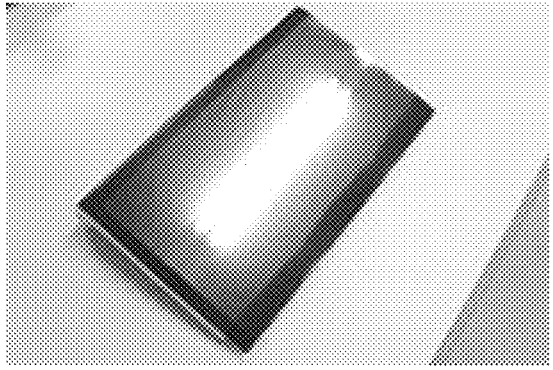

FIG. 28C shows the comparative sample (Ref) before the preservation test and FIG. 28D shows the sample (Sample) before the preservation test. FIG. 28E shows the comparative sample (Ref) after the preservation test and FIG. 28F shows the sample (Sample) after the preservation test.

As shown in FIG. 28E, the display surface of the comparative sample (Ref) after the preservation test has creases. In contrast, as shown in FIGS. 28D and 28F, no difference is observed in the sample (Sample) after the preservation test.

This indicates that when the display panel 190 is attached to the entire surface of the support 195, a change in shape of the flexible display can be suppressed.

In addition, a preservation test similar to the above was performed on the display panel bonded to the entire surface of the support with a CTE different from that of the above sample. In the case where an acrylic plate with a CTE of 70 ppm/° C. was used, even when the display panel 190 was attached to the entire surface of the support 195, the display surface had creases. In contrast, in the case where another resin plate, specifically, a glass fiber reinforced plastics (GFRP) plate with a CTE of 60 ppm/° C. was used, there were few creases in the display surface.

The above results show that when the flexible display is attached to the entire surface of the support with a low CTE, a change in shape of the flexible display can be further suppressed.

Furthermore, the flexible display might be changed in shape when a film used for the flexible display absorbs water. The display panels 190 illustrated in FIGS. 28A and 28B each include a portion that does not overlap with the support 195, and the portion easily expands by absorbing water and easily has creases as compared with other portions. This means that a film with a low water absorption rate is preferably used.

[Method for Attaching Display Panel]

In the case where a plurality of display panels are arranged, an alignment stage can be used to finely adjust the positions of the plurality of display panels. However, the alignment stage needs a space, which leads to an increase in size of a display device or an electronic device. Thus, a jig for attaching a display panel to a support with high accuracy was formed so that the plurality of display panels can be placed at desired positions without the alignment stage.

A method and a jig for attaching the display panel 190 to the support 195 with high accuracy will be described with reference to FIGS. 29A to 29D.

A jig shown in FIG. 29A includes a plurality of panel holders 416. The jig includes adsorption pores in portions overlapping with the panel holders 416, and the display panel 190 can be vacuum-sucked when a switch 417 is turned on. The panel holder 416 can hold down the display panel 190. With the use of the panel holder 416 in this manner, the side (the long side in this example) of the display panel 190 which does not overlap with the support 195 can be fixed.

First, a separator film of a double-faced tape on the side attached to the support 195 was separated, and the double-faced tape was attached to the entire surface of the support 195. Note that a separator film on the side attached to the display panel was not separated and remained. Then, as shown in FIG. 29A, the support 195 to which the double-faced tape was attached was placed at a predetermined position in the jig.

Next, as shown in FIG. 29B, the display panel 190 was placed over the support 195. The display panel 190 was provided on an adjuster 415 and placed along a dotted line in FIG. 29B. Then, the switch 417 was turned on, whereby the display panel 190 was sucked, and the display panel 190 was held down by the panel holder 416.

Next, as shown in FIGS. 29C1 and 29C2, while the separator film was separated in the state where the display panel 190 was lifted, the display panel 190 was attached to the support 195 little by little from the side where the display panel 190 was fixed (the panel holder 416 side). Here, it is important to separate the separator film from the side where the display panel 190 is fixed by the panel holder 416, so that the display panel 190 is bonded to the support 195 with high accuracy.

FIG. 29D shows the state where the display panel 190 that has been attached to the support 195 was removed from the jig. The deviation toward the 0 direction was calculated to be approximately 0.02° or less and the deviation was found to be small. With the use of the jig, the support 195 can be attached to the display panel 190 with high accuracy. Furthermore, FIG. 29E shows the state where the display panel 190 attached to the support 195 displays an image. As shown in FIG. 29E, the display panel 190 after being attached to the support 195 is found to display an image normally.

[Display Device]

Next, two kinds of display devices were fabricated using four (2×2) sets of a support and a display panel which were hardly changed in shape and attached to each other with high accuracy.

Figure 30:
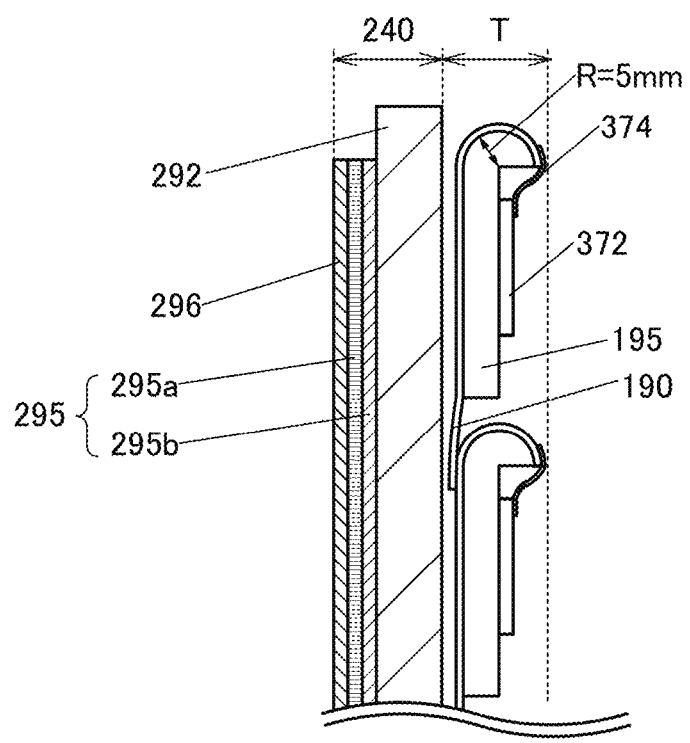
FIG. 30 is a side view illustrating an example of a display device.
Figure 31A:
FIGS. 31A and 31B are photographs of a display device of Example.
Figure 31B:
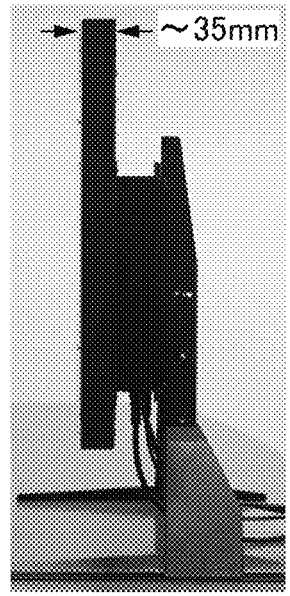

The first display device is a multidisplay in which a display panel and a driver circuit are modularized. FIG. 30 illustrates a side view of the multidisplay. FIG. 31A shows the display results and FIG. 31B is a photograph of the side surface.

As illustrated in FIG. 30, the display panel 190 is attached to one surface of the support 195 (aluminum plate). The display panel 190 was attached to the support 195 by using the method for attaching the display panel described with reference to FIGS. 29A to 29E. The support 195 has a curved surface whose curvature radius R is 5 mm, and the display panel 190 is curved along the curved surface. The display panel 190 has a portion extending from the support 195. The portion overlaps with an adjacent display panel 190. A driver circuit 372 is fixed on the other surface of the support 195. The display panel 190 is electrically connected to the driver circuit 372 with an FPC 374. Since the support 195 and the display panel 190 are attached to each other with high accuracy, the alignment stage does not need to be provided and a seamless image can be displayed only by fixing the display panel 190 to a designed frame. The sum of the thickness of the support 195 and the thickness of the display panel 190 (i.e., the thickness T in FIG. 30) is 35 mm or less.

An optical member 240 includes a support member 292, a circularly polarizing plate 295, and an anti-reflection member 296 in this order from the display panel 190 side. For the support member 292, an acrylic plate was used. In the circularly polarizing plate 295, a linear polarizing plate 295a is positioned on the viewer side and a quarter-wave plate 295b is positioned on the display panel 190 side. For the anti-reflection member 296, an anti-reflection film (also referred to as an AR film) was used.

Furthermore, for example, a touch sensor is incorporated into the display panel 190 or the optical member 240 or a touch panel is attached to the display panel 190 or the optical member 240, whereby the multidisplay can have a function of a touch panel.

As shown in FIG. 31A, the fabricated multidisplay can naturally display a nearly seamless image.

The second display device is a multidisplay in which a driver circuit is provided apart from the display panel. First, the structures of three kinds of display panels are described with reference to FIG. 32 and FIGS. 33A to 33E.

Figure 32:
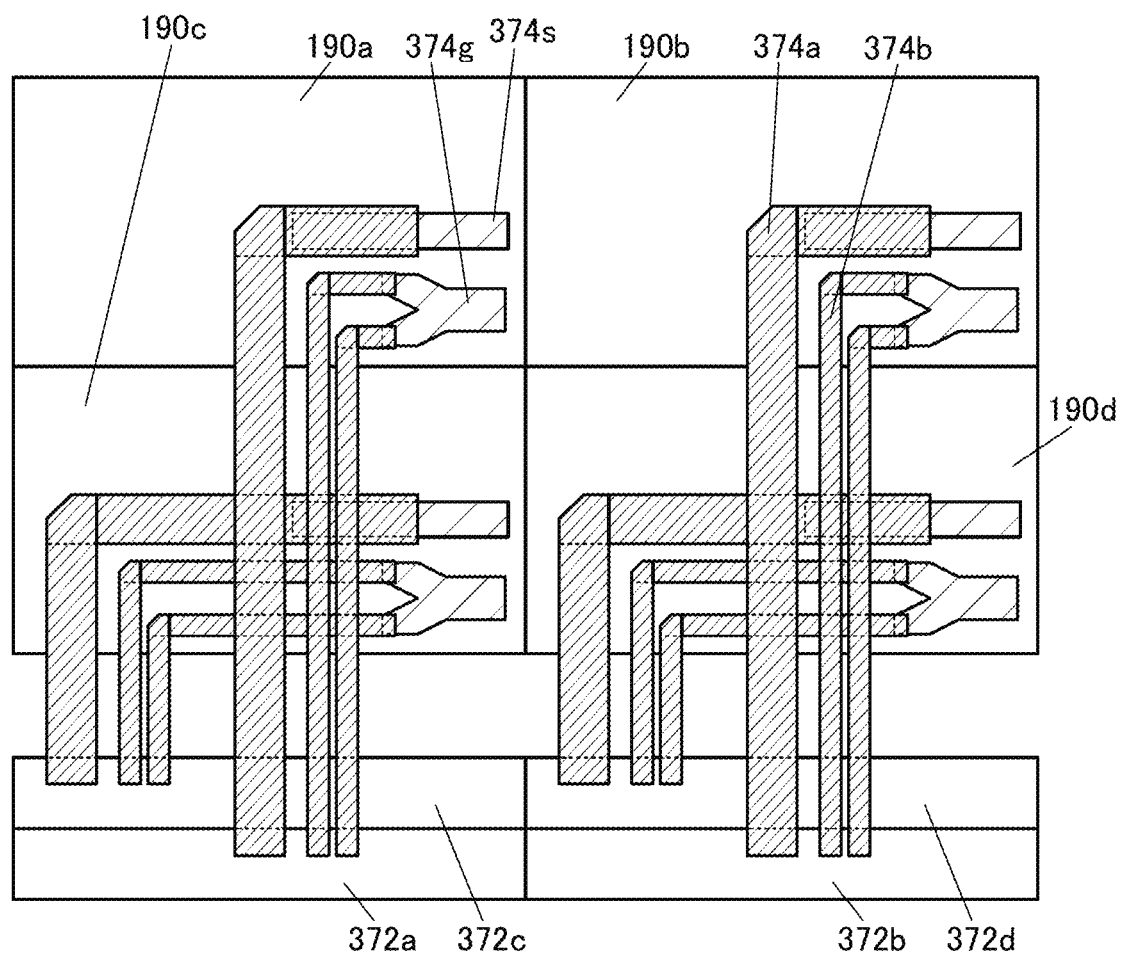
FIG. 32 is a rear view illustrating an example of a display device.

FIG. 32 is a rear view of a multidisplay. In the multidisplay illustrated in FIG. 32, one end of an FPC 374s and one end of an FPC 374g are connected to each rear surface of display panels 190a to 190d. Like the display panel 15B in FIGS. 17A and 17B, the conductive layer is exposed on the rear surface of the display panel, whereby an FPC can be connected to the rear surface of the display panel.

Furthermore, the other end of the FPC 374s is connected to one end of a long FPC 374a, the other end of the FPC 374g is connected to one end of a long FPC 374b, and the other end of the FPC 374a and the other end of the FPC 374b are connected to a driver circuit (any of driver circuits 372a to 372d). In this manner, power supply lines and signal lines are led with the use of long FPCs, whereby only the FPCs are provided on the rear surface side of the display panel, and a display in which the features of the thin and lightweight display panel are retained can be fabricated. For example, the display is suitable for a wall-mounted display.

Figure 33A:
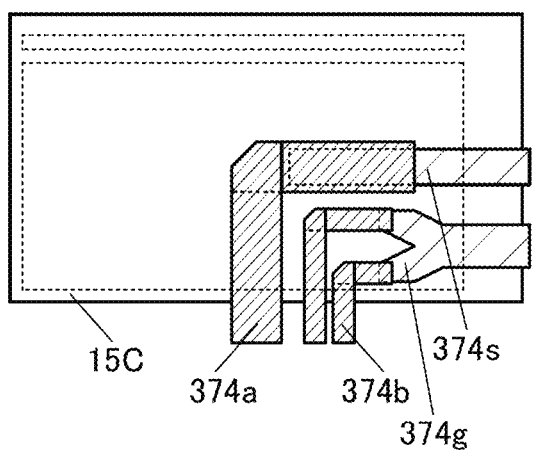
FIGS. 33A and 33C are bottom views illustrating examples of a display panel.
Figure 33B:
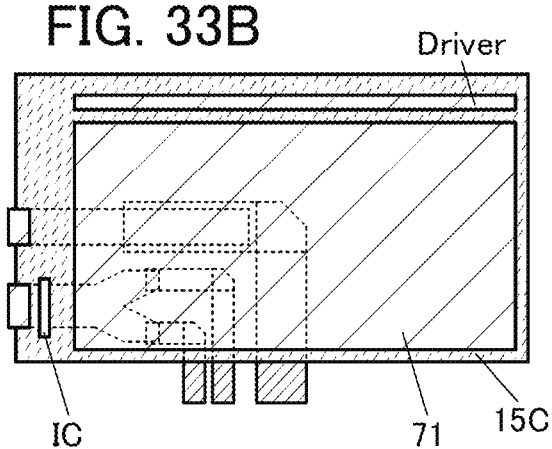
FIGS. 33B and 33D are top views illustrating examples of a display panel.
Figure 33C:
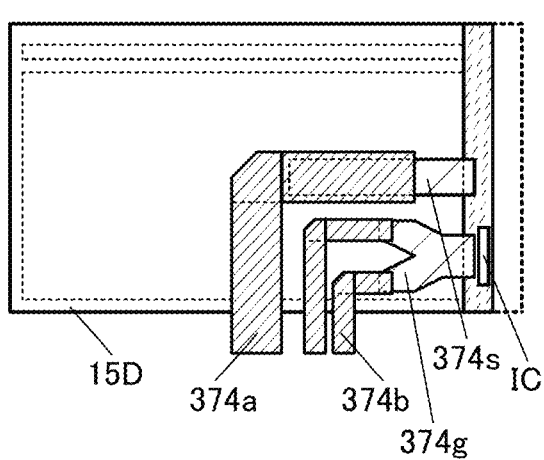
Figure 33D:
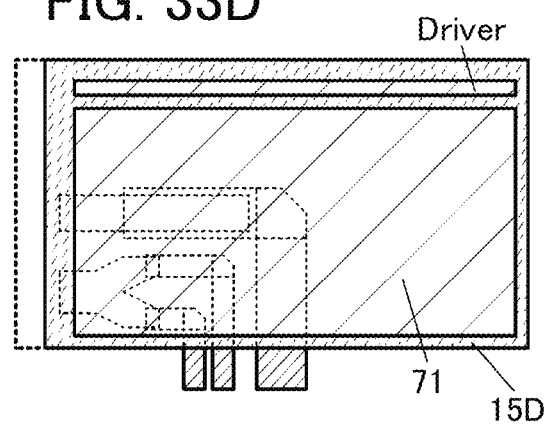
Figure 33E:
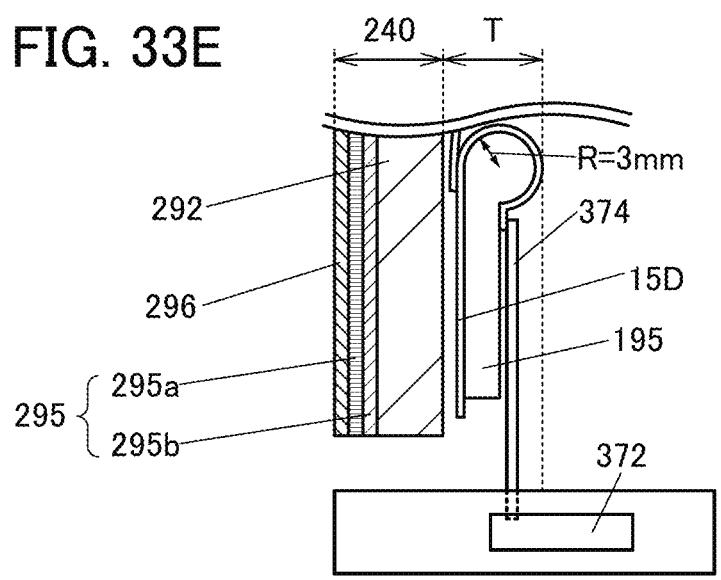
FIG. 33E is a side view illustrating an example of a display device.

In addition, display panels having other structures are illustrated in FIGS. 33A to 33E. FIGS. 33A and 33C are bottom views of display panels, FIGS. 33B and 33D are top views of display panels, and FIG. 33E is a side view of a display device including the display panel illustrated in FIGS. 33C and 33D. As illustrated in FIGS. 33A and 33B, in the case where an FPC is connected to the display surface side of a display panel 15C, the FPC may be bent to the rear surface side of the display panel 15C. As illustrated in FIGS. 33C to 33E, an FPC may be connected to the display surface side of a display panel 15D and the display panel 15D itself may be bent on the rear surface side. The connection portion of the FPC and the connection portion of the IC in the display panel are preferably bent on the rear surface side, in which case the non-display region of the display panel can be reduced and a display with a narrow bezel width can be obtained. As described above, even when the FPC is connected to the display surface side of the display panel, the power supply line and signal line are led with the use of the long FPC, whereby only the FPC is provided on the rear surface side of the display panel, and a display in which the features of the thin and lightweight display panel are retained can be fabricated. Note that the angles at which the FPC and the display panel are bent are not limited to 180°.

Table 1 shows the specifications of the display panel. The pixel structure of the display panel is the same as the structure of the pixel 130a illustrated in FIG. 1A, and the common layers of the EL layer are formed in two steps. The display panel includes an auxiliary wiring electrically connected to the common electrode of the light-emitting element. The structure of the auxiliary wiring 120 is similar to that in the connection portion 122 illustrated in FIGS. 1A and 1B, and the auxiliary wiring 120 provided in the same layer as the pixel electrode 111 is electrically connected to the common electrode 113. The display panel includes the pixel illustrated in FIG. 20B.

TABLE 1

| Specifications | |
|---|---|
| Screen diagonal | 13 inch |
| Driving method | Active matrix |
| Resolution | 1280 (H) × 720 (V) HD |
| Pixel density | 113 ppi |
| Pixel size | 225 μm × 225 μm |
| Aperture ratio | 41.1% |
| Source driver | Chip on panel |
| Scan driver | Integrated |

With the use of the four (2×2) display panels, a 26-inch WQHD multidisplay was fabricated. The FPC was connected to the display surface side of the display panel. For the support of the display panel, a 1-mm-thick aluminum plate was used. The support has a curved surface with a curvature radius R of 3 mm. The display panel was bent along the curved surface, so that the connection portion of the FPC and the connection portion of the IC in the display panel were bent to the rear surface side of the display panel as illustrated in FIGS. 33C to 33E. The display panel and the support were sandwiched between a pair of acrylic plates. On the acrylic plate (the support member 292) on the display surface side, the circularly polarizing plate 295 and the AR film (the anti-reflection member 296) were placed (see the optical member 240 in FIG. 33E). FIGS. 34A and 34C show the display results, and FIG. 34B is a photograph of the side. As shown in FIG. 34B, the total thickness T of the support and the display panel (see FIG. 33E) is approximately 13 mm, which is smaller than that of the first multidisplay (FIGS. 31A and 31B). As shown in FIGS. 34A and 34C, the fabricated multidisplay can naturally display a nearly seamless image.

Note that the measurement results of luminance of the above display panel when emitting light in an area which is 4% of the area of the display region are shown. The measurement was performed through the circularly polarizing plate. The luminance of display with only the display data DATA in FIG. 20B was 918 cd/m$^2$, and the luminance of display in which the data DATA_W was added to the display data DATA was 3149 cd/m$^2$. This indicates that when the data DATA_W is combined with the display data DATA, high-luminance display can be achieved.

Example 3

In this example, the estimated results of aperture ratios of a pixel in the display panel of one embodiment of the present invention and a pixel in the display panel of the comparative example will be described.

In this example, the pixel 130a illustrated in FIG. 4A was used as the pixel in the display panel of one embodiment of the present invention, and the pixel 130 illustrated in FIG. 9A was used as the pixel in the display panel of the comparative example.

In this example, the aperture ratio of the pixel was estimated under the following conditions: the diagonal screen size was 13 inches, the number of pixels was 1280 (H)×720 (V), the resolution was HD, and the pixel size was 225 square μm. Furthermore, in this example, the aperture ratios of the pixels in the case where the shortest distance (margin) between the metal mask and the subpixel was 10 μm, 15 μm, and 20 μm were calculated.

Figure 35:
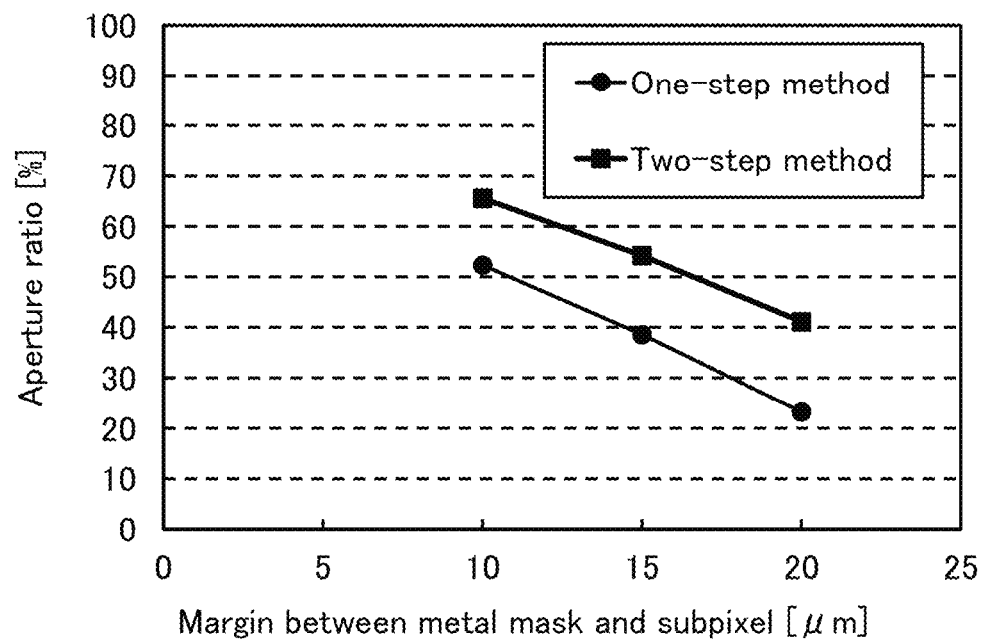
FIG. 35 shows the results of estimation of aperture ratios of pixels.

FIG. 35 shows the estimated results of the aperture ratios of the pixels. In FIG. 35, the horizontal axis represents the shortest distance (margin) between the metal mask and the subpixel and the vertical axis represents the aperture ratio of the pixel. In the display panel of one embodiment of the present invention, the common layers included in the EL layer are formed in two steps; thus, "Two-step method" in FIG. 35 corresponds to this panel. In contrast, in the display panel of the comparative example, the common layers included in the EL layer are formed in one step; thus, "One-step method" in FIG. 35 corresponds to this panel.

The aperture ratio of the pixel in the display panel of the comparative example was estimated to be approximately 23% to approximately 52%. In contrast, the aperture ratio of the pixel in the display panel of one embodiment of the present invention was estimated to be approximately 40% to approximately 65%. This indicates that the pixel in the display panel of one embodiment of the present invention is estimated to have a higher aperture ratio than the pixel in the display panel of the comparative example by approximately 15%.

The results in this example show that when the common layers included in the EL layer are formed in two steps, the aperture ratio of the pixel can be increased as compared with the case where the common layers are formed in one step.

Example 4

In this example, the results of manufacturing a display device including a flexible display panel will be described.

The display device in this example can be folded in two so that the display surface is placed inward.

Figure 36A:
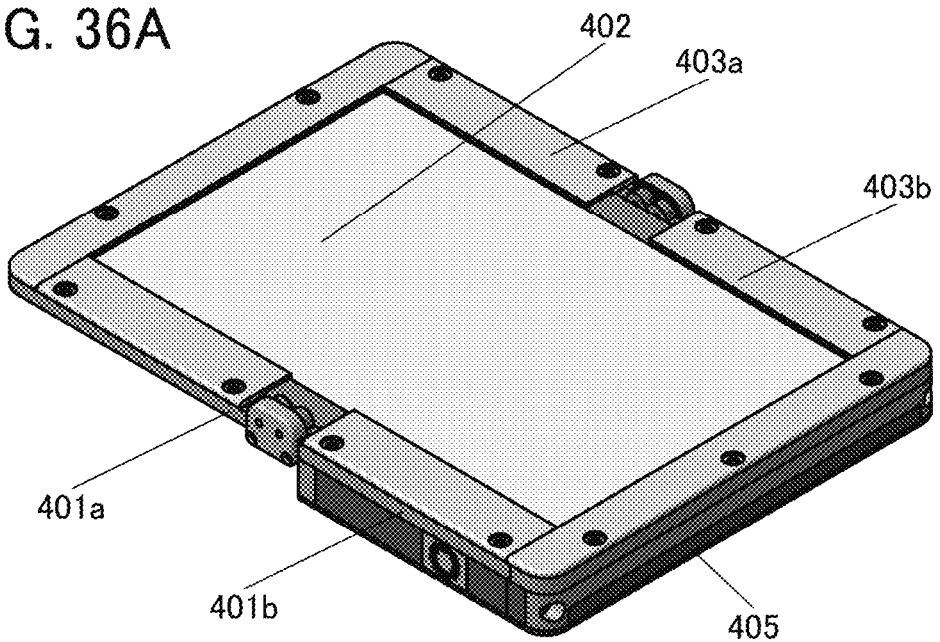
FIGS. 36A and 36B are perspective views illustrating a display device of Example.

FIG. 36A is a perspective view of the display device. The display device of this example includes a support 401*a*, a support 401*b*, a display panel 402, a support 403*a*, a support 403*b*, a gear 404*a*, a gear 404*b*, and a housing 405.

The support 401*a* and the support 401*b* are positioned on the rear surface (the surface opposite to the display surface) side of the display panel 402.

The display panel 402 includes a portion fixed to the support 401*a* and a portion fixed to the support 401*b*. For example, the display panel 402 can be fixed to the support by using an adhesive (including adhesive tape and the like) or a suction film.

The display panel 402 includes an organic EL element as a light-emitting element and a transistor including a metal oxide in a semiconductor layer as a transistor for driving a light-emitting element. The display panel 402 is flexible.

The support 403*a* and the support 403*b* are positioned on the display surface side of the display panel 402 so as not to overlap with the display region of the display panel 402 (so as to overlap with the non-display region). The support 403*a* is composed of three parts, and each part is screwed on the support 401*a*. Similarly, the support 403*b* is composed of three parts, and each part is screwed on the support 401*b*. The structures of the supports 403*a* and 403*b* are not limited to the structures illustrated in FIG. 36A, and can each be composed of one part or more.

The non-display region of the display panel 402 includes a region between the support 401*a* and the support 403*a* and a region between the support 401*b* and the support 403*b*.

The housing 405 can store an FPC, an IC, a battery, and the like.

Figure 36B:
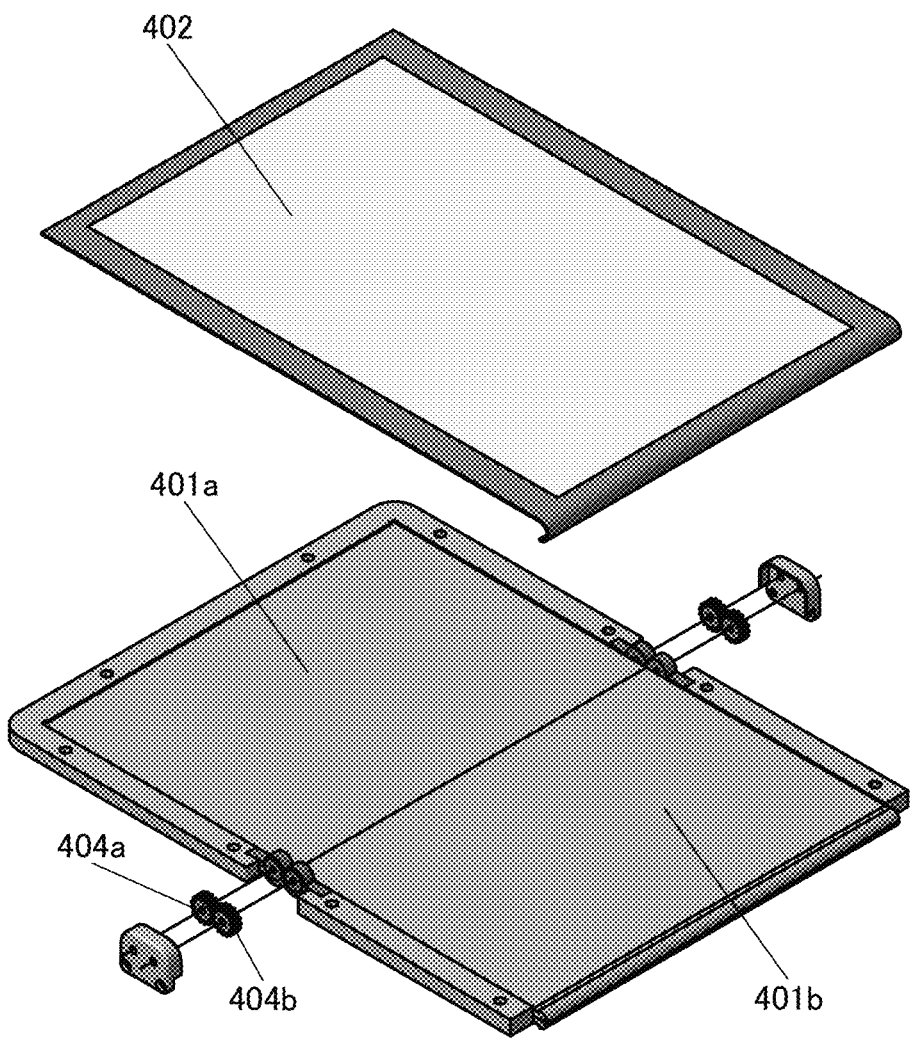
Figure 37A:
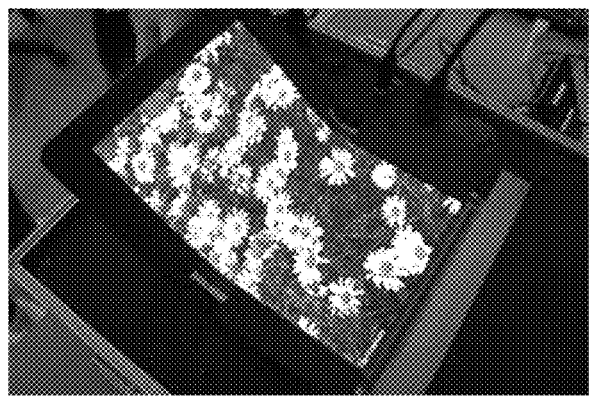
FIGS. 37A to 37D are photographs of a display device of Example.
Figure 37B:
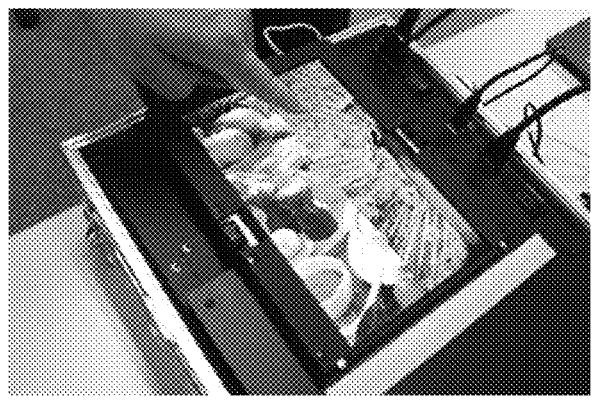
Figure 37C:
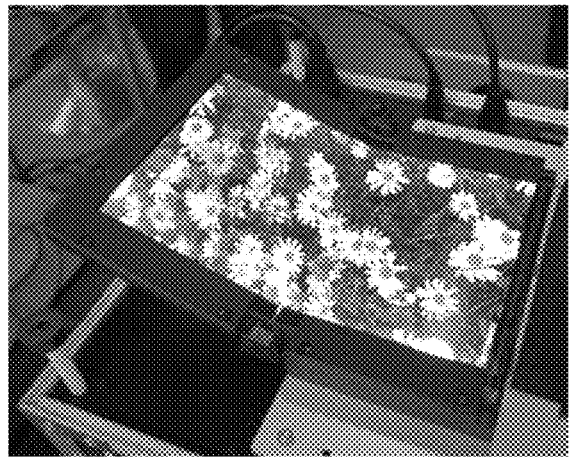
Figure 37D:
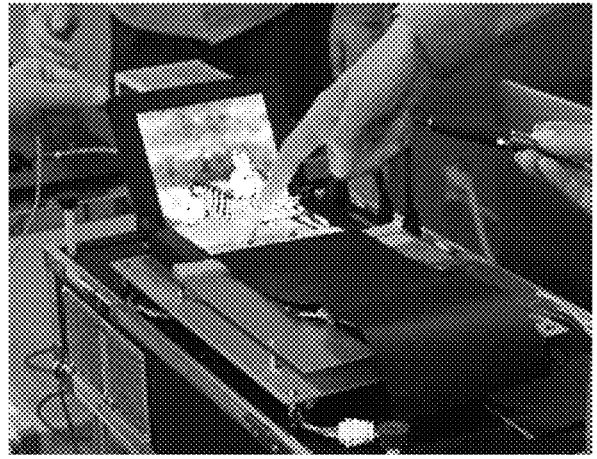

FIG. 36B shows the dismantled display device of this example. In FIG. 36B, the support 403*a*, the support 403*b*, and the like are omitted.

The support 401*a* is connected to the gear 404*a*, and the support 401*b* is connected to the gear 404*b*. Since the gear 404*a* and the gear 404*b* are engaged with each other, the movements of the support 401*a* and the support 401*b* are synchronized, so that a change in shape of the display device (a change in shape from the opened state to the folded state) is determined. Thus, the display panel 402 can be bent with a predetermined radius of curvature. Since the display panel 402 can be prevented from being bent with a radius of curvature smaller than the predetermined radius of curvature, the breakage of the display panel 402 due to an unintentional large power applied to the display panel 402 when the display device is folded can be suppressed.

When the display device is opened, the support 401*a* and the support 401*b* are in contact with each other. Thus, the entire display panel 402 can be supported, and the impact strength and the scratch hardness of the display panel 402 can be increased.

In the state where the display device is being opened or being folded, the support 401*a* and the support 401*b* are apart from each other; thus, a region which is not in contact with either the support 401*a* or the support 401*b* is generated in the display panel 402. The region is not supported by the support 401*a* and the support 401*b*; thus, the impact strength and the scratch hardness of the region is decreased in some cases.

To increase the impact strength and the scratch hardness of the display panel 402, an impact attenuating layer is preferably provided on one or both surfaces of the display panel 402. Examples of the material for the impact attenuating layer include silicone, urethane, and acrylic. The impact attenuating layer is preferably a rubber. The impact attenuating layer may be a gel. In this example, a display device in which a silicone sheet was provided on only the display surface of the display panel 402 and a display device in which a urethane sheet was provided on both surfaces of the display panel 402 were fabricated.

FIGS. 37A to 37D are photographs of the display devices of this example. In the display device shown in FIGS. 37A and 37B, a urethane sheet with a thickness of approximately 0.22 mm is provided on both surfaces of the display panel 402. In the display device shown in FIGS. 37C and 37D, a silicone sheet with a thickness of approximately 0.5 mm is provided on the display surface of the display panel 402. Both of the display devices demonstrate favorable display and high durability.

REFERENCE NUMERALS

DP: display panel, 10A: display panel, 15A: display panel, 15B: display panel, 15C: display panel, 15D: display panel, 20A: light-emitting element, 20B: light-emitting element, 21A: light-emitting element, 71: pixel portion, 71*a*: pixel portion, 71*b*: pixel portion, 71*c*: pixel portion, 71*d*: pixel portion, 72: region, 72*b*: region, 72*c*: region, 72*d*: region, 73: region, 74: FPC, 74*a*: FPC, 78: driver circuit, 79: display region, 101: insulating layer, 102: light-transmitting layer, 103: bonding layer, 104: insulating layer, 105: space, 106: auxiliary wiring, 107: spacer, 108: spacer, 109: protective layer, 110B: light-emitting element, 110G: light-emitting element, 110R: light-emitting element, 111: pixel electrode, 111*a*: pixel electrode, 111*b*: pixel electrode, 112: EL layer, 112*a*: EL layer, 112*b*: EL layer, 113: common electrode, 120: auxiliary wiring, 120*a*: auxiliary wiring, 120*b*: auxiliary wiring, 121: counter substrate, 122: connection portion, 124: light-emitting element, 125*a*: reflective electrode, 125*b*: transparent electrode, 128: conductive layer, 128*a*: conductive layer, 128*b*: conductive layer, 130: pixel, 130*a*: pixel, 130*b*: pixel, 130*c*: pixel, 130*d*: pixel, 131: conductive film, 141: insulating layer, 150: mask, 155: mask, 161: common layer, 161*a*: common layer, 161*b*: common layer, 163: light-emitting layer, 163A: light-emitting layer, 163B: light-emitting layer, 163B_1: hole-transport layer for blue light, 163B_2: blue light-emitting layer, 163G: light-emitting layer, 163G_1: hole-transport layer for green light, 163G_2: green light-emitting layer, 163R: light-emitting layer, 163R_1: hole-transport layer for red light, 163R_2: red light-emitting layer, 165: common layer, 165*a*: common layer, 165*b*: common layer, 170: region, 171: region, 172: region, 190: display panel, 190*a*: display panel, 190*d*: display panel, 195: support, 201: conductive layer, 202: insulating layer, 203*a*: conductive layer, 203*b*: conductive layer, 204: semiconductor layer, 208: insulating layer, 211: insulating layer, 212: insulating layer, 213: insulating layer, 214*a*: channel formation region, 214*b*: low-resistance region, 214*c*: LDD region, 220: transistor, 230: transistor, 240: optical member, 292: support member, 295: circularly polarizing plate, 295*a*: linear polarizing plate, 295*b*: quarter-wave plate, 296: anti-reflection member, 301: transistor, 303: transistor, 306: connection portion, 307: conductive layer, 308: conductive layer, 309: conductive layer, 311: gate insulating layer, 312: insulating layer, 313: insulating layer, 314: insulating layer, 314*a*: insulating layer, 314*b*: insulating layer, 314*c*: insulating layer, 315: insulating layer, 317: bonding layer, 318: bonding layer, 319: connector, 351: formation substrate, 353: separation layer, 353*a*: separation layer, 353*b*: separation layer, 361: substrate, 363: bonding layer, 365: insulating layer, 367: insulating layer, 371:

substrate, 372: driver circuit, 372*a*: driver circuit, 373: bonding layer, 374: FPC, 374*a*: FPC, 374*b*: FPC, 374*g*: FPC, 374*s*: FPC, 375: protective layer, 401*a*: support, 401*b*: support, 402: display panel, 403*a*: support, 403*b*: support, 404*a*: gear, 404*b*: gear, 405: housing, 415: adjuster, 416: panel holder, 417: switch.

This application is based on Japanese Patent Application Serial No. 2017-230849 filed with Japan Patent Office on Nov. 30, 2017, and Japanese Patent Application Serial No. 2018-095869 filed with Japan Patent Office on May 18, 2018, the entire contents of which are hereby incorporated by reference.

The invention claimed is:

1. A display panel comprising:
a first pixel electrode;
a second pixel electrode;
a third pixel electrode;
a first light-emitting layer;
a second light-emitting layer;
a common electrode; and
an auxiliary wiring,
wherein the first light-emitting layer is positioned over the first pixel electrode and the second pixel electrode,
wherein the second light-emitting layer is positioned over the third pixel electrode,
wherein the first light-emitting layer is configured to emit light of a color identical to a color of light emitted from the second light-emitting layer, and
wherein the common electrode overlaps with the first pixel electrode with the first light-emitting layer between the common electrode and the first pixel electrode, overlaps with the second pixel electrode with the first light-emitting layer between the common electrode and the second pixel electrode, overlaps with the third pixel electrode with the second light-emitting layer between the common electrode and the third pixel electrode, and is in contact with part of a top surface of the auxiliary wiring.

2. The display panel according to claim 1,
wherein the first light-emitting layer is in contact with the second light-emitting layer.

3. The display panel according to claim 1,
wherein the first light-emitting layer overlaps with the second light-emitting layer.

4. The display panel according to claim 1,
wherein the first light-emitting layer and the second light-emitting layer are configured to emit white light.

5. The display panel according to claim 1,
wherein the first pixel electrode, the second pixel electrode, and the third pixel electrode each comprise a reflective electrode and a transparent electrode over the reflective electrode.

6. The display panel according to claim 1,
wherein the common electrode has both a visible-light-transmitting property and a visible-light-reflective property.

7. The display panel according to claim 1,
wherein the auxiliary wiring does not overlap with the first pixel electrode, the second pixel electrode, or the third pixel electrode.

8. A display module comprising:
the display panel according to claim 1; and
at least one of a connector and an integrated circuit.

9. A display device comprising:
a first display panel; and
a second display panel,
wherein the first display panel and the second display panel are each the display panel according to claim 1,
wherein the first display panel comprises a first display region,
wherein the second display panel comprises a second display region and a visible-light-transmitting region,
wherein the second display region is adjacent to the visible-light-transmitting region, and
wherein the first display region overlaps with the visible-light-transmitting region.

10. An electronic device comprising:
the display device according to claim 9; and
at least one of an antenna, a battery, a housing, a camera, a speaker, a microphone, and an operation button.

* * * * *